US012660308B2

(12) United States Patent
Jo et al.

(10) Patent No.: US 12,660,308 B2
(45) Date of Patent: Jun. 16, 2026

(54) METHOD OF MANUFACTURING SEMICONDUCTOR DEVICE

(71) Applicant: Samsung Electronics Co., Ltd., Suwon-si (KR)

(72) Inventors: Min-Seok Jo, Suwon-si (KR); Jae-Hyun Lee, Hwaseong-si (KR); Jong-Han Lee, Namyangju-si (KR); Hong-Bae Park, Seoul (KR); Dong-Soo Lee, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 802 days.

(21) Appl. No.: 18/082,617

(22) Filed: Dec. 16, 2022

(65) Prior Publication Data

US 2023/0187446 A1 Jun. 15, 2023

Related U.S. Application Data

(63) Continuation of application No. 16/217,661, filed on Dec. 12, 2018, now Pat. No. 11,532,624.

(30) Foreign Application Priority Data

May 23, 2018 (KR) ........................ 10-2018-0058220

(51) Int. Cl.
*H10D 84/85* (2025.01)
*H10D 30/01* (2025.01)
(Continued)

(52) U.S. Cl.
CPC ......... *H10D 84/853* (2025.01); *H10D 30/024* (2025.01); *H10D 30/6211* (2025.01);
(Continued)

(58) Field of Classification Search
CPC ........... H10D 84/0158; H10D 84/0193; H10D 84/834; H10D 84/853; H10D 86/011;
(Continued)

(56) References Cited

U.S. PATENT DOCUMENTS 6,495,422 B1 12/2002 Yu et al.
8,685,820 B2 4/2014 Tseng et al.
(Continued)

FOREIGN PATENT DOCUMENTS

JP 20140229750 A 12/2014
KR 20030050678 A 6/2003
(Continued)

OTHER PUBLICATIONS

Office Action dated Jan. 18, 2023 issued by the Korean Intellectual Property Office for corresponding application KR 10-2018-0058220.

*Primary Examiner* — Wael M Fahmy
*Assistant Examiner* — Quinton A Brasfield
(74) *Attorney, Agent, or Firm* — Muir Patent Law, PLLC

(57) ABSTRACT

A semiconductor device may include a plurality of first active fins protruding from a substrate, each of the first active fins extending in a first direction; a second active fin protruding from the substrate; and a plurality of respective first fin-field effect transistors (finFETs) on the first active fins. Each of the first finFETs includes a first gate structure extending in a second direction perpendicular to the first direction, and the first gate structure includes a first gate insulation layer and a first gate electrode. The first finFETs are formed on a first region of the substrate and have a first metal oxide layer as the first gate insulation layer, and a second finFET is formed on the second active fin on a second region of the substrate, and the second finFET does not include a metal oxide layer, but includes a second gate (Continued)

insulation layer that has a bottom surface at the same plane as a bottom surface of the first metal oxide layer.

20 Claims, 50 Drawing Sheets

(51) Int. Cl.

| | | |
|---|---|---|
| *H10D 30/62* | (2025.01) | |
| *H10D 64/01* | (2025.01) | |
| *H10D 64/68* | (2025.01) | |
| *H10D 84/01* | (2026.01) | |
| *H10D 84/03* | (2025.01) | |

(52) U.S. Cl.
CPC ......... *H10D 64/017* (2025.01); *H10D 64/021* (2025.01); *H10D 84/0184* (2025.01); *H10D 84/0186* (2025.01); *H10D 84/0188* (2025.01); *H10D 84/0193* (2025.01); *H10D 84/038* (2025.01); *H10D 64/691* (2025.01)

(58) Field of Classification Search
CPC ............... H10D 86/215; H10D 30/024; H10D 30/0241; H10D 30/0243; H10D 30/0245; H10D 30/62; H10D 30/6211; H10D 30/6212; H10D 30/6213; H10D 30/6215; H10D 30/6217; H10D 30/6218; H10D 30/6219; H10D 84/013–0133; H10D 84/0128; H10D 84/017; H10D 84/0149; H10D 84/0167; H10D 84/0186; H10D 62/021; H10D 62/149–161; H10D 62/299; H10D 62/307; H10D 30/0277; H10D 30/0218; H10D 30/0219; H10D 30/022; H10D 30/601–608; H10D 30/6715–6721; H10D 30/0223–0229; H10D 30/0215; H10D 30/0221; H10D 64/251–259; H10D 64/647–649; H10D 64/025–027; H10D 64/513; H10D 30/658; H10D 30/668; H10D 30/6894; H10D 30/699; H10D 64/017; H10D 30/0273; H10D 30/0614; H10B 12/36; H10B 12/056

See application file for complete search history.

(56) References Cited

U.S. PATENT DOCUMENTS

| | | | | |
|---|---|---|---|---|
| 8,729,633 | B2 | 5/2014 | Li | |
| 8,912,607 | B2 * | 12/2014 | Kwon | H10D 64/01318 |
| | | | | 257/E27.06 |
| 9,013,003 | B2 * | 4/2015 | Liang | H10D 84/0147 |
| | | | | 257/E21.409 |
| 9,508,727 | B2 | 11/2016 | Park et al. | |
| 9,564,435 | B2 | 2/2017 | Chung et al. | |
| 2007/0210354 | A1 | 9/2007 | Nabatame et al. | |
| 2008/0116530 | A1 | 5/2008 | Hyun et al. | |
| 2014/0353719 | A1 * | 12/2014 | Kim | H10D 64/118 |
| | | | | 257/288 |
| 2016/0284697 | A1 | 9/2016 | Yoon et al. | |
| 2018/0040620 | A1 | 2/2018 | Ha et al. | |

FOREIGN PATENT DOCUMENTS

| | | | |
|---|---|---|---|
| KR | 20040108488 | A | 12/2014 |
| KR | 10-2016-0056693 | A | 5/2016 |

* cited by examiner

FIRST DIRECTION

SECOND DIRECTION

SECOND
DIRECTION

FIRST
DIRECTION

FIG. 21

F I G.  25
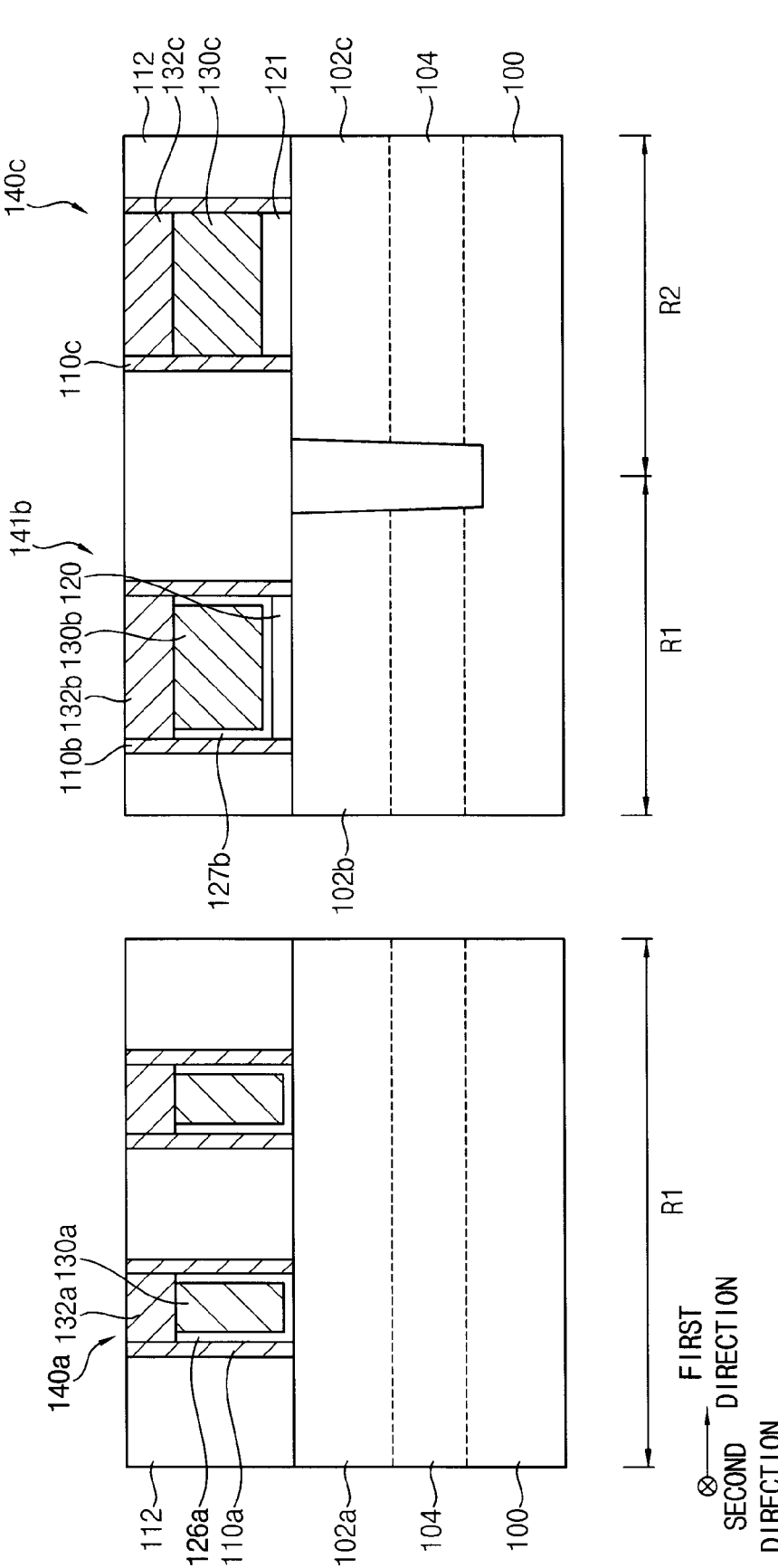

N

C1 — — 210

— 202a

214a — — 104

228
(232)

I —

— 202b

214b —

P —

C2 — — 210

SECOND
DIRECTION
↑
→ FIRST
DIRECTION 206        206        206

N

C1

E

202a

I

202b

P

C2

E'

SECOND
DIRECTION

FIRST
DIRECTION

SECOND
DIRECTION

FIRST
DIRECTION

N

C1

214a

I

214b

P

C2

218

210

202a

220

202b

210

SECOND
DIRECTION

FIRST
DIRECTION 218
216
210
214a
202a
104
100

214b
202b

220

R3

SECOND
DIRECTION
FIRST
DIRECTION

SECOND
DIRECTION

FIRST
DIRECTION

N

C1 — 210

214a — 202a

224

I

214b — 202b

P

C2 — 210

SECOND
DIRECTION

FIRST
DIRECTION

N

C1

214a
246a

I

214b

P

C2

210

202a

202b

210

SECOND
DIRECTION

FIRST
DIRECTION

FIRST DIRECTION

SECOND DIRECTION

N

C1

214a

I

214b

P

C2

242

202a

244

202b

SECOND
DIRECTION

FIRST
DIRECTION

FIRST
DIRECTION

SECOND
DIRECTION

N

C1

214a

246

I

214b

P

C2

202a

202b

SECOND
DIRECTION

FIRST
DIRECTION

N

C1 ——————————————— 210a

——————————————— 202a

244a

246a

254 ——————————————— 210b

I

——————————————— 202b

244b

246b

P

C2 ——————————————— 210a

SECOND
DIRECTION

FIRST
DIRECTION

N

C1

214

246

I

P

C2

202a

202b

SECOND
DIRECTION

FIRST
DIRECTION 250
244b
202b
246
244a
214a
202a
104
100
R3

SECOND
DIRECTION
FIRST
DIRECTION

N

C1 — 210a

202a 214a
246a

I — 210b

202b 214b
246b

P

C2 — 210a

SECOND
DIRECTION

FIRST
DIRECTION

METHOD OF MANUFACTURING SEMICONDUCTOR DEVICE

CROSS-REFERENCE TO RELATED APPLICATIONS

This application is a continuation application of U.S. application Ser. No. 16/217,661, filed Dec. 12, 2018, which claims priority under 35 USC § 119 to Korean Patent Application No. 10-2018-0058220, filed on May 23, 2018 in the Korean Intellectual Property Office (KIPO), the contents of each of which are herein incorporated by reference in their entirety.

BACKGROUND

1. Field

Example embodiments relate to semiconductor devices and methods of manufacturing the same. More particularly, example embodiments relate to semiconductor devices including transistors having various electrical characteristics and methods of manufacturing the same.

2. Description of the Related Art

Semiconductor devices are formed on substrates and the semiconductor devices include transistors having various electrical characteristics. It is beneficial for each of the transistors to be formed by simple processes and to have good characteristics. For example, very thin gate oxide high performance devices may have different thickness gate oxide films compared to some I/O devices. However, because both of these devices are often processed simultaneously during processing, existing processes for forming these devices may be complicated, which may adversely affect reliability.

SUMMARY

Example embodiments provide a semiconductor device including transistors having various electrical characteristics.

According to one embodiment, a semiconductor device includes a plurality of first active fins protruding from a substrate, each of the first active fins extending in a first direction; a second active fin protruding from the substrate; and a plurality of respective first fin-field effect transistors (finFETs) on the first active fins. Each of the first finFETs includes a first gate structure extending in a second direction perpendicular to the first direction, and the first gate structure includes a first gate insulation layer and a first gate electrode. The first finFETs are formed on a first region of the substrate and have a first metal oxide layer as the first gate insulation layer, and a second finFET is formed on the second active fin on a second region of the substrate, and the second finFET does not include a metal oxide layer, but includes a second gate insulation layer that has a bottom surface at the same plane as a bottom surface of the first metal oxide layer.

According to one embodiment, a semiconductor device, which may be the same semiconductor device described in the aforementioned embodiment, includes a plurality of first active fins protruding from a logic cell region of a substrate, each of the first active fins extending in a first direction; a plurality of first fin-field effect transistors (finFETs) on the first active fins, wherein each of the first finFETs includes a first gate structure extending in a second direction perpendicular to the first direction, and the first gate structure includes a first gate insulation layer and a first gate electrode, the first gate insulation layer including a metal oxide layer; a plurality of second active fins protruding from a peripheral region of the substrate, each of the second active fins extending in the first direction; and a second finFET on a first fin of the second active fins, wherein the second finFET includes a second gate structure extending in the second direction, and the second gate structure includes a first silicon oxide layer and a second gate electrode, the first silicon oxide layer forming a second gate insulation layer and having a thickness different from a thickness of the first gate insulation layer. The metal oxide layer for each first finFET is formed adjacent to each first active fin respectively and the first silicon oxide layer is formed adjacent to the first fin of the second active fins.

According to one embodiment, a semiconductor device includes a plurality of first active fins protruding from a substrate, each of the first active fins extending in a first direction; a plurality of second active fins protruding from the substrate, each of the second active fins extending in the first direction; a plurality of first fin-field effect transistors (finFETs) on the first active fins; a plurality of second finFETs on the second active fins; and a first gate structure extending in a second direction perpendicular to the first direction and crossing over the plurality of first finFETs and the plurality of second finFETs, wherein the first gate structure includes a first gate insulation layer including a metal oxide layer, and a first gate electrode. One first finFET of the first finFETs is directly adjacent to one second finFET of the second finFETs, and at a boundary region where the one first finFET is directly adjacent to the one second finFET, a gap in the metal oxide layer is formed.

BRIEF DESCRIPTION OF THE DRAWINGS

FIGS. 1, 2 and 3 are a plan view and cross-sectional views illustrating a semiconductor device in accordance with example embodiments;

FIGS. 4 to 20 are cross-sectional views illustrating a method of manufacturing a semiconductor device in accordance with example embodiments;

FIGS. 21 and 22 are a plan view and a cross-sectional view illustrating a semiconductor device in accordance with example embodiments;

FIGS. 25 and 26 are cross-sectional views illustrating a semiconductor device in accordance with example embodiments;

FIGS. 41 to 44 are plan views and cross-sectional views illustrating a method of manufacturing a semiconductor device in accordance with example embodiments;

DETAILED DESCRIPTION

Example embodiments will be more clearly understood from the following detailed description taken in conjunction with the accompanying drawings.

Figure 1:
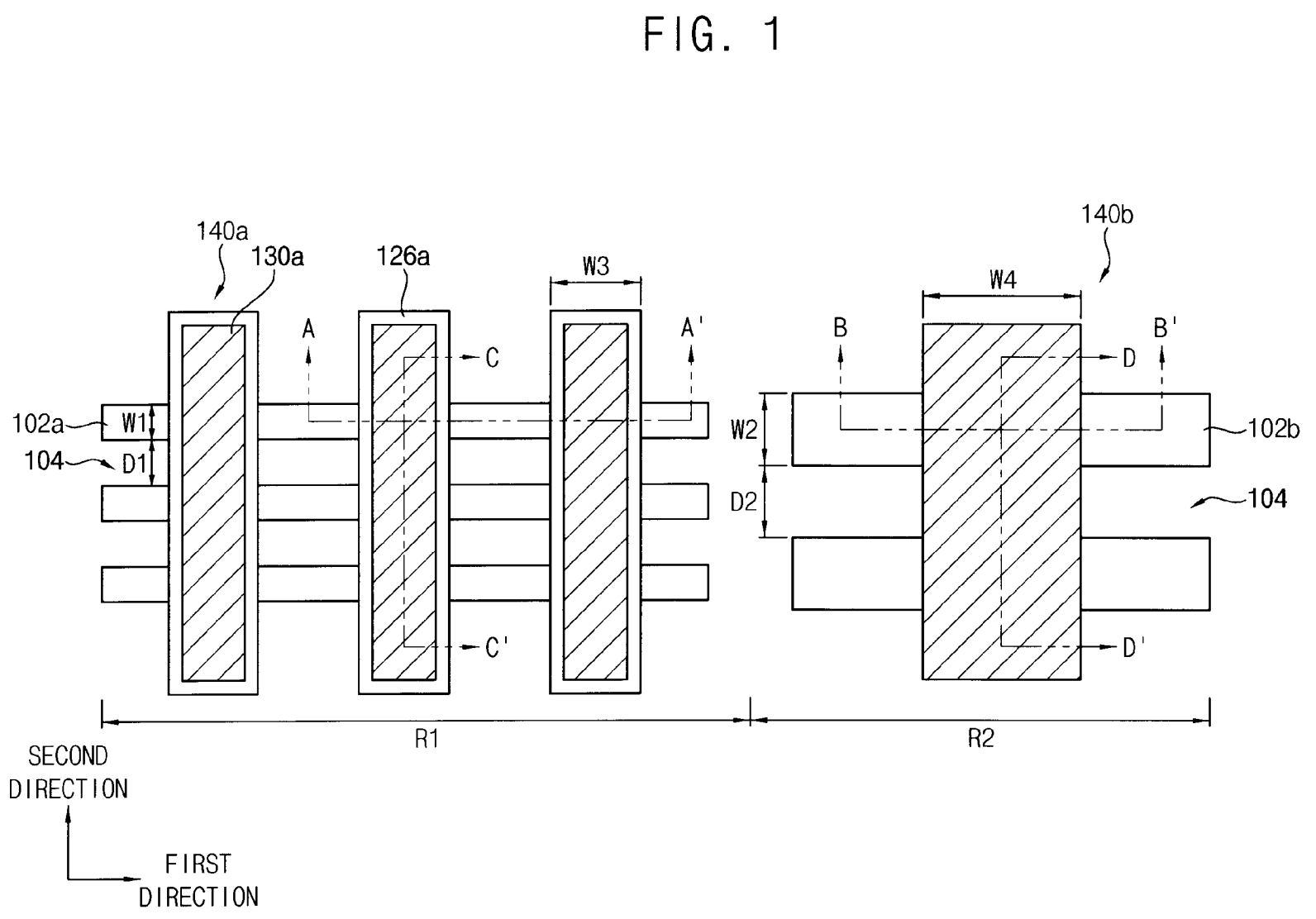
Figure 2:
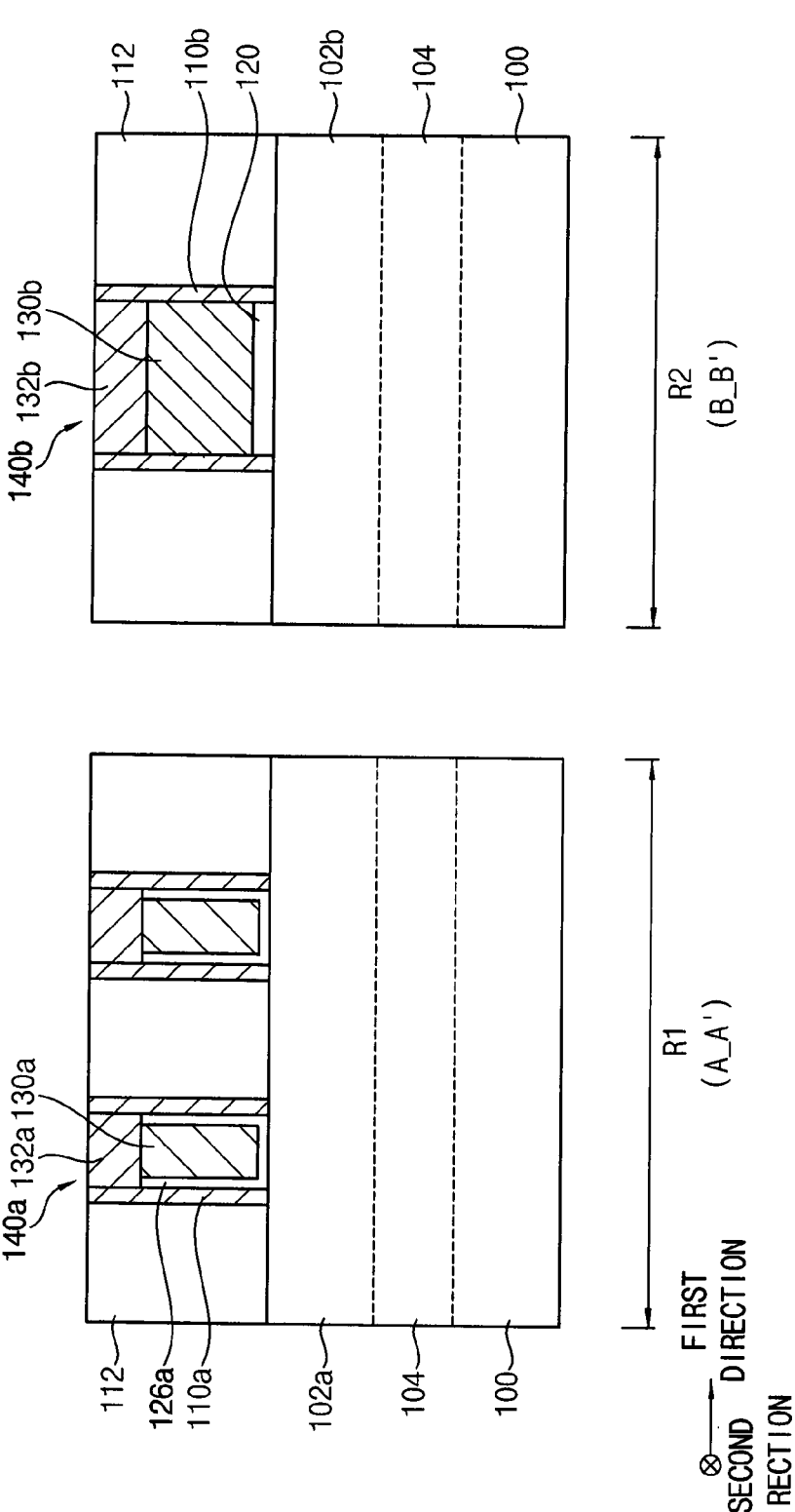
Figure 3:
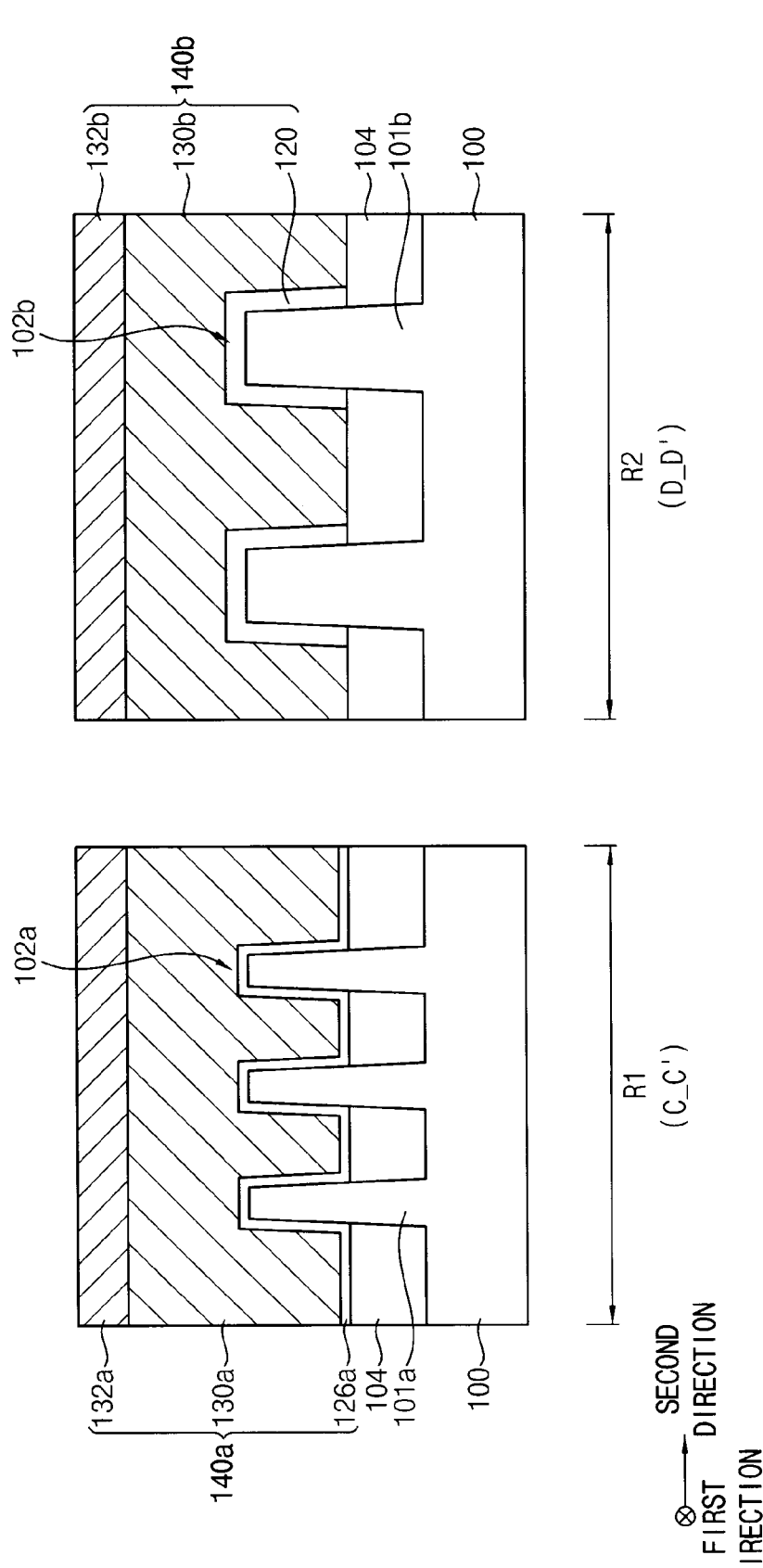

FIGS. 1, 2 and 3 are a plan view and cross-sectional views illustrating a semiconductor device in accordance with example embodiments.

FIG. 2 includes cross-sectional views taken along line A-A' and B-B' in FIG. 1. FIG. 3 includes cross-sectional views taken along line C-C' and D-D' in FIG. 1.

In FIG. 1, some elements, e.g., spacers are omitted. FIG. 1 illustrates gate electrodes and a metal oxide pattern, in a plan view.

Referring to FIGS. 1 to 3, a substrate 100 may include a first region R1 and a second region R2. A first transistor including a metal oxide layer having a high dielectric constant may be formed on the first region R1 of the substrate 100. A second transistor may have no metal oxide layer may be formed on the second region R2 of the substrate 100.

In example embodiments, the first region R1 may be a logic cell region, and the second region R2 may be a peripheral region. For example, logic cell transistors having high performance may be formed on the first region R1, and I/O (input/output) transistors serving as an I/O device may be formed on the second region R2. In example embodiments, the first transistor may have a lower operation voltage and a faster speed than the second transistor. For example, the I/O transistors may be part of an input buffer, or I/O driver, and the logic cell transistors may be part of a logic circuit of a logic chip, such as an AND or OR gate of a core device. The I/O transistors and logic cell transistors may be part of a semiconductor device such as a logic chip or a memory device. In example embodiments, each of the first transistor and second transistor may include a fin-field effect transistor (finFET).

The first transistor may be formed on a first active pattern 101a protruding upwardly from an upper surface of the substrate 100. The first transistor may include a first gate structure 140a extending in a direction crossing the first active pattern 101a. A first spacer 110a may be formed on sidewalls of the first gate structure 140a.

The second transistor may be formed on a second active pattern 101b protruding upwardly from the upper surface of the substrate 100. The second transistor may include a second gate structure 140b extending in a direction crossing the second active pattern 101b. A second spacer 110b may be formed on sidewalls of the second gate structure 140b.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

The first active patterns 101a may extend in a first direction substantially parallel to the upper surface of the substrate 100. The first active patterns 101a may be arranged in a second direction crossing the first direction. In example embodiments, the first and second directions may be substantially perpendicular to each other. Terms such as "parallel," "perpendicular," "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially parallel," "substantially perpendicular," "substantially the same," "substantially equal," or "substantially planar," may be exactly parallel, perpendicular, the same, equal, or planar, or may be parallel, perpendicular, the same, equal, or planar within acceptable variations that may occur, for example, due to manufacturing processes.

An isolation layer 104 may fill a lower portion of a trench between the first active patterns 101a. The isolation layer 104 may include an oxide, e.g., silicon oxide. A portion of the first active pattern 101a not covered by the isolation layer 104 may be referred to as a first active fin 102a serving as an active region. The first active fin 102a may have a first width W1 in the second direction. A gap between the first active fins 102a may have a first distance D1 in the second direction.

An isolation layer 104 may fill a lower portion of a trench between the second active patterns 101b. A portion of the second active pattern 101b not covered by the isolation layer 104 may be referred to as a second active fin 102b serving as an active region. The second active fin 102b may have a second width W2 in the second direction greater than the first width W1. A gap between the second active fins 102b may have a second distance D2 in the second direction greater than the first distance D1.

A first insulating interlayer 112 may be formed on the first and second active fins 102a and 102b and the isolation layer 104. An upper surface of the first insulating interlayer 112 may be substantially flat.

The first insulating interlayer 112 may include silicon oxide. The upper surface of the first insulating interlayer 112 may be coplanar with upper surfaces of the first and second gate structures 140a and 140b.

A first opening may extend through the first insulating interlayer 112. Sidewalls and the upper surface of the first active fin 102a and the isolation layer 104 may be exposed with respect to the first insulating interlayer 112 by the first opening. The first opening may extend in the second direction.

The first gate structure 140a may be formed in the first opening. In example embodiments, the first gate structure 140a may extend in the second direction to cross a plurality of the first active fins 102a. The first gate structure 140a may have a third width W3 in the first direction.

The first gate structure 140a may include a metal oxide pattern 126a, a first gate electrode 130a and a first capping pattern 132a sequentially stacked.

The metal oxide pattern 126a may include a high dielectric constant material having a dielectric constant higher than the dielectric constant of a silicon nitride. The high dielectric constant material may include, e.g., hafnium oxide (HfO2), tantalum oxide (Ta2O5), zirconium oxide (ZrO2), etc. The metal oxide pattern 126a may have a first thickness. The first thickness may be about 5 Å to about 30 Å. The first thickness may be selected according to a threshold voltage and an operating voltage of the first transistor.

The first gate electrode 130a may include a metal or a metal nitride. In example embodiments, the first gate electrode 130a may include, e.g., Ti, TiN, Ta, TaN, TiA1C, TiA1CN, TiAlSiCN, Co and W, etc. For example, the first gate electrode 130a may include a lower layer and an upper layer stacked. The lower layer may include at least one selected from the group consisting of Ti, TiN, Ta, TaN and TiAlC, TiAlCN, and the upper layer may include Co or W. The lower layer may serve as a layer for controlling a threshold voltage. The lower layer may be selected according to the threshold voltage of the first transistor.

The metal oxide pattern 126a may surround sidewalls and a bottom of the first gate electrode 130a.

In example embodiments, a pad oxide layer (not shown) may be further formed on a surface of the first active fin 102a under the metal oxide pattern 126a. The pad oxide layer may include a thermal oxide layer.

The first capping pattern 132a may be formed on the first gate electrode 130a, and may fill a remaining portion of the first opening. The first capping pattern 132a may include, e.g., silicon nitride, silicon oxynitride, etc.

The first spacer 110a may be formed on the sidewalls of the first gate structure 140a. In example embodiments, the first spacer 110a may include silicon nitride.

In example embodiments, impurity regions (not shown) may be formed at the first active fins 102a adjacent to the sidewalls of the first gate structure 140a. The impurity regions may serve as source/drain regions. In some example embodiments, an epitaxial pattern (not shown) may be further formed between the first active fins 102a adjacent to the sidewalls of the first gate structure 140a, and the first active fins 102a may be connected by the epitaxial pattern. The impurity regions may be further formed in the epitaxial pattern.

A second opening may extend through the first insulating interlayer 112. Sidewalls and the upper surface of the second active fin 102b and the isolation layer 104 may be exposed by the second opening. The second opening may extend in the second direction.

The second gate structure 140b may be formed in the second opening. In example embodiments, the second gate structure 140b may extend in the second direction to cross a plurality of the second active fins 102b. The second gate structure 140b may have a fourth width W4 in the first direction greater than the third width W3.

The second gate structure 140b may include a first silicon oxide layer 120, a second gate electrode 130b and a second capping pattern 132b sequentially stacked.

The first silicon oxide layer 120 may have a second thickness greater than the first thickness of the metal oxide pattern 126a. The second thickness may be selected according to a threshold voltage and an operating voltage of the second transistor. According to the above discussion, the metal oxide pattern 126a for each first finFET may be formed adjacent to, and in some embodiments may contact, each first active fin 102a respectively, and the first silicon oxide layer 120 may be formed adjacent to, and in some embodiments may contact a first fin of the second active fins 102b.

The second gate electrode 130b may include a metal or a metal nitride. The second gate electrode 130b may include Ti, TiN, Ta, TaN, TiAlC, TiAlCN, TiAlSiCN, Co and W, etc. The second gate electrode 130b may include a material or material composition substantially the same as a material of the first gate electrode 130a.

The first silicon oxide layer 120 may be formed under a bottom of the second gate electrode 130b, and in some embodiments is not formed on sidewalls of the second gate electrode 130b. In some embodiments, first silicon oxide layer 120 does not surround or contact the sidewalls of the second gate electrode 130b. The first silicon oxide layer 120 may contact the bottom of the second gate electrode 130b. For example, as shown in FIG. 2, a metal oxide layer is not formed on the first silicon oxide layer 120. Thus, a gate insulation layer of the second transistor may have no metal oxide layer. For elements described herein as "contacting" or "in contact with" each other, there are no intervening elements present at the point or points of contact or connection. Thus, "contact" refers to a direct connection, or touching.

The second capping pattern 132b may be formed on the second gate electrode 130b, and may fill remaining portion of the second opening. The second capping pattern 132b may include, e.g., silicon nitride, silicon oxynitride, etc. The second capping pattern 132b may include a material or material composition substantially the same as a material of the first capping pattern 132a.

The second spacer 110b may be formed on the sidewalls of the second gate structure 140b. In example embodiments, the second spacer 110b includes silicon nitride.

In example embodiments, impurity regions (not shown) may be formed at the second active fins adjacent to the sidewalls of the second gate structure 140b. The impurity regions may serve as source/drain regions.

As illustrated above, the metal oxide layer may be formed on the first region R1, and the metal oxide layer may serve as a gate insulation layer of the first transistor. The metal oxide layer may not be formed on the second region R2. The first silicon oxide layer may be formed on the second region R2, and the first silicon oxide layer may serve as the gate insulation layer of the second transistor. In this manner, a first gate insulation layer formed of a first material (e.g., metal oxide) may be formed on a first region of a semiconductor device, and a second gate insulation layer formed of a second material (e.g., silicon oxide) may be formed on a second region of the semiconductor device at the same vertical level as the first gate insulation layer. The first gate insulation layer (e.g., 126a) may have a thinner thickness (e.g., vertical thickness) than the second gate insulation layer (e.g., 120). The same semiconductor device, such as a semiconductor chip formed on a die from a wafer, may have these two different-thickness gate insulation layers at two different horizontally separate regions. Thus, leakage currents and the reliability failures of the second transistor generated by the metal oxide layer remaining on the first silicon oxide layer may be reduced.

FIGS. 4 to 20 are plan views and cross-sectional views illustrating a method of manufacturing a semiconductor device in accordance with example embodiments.

FIGS. 7, 8, 10, 11, 13, 15, 17, 18 and 20 are cross-sectional views taken along the first direction in first and second regions. FIGS. 5, 12, 14, 16 and 19 are cross-sectional views taken along the second direction in first and second regions.

Figure 4:
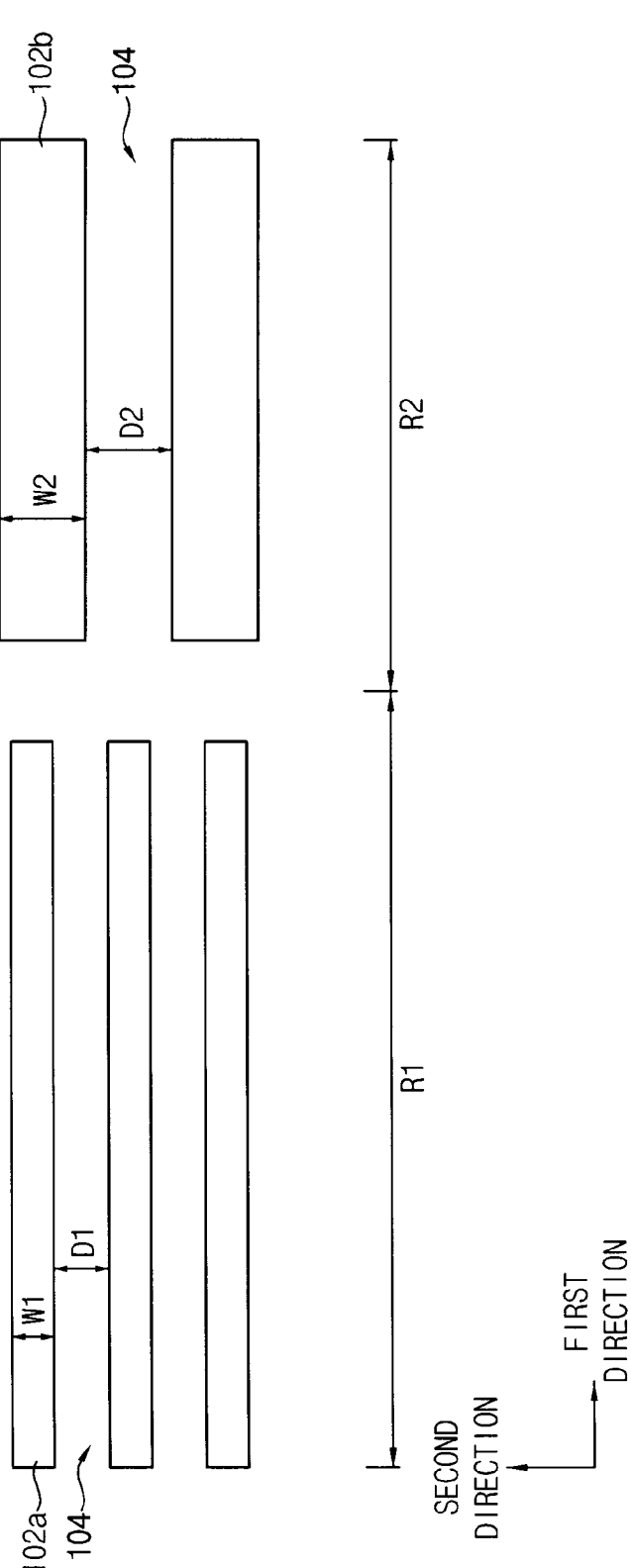
Figure 5:
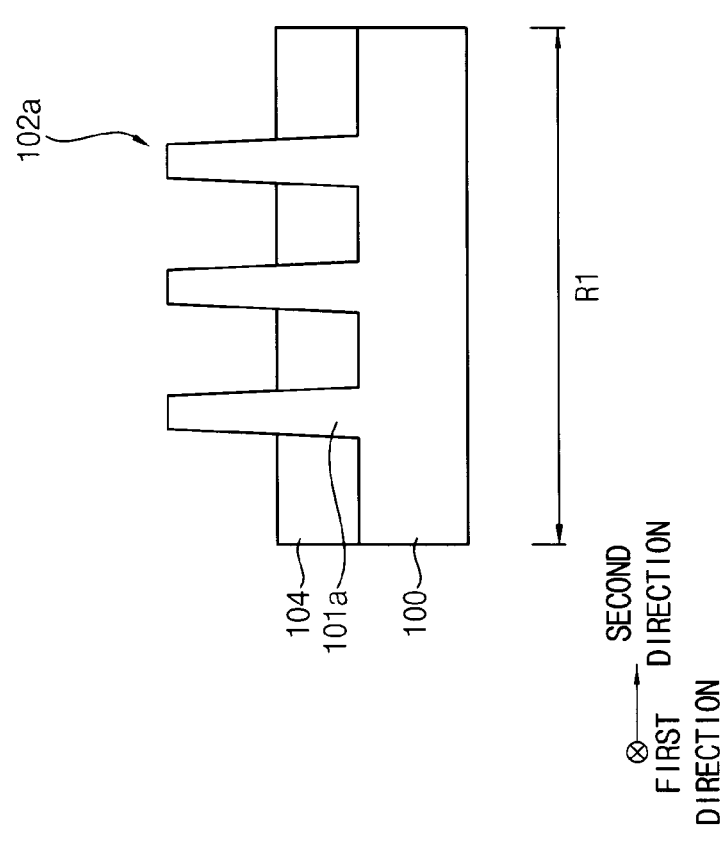

Referring to FIGS. 4 and 5, an upper portion of a substrate 100 may be partially etched to form a first trench at a first region R1 and a second trench at a second region R2. As the first and second trenches are formed at the substrate 100, a plurality of first active patterns 101a may be formed on the first region R1, and a plurality of second active patterns 101b may be formed on the second region R2. Each of the first and second active patterns 101a and 101b may extend in the first direction.

An isolation layer 104 may be formed to fill lower portions of the first and second trenches.

In example embodiments, a portion exposed by the isolation layer in the first region R1 may serve as a first active fin 102a. The first active fin 102a may have a first width W1 in the second direction. A gap between first active fins 102a may have a first distance D1 in the second direction. The gap between the first active fins 102a may correspond to the first trench.

In example embodiments, a portion exposed by the isolation layer in the second region R2 may serve as a second active fin 102b. The second active fin 102b may have a second width W2 in the second direction greater than the first width W1. A gap between second active fins 102b may have a second distance D2 in the second direction greater than the first distance D1. The gap between the second active fins 102b may correspond to the second trench.

Figure 6:
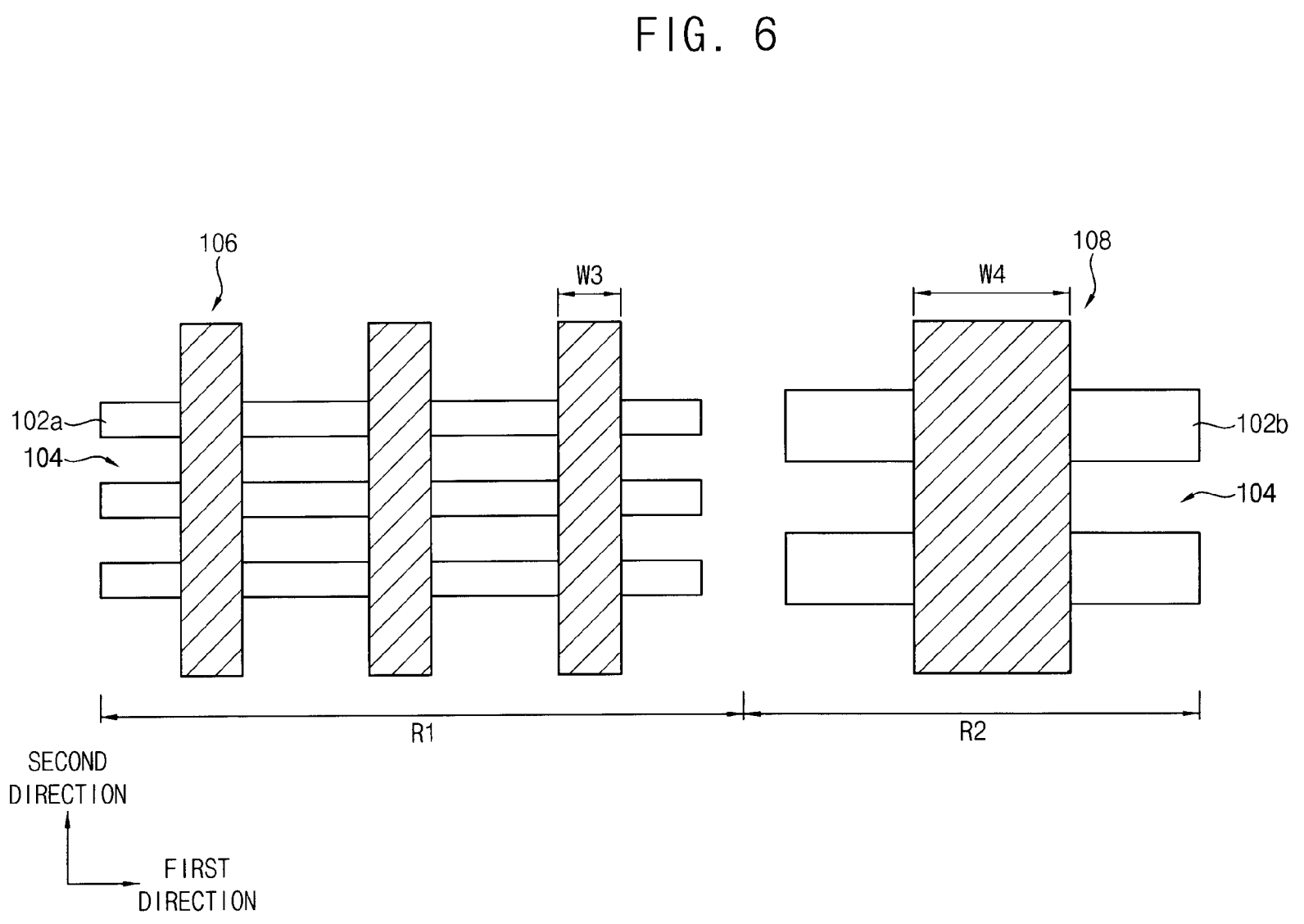
Figure 7:
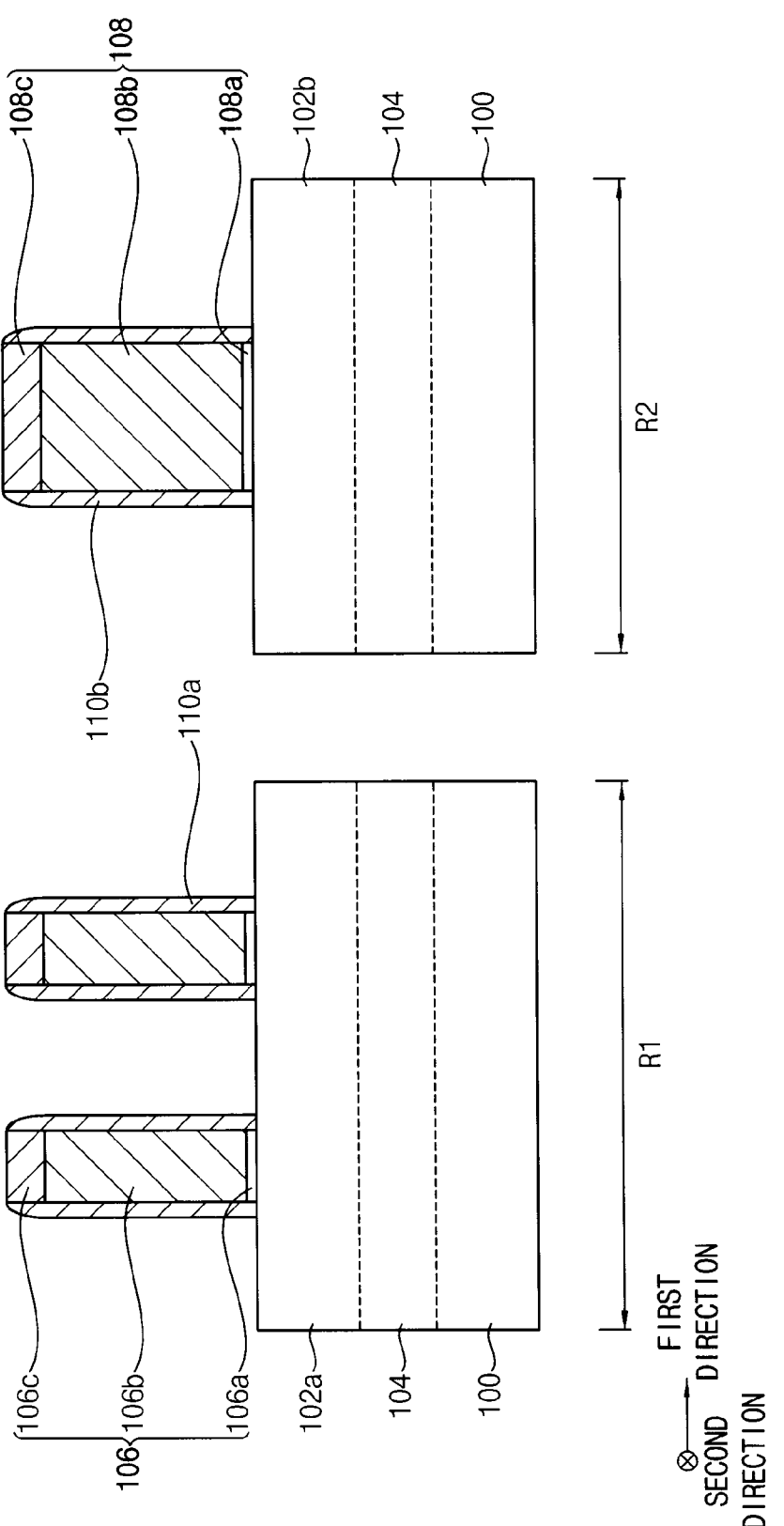

Referring to FIGS. 6 and 7, a first dummy gate structure 106 including a first dummy insulation pattern 106a, a first dummy gate electrode 106b and a first dummy mask 106c sequentially stacked may be formed on the first active fin 102a and the isolation layer 104. A second dummy gate structure 108 including a second dummy insulation pattern 108a, a second dummy gate electrode 108b and the second dummy mask 108c sequentially stacked may be formed on the second active fin 102b and the isolation layer 104.

A first spacer 110a may be formed on sidewalls of the first dummy gate structure 106. A second spacer 110b may be formed on sidewalls of the second dummy gate structure 108. In example embodiments, the first and second spacers 110a and 110b may include, e.g., silicon nitride, silicon oxynitride, etc.

In example embodiments, the first dummy gate structure 106 may extend in the second direction to cross a plurality of the first active fins 102a. A plurality first dummy gate structures 106 may be spaced apart from each other in the first direction. The first dummy gate structure 106 may have a third width W3 in the first direction.

In example embodiments, the second dummy gate structure 108 may extend in the second direction to cross a plurality of the second active fins 102b. A plurality second dummy gate structures 108 may be spaced apart from each other in the first direction. The first dummy gate structure 108 may have a fourth width W4 in the first direction grater than the third width W3.

Figure 8:
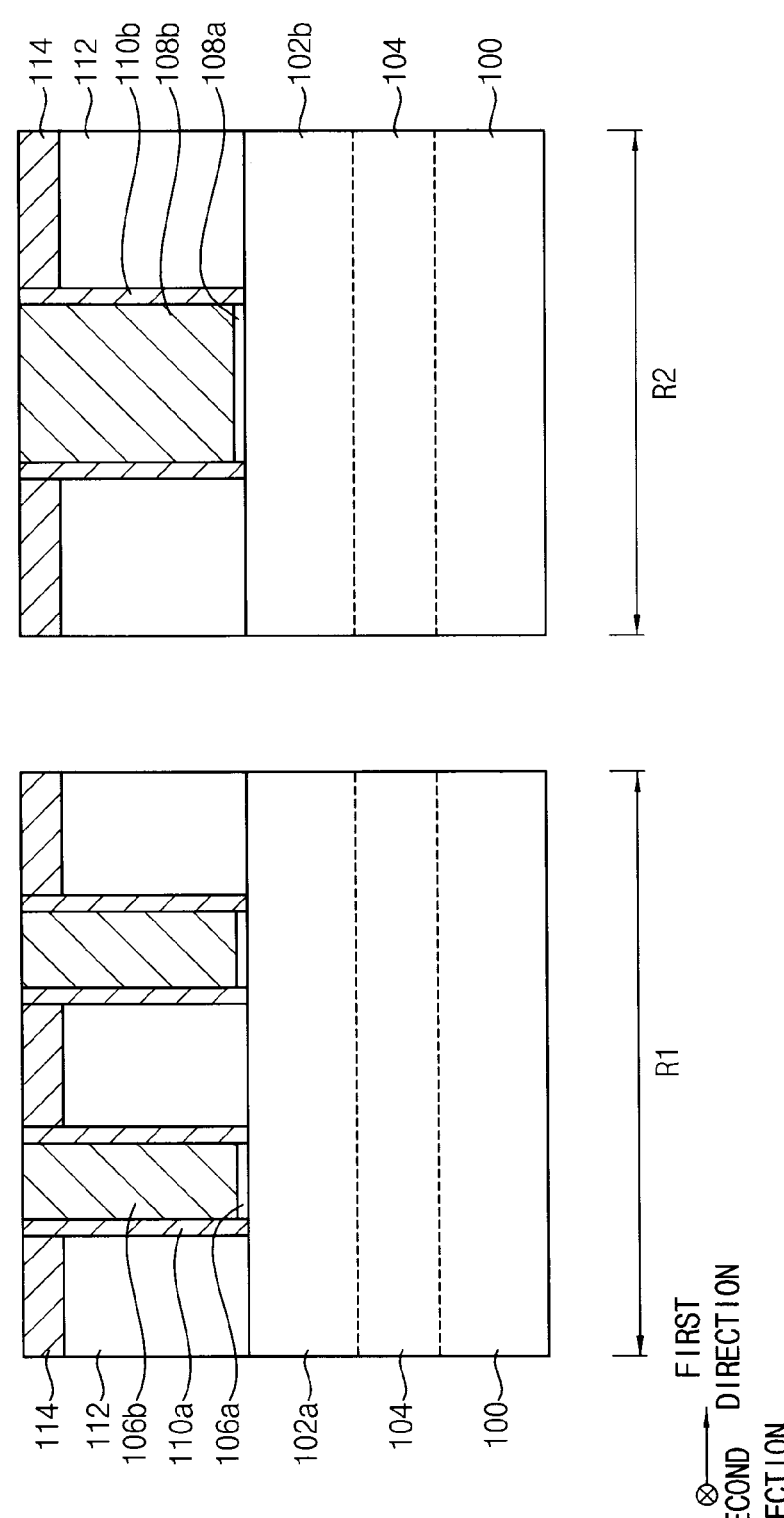

Referring to FIG. 8, a preliminary insulating interlayer may be formed to fill a gap between the first dummy gate structures 106 and a gap between the second dummy gate structures 108. The preliminary insulating interlayer may cover the first and second dummy gate structures 106 and 108. The first preliminary insulating interlayer may be planarized until upper surfaces of the first and second dummy gate electrodes 106b and 108b are exposed. That is, the first and second dummy masks 106c and 108c may be removed by the planarization process.

An upper portion of the first preliminary insulating interlayer may be partially removed to form a first insulating interlayer 112. A recess may be formed over the first insulating interlayer 112. A mask layer may be formed to fill the recess, and an upper portion of the mask layer may be planarized until upper surfaces of the first and second dummy gate electrodes 106b and 108b may be exposed. Thus, a mask pattern 114 may be formed on the first insulating interlayer 112.

Figure 9:
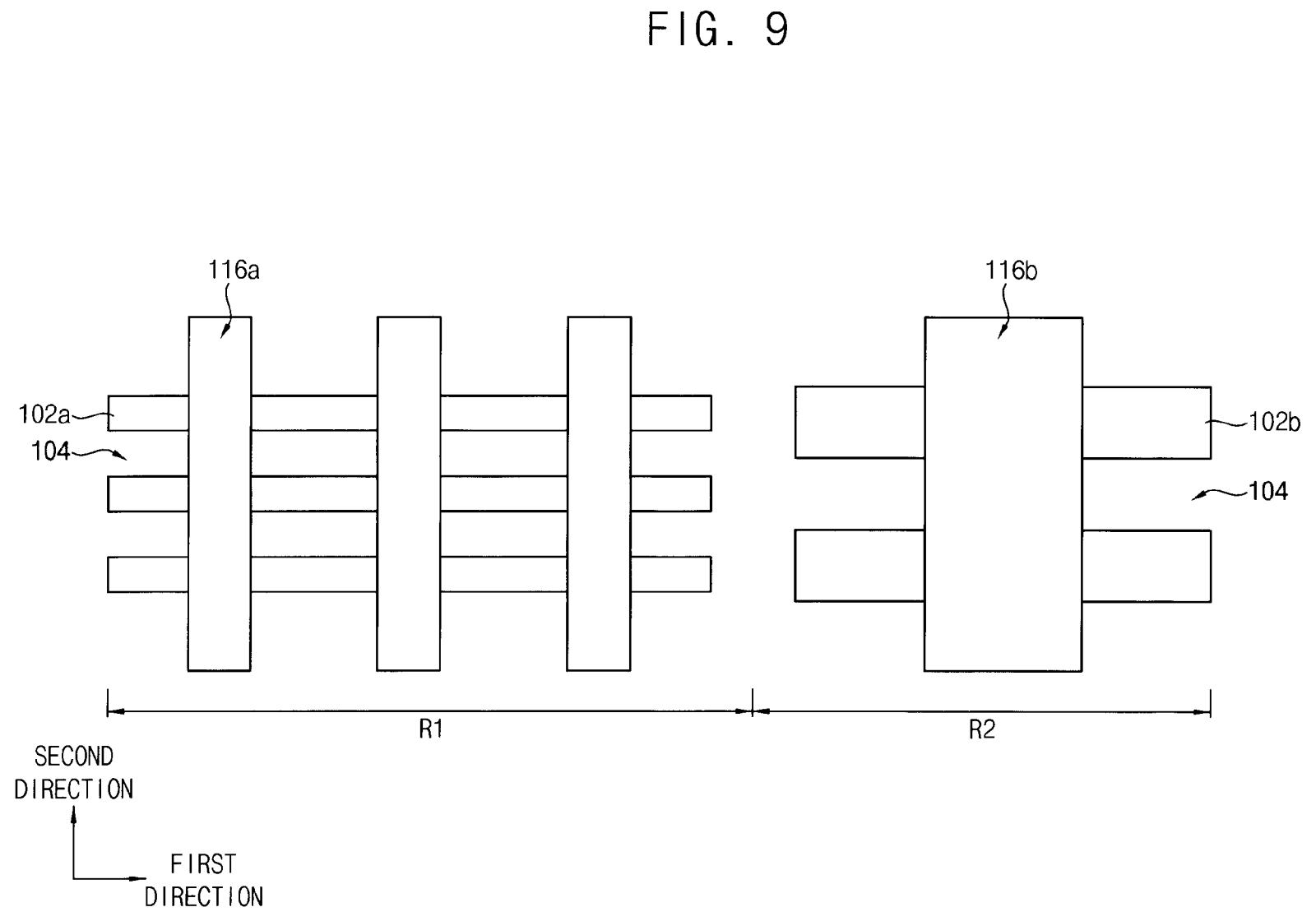
Figure 10:
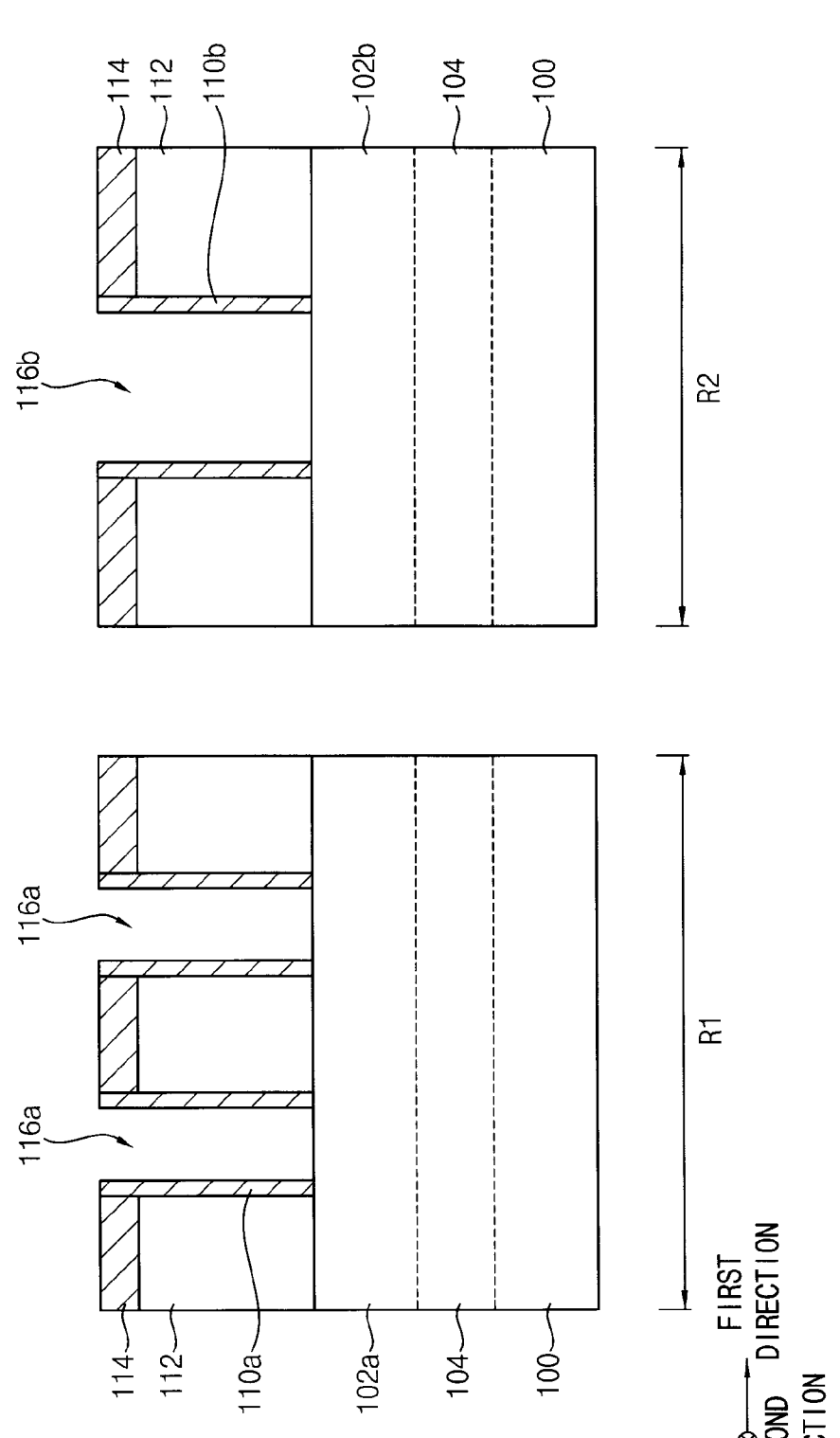

Referring to FIGS. 9 and 10, the first dummy gate structure 106 may be removed to form a first opening 116a. The second dummy gate structure 108 may be removed to form a second opening 116b.

The first active fin 102a and the isolation layer 104 may be exposed by the first opening 116a (e.g., a plurality of first openings may be formed). The second active fin 102b and the isolation layer 104 may be exposed by the second opening 116b (e.g., a plurality of second openings may be formed).

Figure 11:
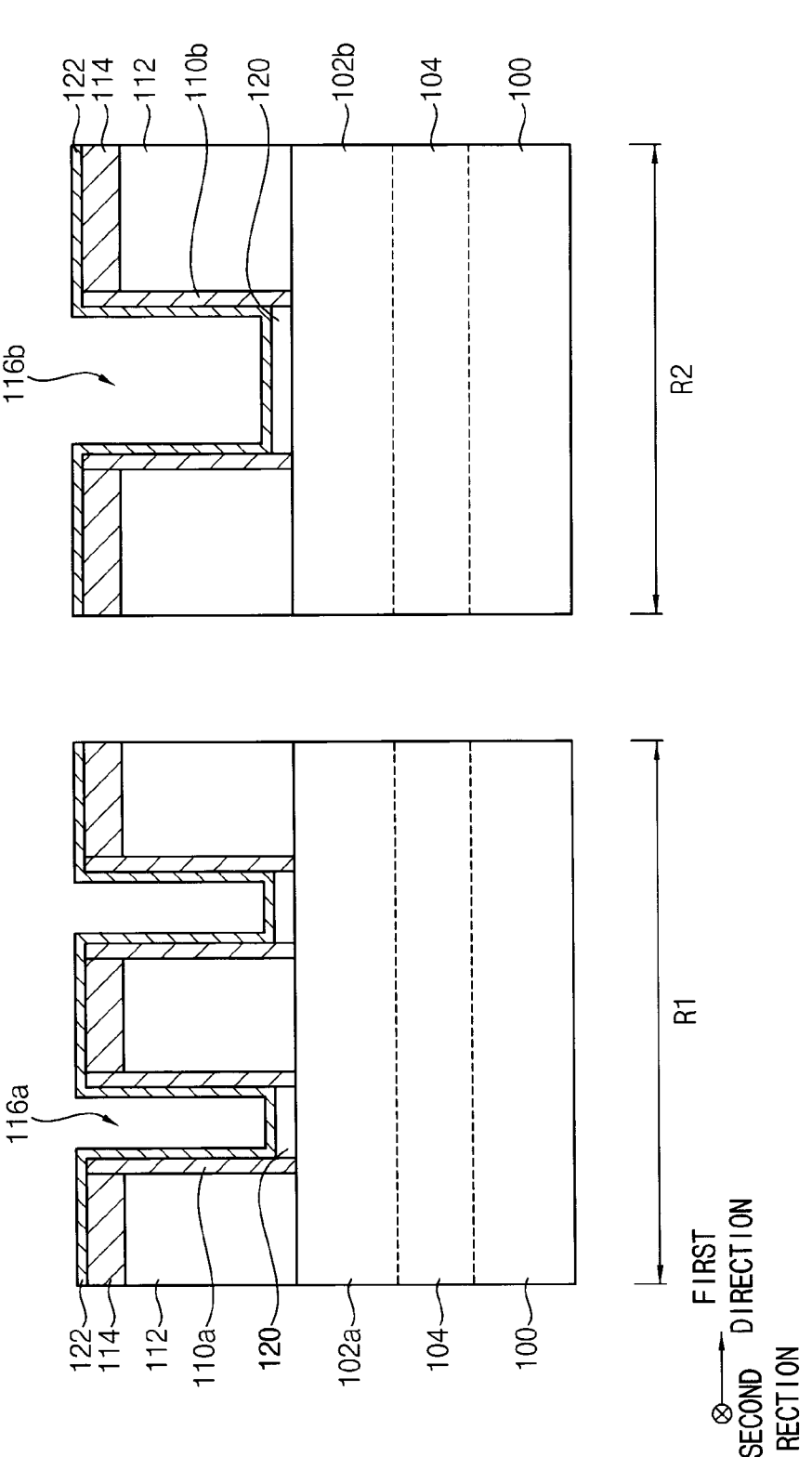
Figure 12:
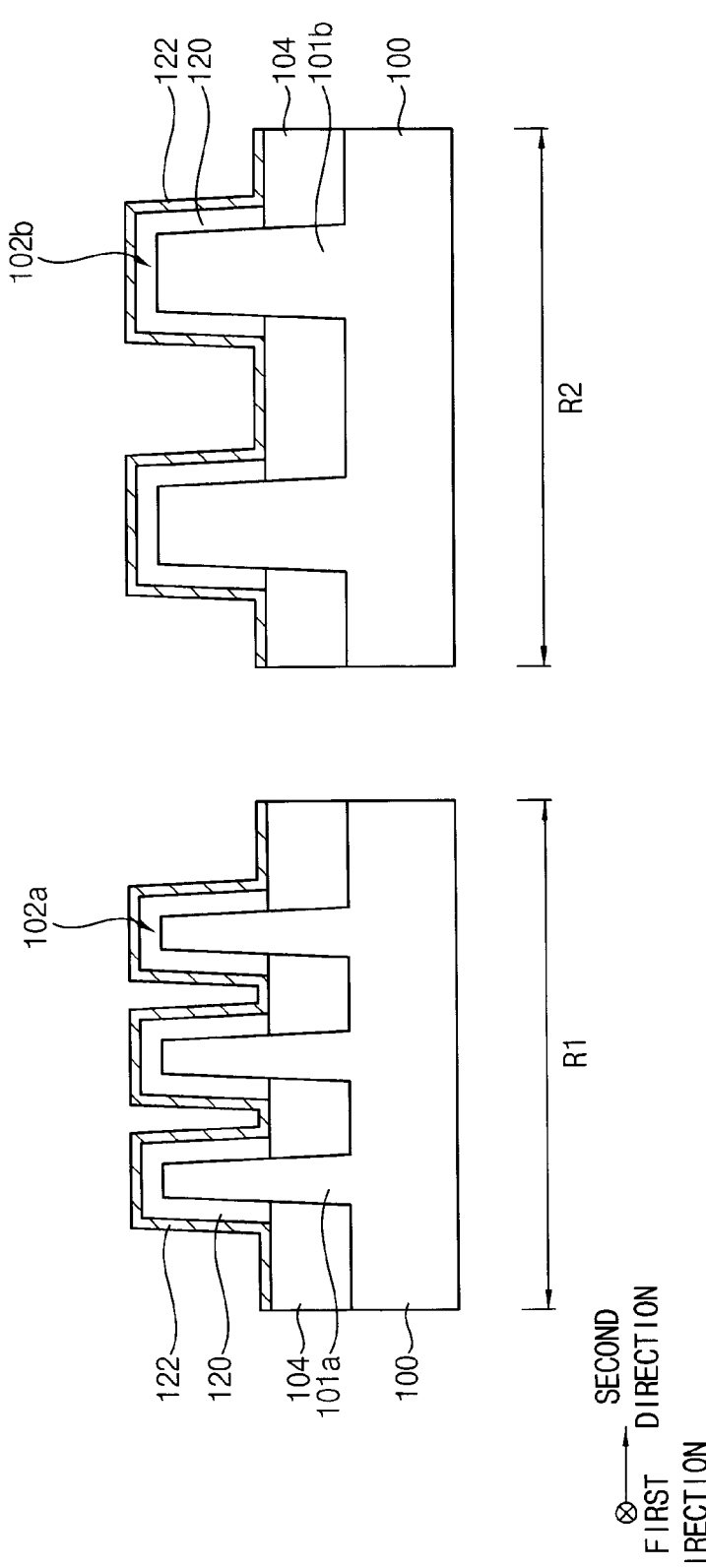

Referring to FIGS. 11 and 12, a first silicon oxide layer 120 may be formed on the first and second active fins 102a and 102b exposed by the first and second openings 116a and 116b. The first silicon oxide layer 120 may be formed to have a second thickness. The first silicon oxide layer 120 may serve as a gate insulation layer of a second transistor.

In example embodiments, the first silicon oxide layer 120 may include a thermal oxide formed by an oxidation of silicon of the first and second active fins 102a and 102b. Thus, the first silicon oxide layer 120 may be formed on only surfaces of the first and second active fins 102a and 102b. In example embodiments, the first silicon oxide layer 120 may be formed by a wet treatment process.

A hard mask layer 122 may be conformally formed on sidewalls of the first and second openings 116a and 116b, the first silicon oxide layer 120, the isolation layer 104 and the mask pattern 114. The hard mask layer 122 may protect the first silicon oxide layer 120. Thus, the hard mask layer 122 may be formed to have a material having a high etching selectivity with respect the first silicon oxide layer 120. In example embodiments, the hard mask layer 122 may include, e.g., titanium oxide.

Figure 13:
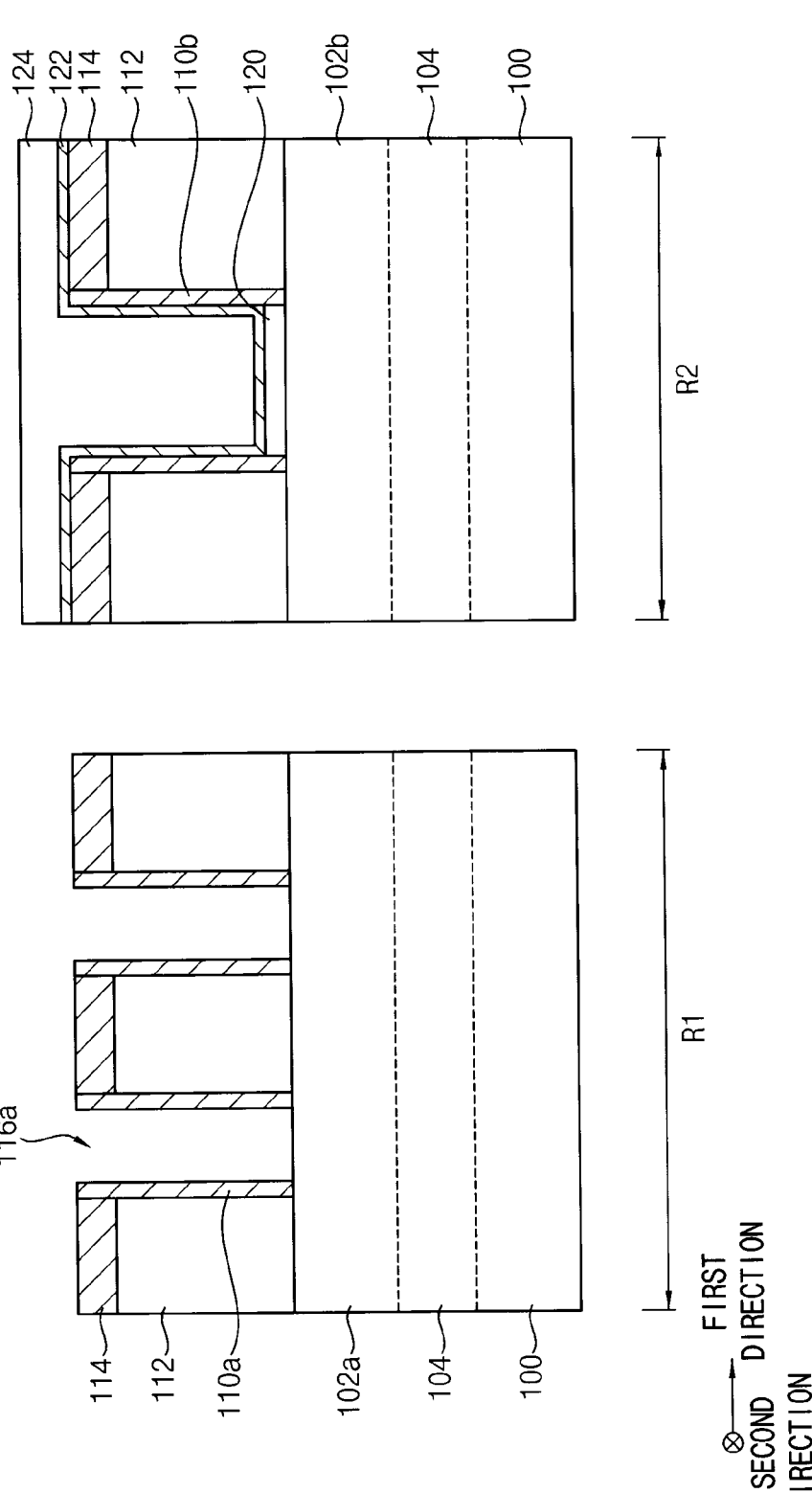
Figure 14:
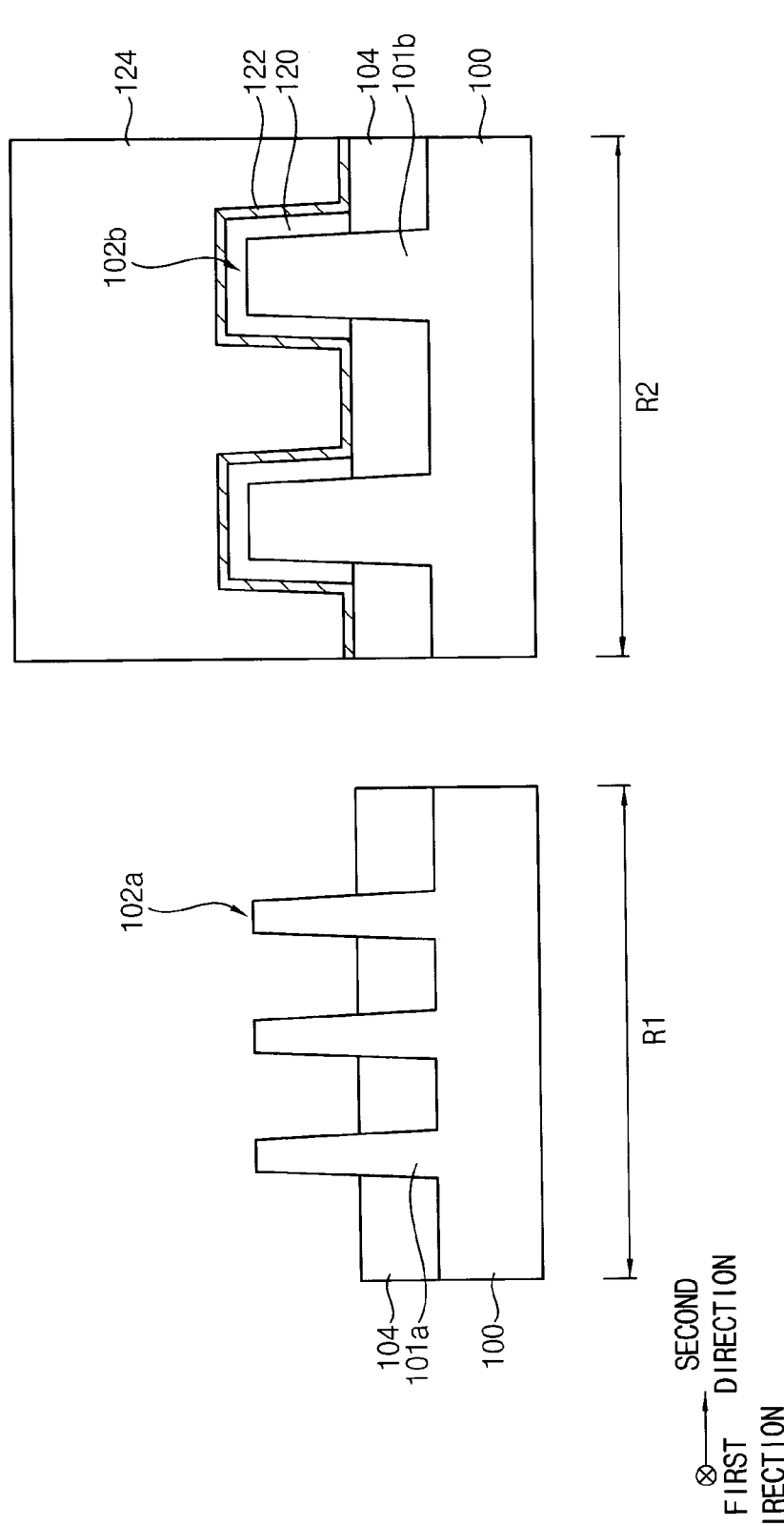

Referring to FIGS. 13 and 14, a first photoresist layer may be formed on the hard mask layer 122, for example by a spin coating process. The first photoresist layer may be patterned by a photo process to form a first photoresist pattern 124 covering the second region R2 of the substrate 100.

The hard mask layer 122 and the first silicon oxide layer 120 on the first region R1 may be sequentially etched using the first photoresist pattern 124 as an etching mask. The etching process may include a wet etching process.

By performing the etching process, the surface of the first active fin 102a is exposed by the first opening 116a. As the wet etching process is performed, the hard mask layer 122 and the first silicon oxide layer 120 on the first region R1 are removed while reducing damages of the surface of the first active fin 102a.

Figure 15:
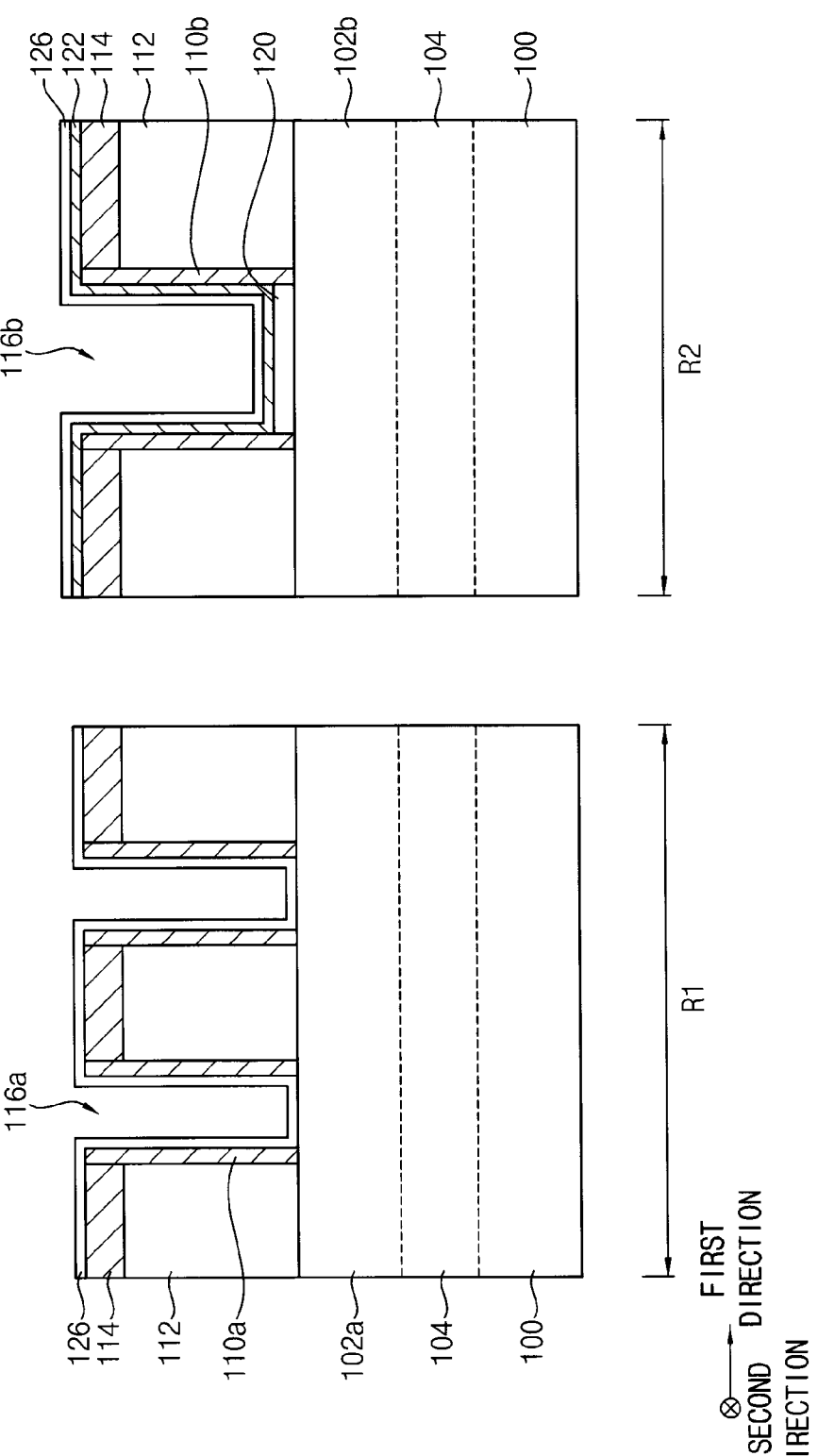
Figure 16:
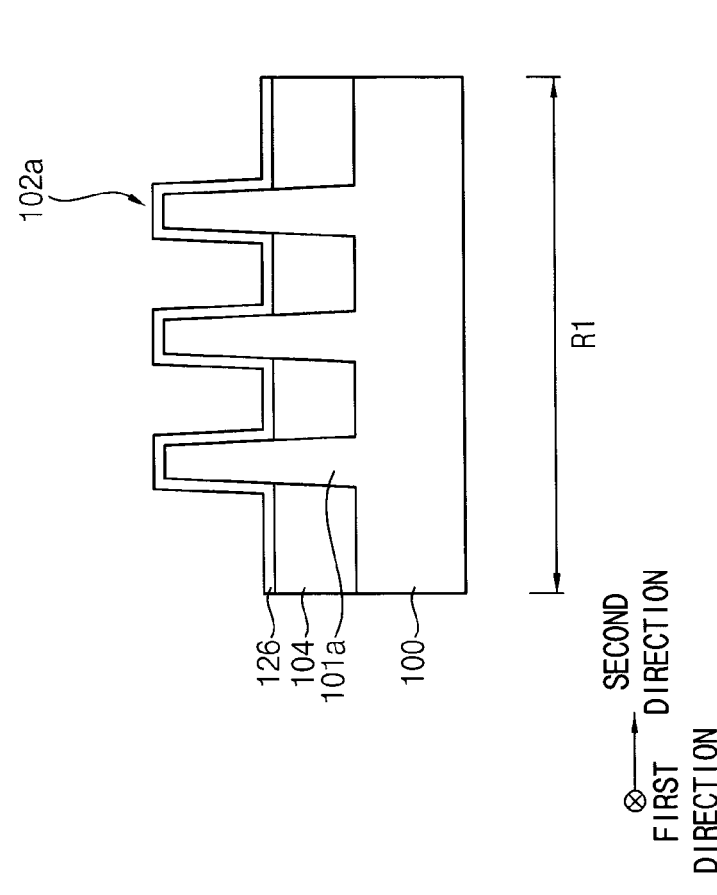

Referring to FIGS. 15 and 16, the surface of the first active fin 102a exposed by the first opening 116a may be oxidized to form a pad oxide layer (not shown).

A metal oxide layer 126 may be conformally formed on entire surfaces of exposed layers in the first and second regions R1 and R2. For example, the metal oxide layer 126 may be formed on and may contact the sidewalls of the first opening 116a, an upper surface of the pad oxide layer (or if a pad oxide layer is not used, an upper surface of the first active fin 102a), and an upper surface of the mask pattern 114, in the first region R1. The metal oxide layer 126 may be formed on and contact the hard mask layer 122, in second region R2.

The metal oxide layer 126 may be formed to have a first thickness less than the second thickness of the first silicon oxide layer 120 that serves as a gate insulation layer of a second transistor. The first and second thicknesses may refer, for example, to a thickness, e.g., in a vertical direction where each of the metal oxide layer 126 and the silicon oxide layer 120 contact a topmost surface of each fin, and in a direction perpendicular to side surfaces of each fin where each of the metal oxide layer 126 and the silicon oxide layer 120 contact a sidewall surface of each fin. At a topmost surface of each respective first and second active fin 102a and 102b, the metal oxide layer 126 and the silicon oxide layer 120 may have coplanar bottom surfaces that contact the topmost surface of each respective fin and extend above each respective fin by a particular height, where the height of the silicon oxide layer 120 is greater than the height of the metal oxide layer 126. The metal oxide layer 126 may include, e.g., hafnium oxide (HfO2), tantalum oxide (Ta2O5), zirconium oxide (ZrO2), etc The metal oxide layer 126 may be formed by, e.g., a chemical vapor deposition (CVD) process or an atomic layer deposition (ALD) process. The metal oxide layer 126 may serve as a gate insulation layer of a first transistor.

Figure 17:
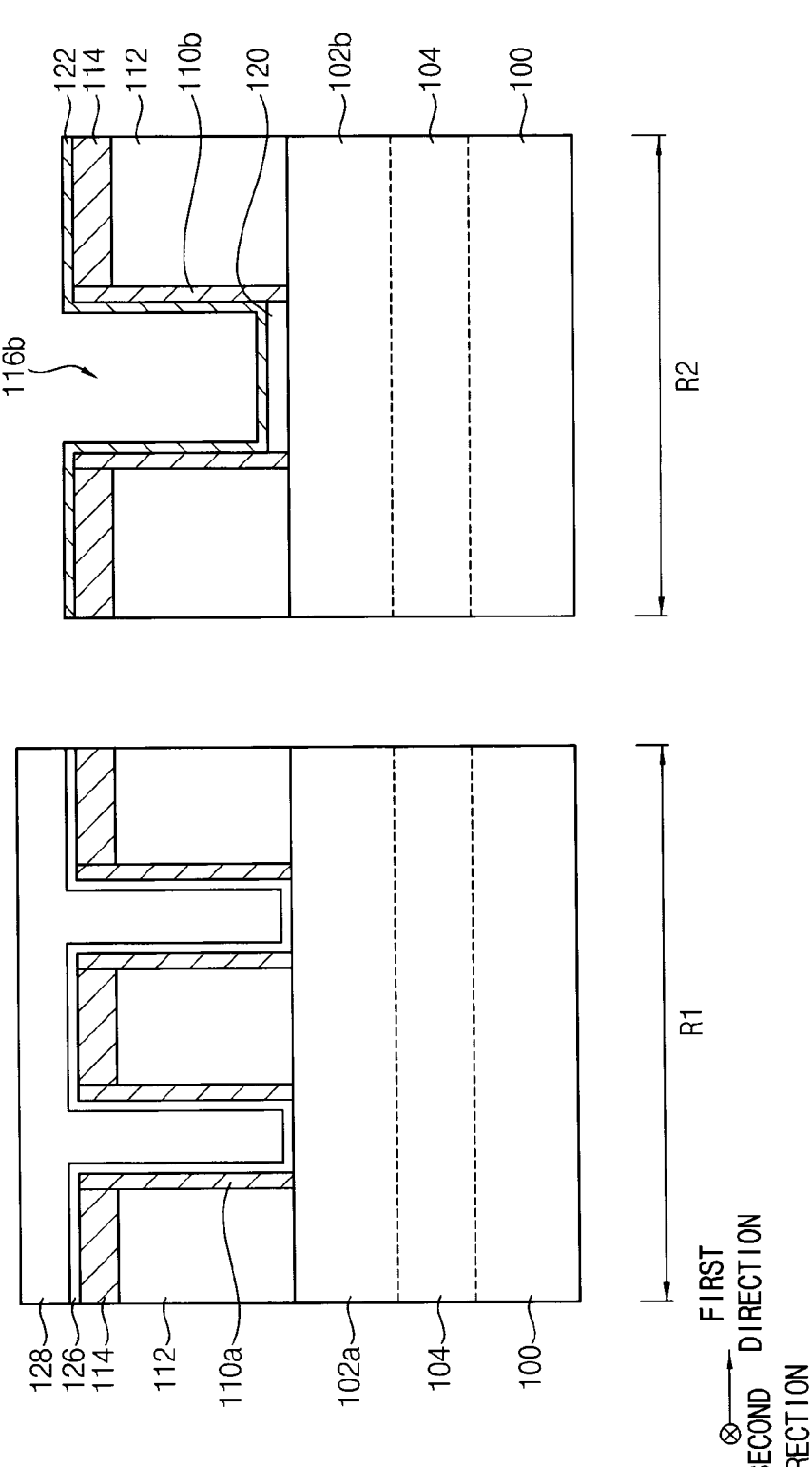

Referring to FIG. 17, a second photoresist layer may be formed on the metal oxide layer, for example by a spin coating process. The second photoresist layer may be patterned by a photo process to form a second photoresist pattern 128 covering the first region R1 of the substrate 100.

The metal oxide layer 126 on the second region R2 may be etched using the second photoresist pattern 128 as an etching mask. In example embodiments, the etching process may include a dry etching process.

Figure 18:
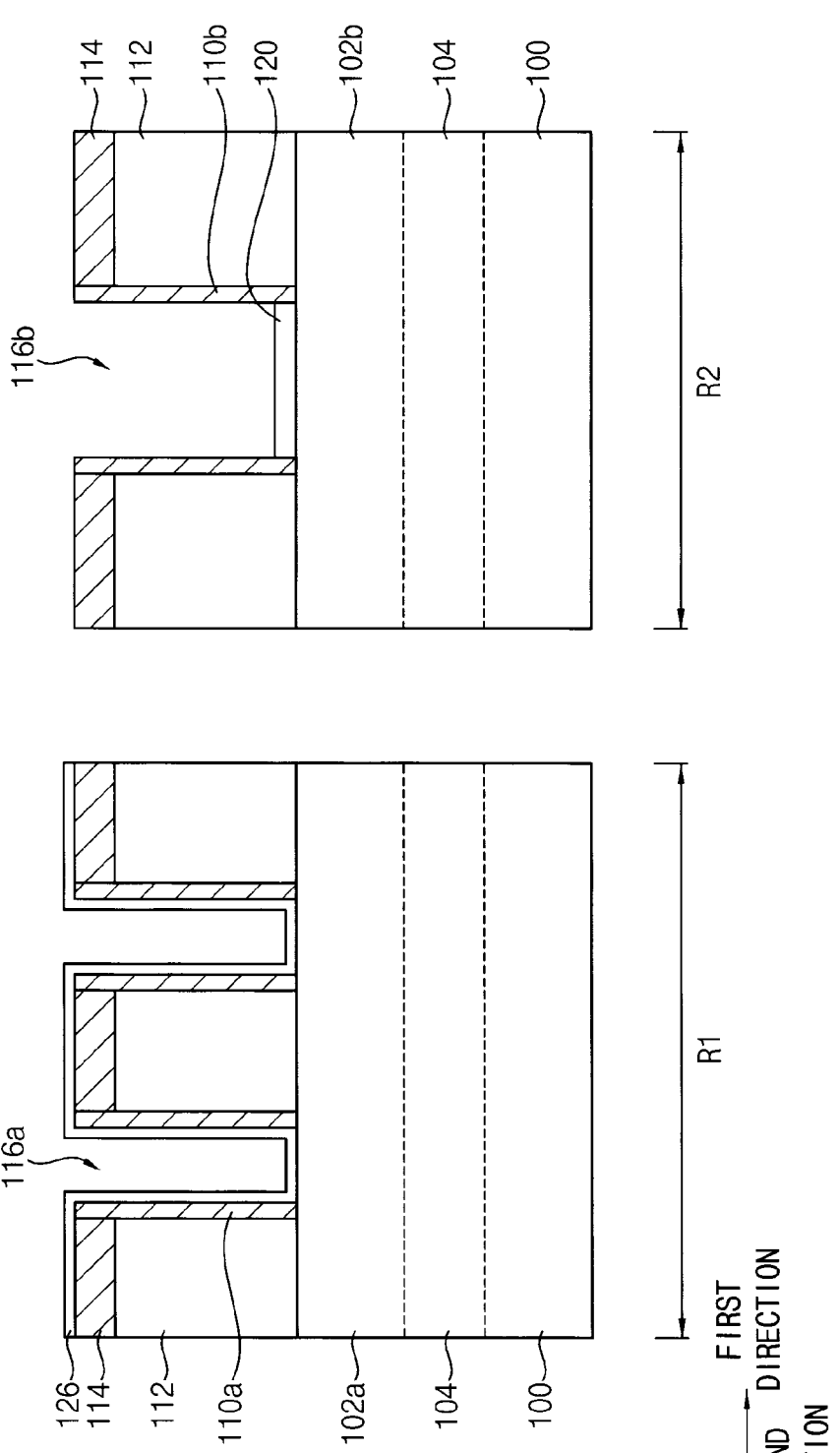
Figure 19:
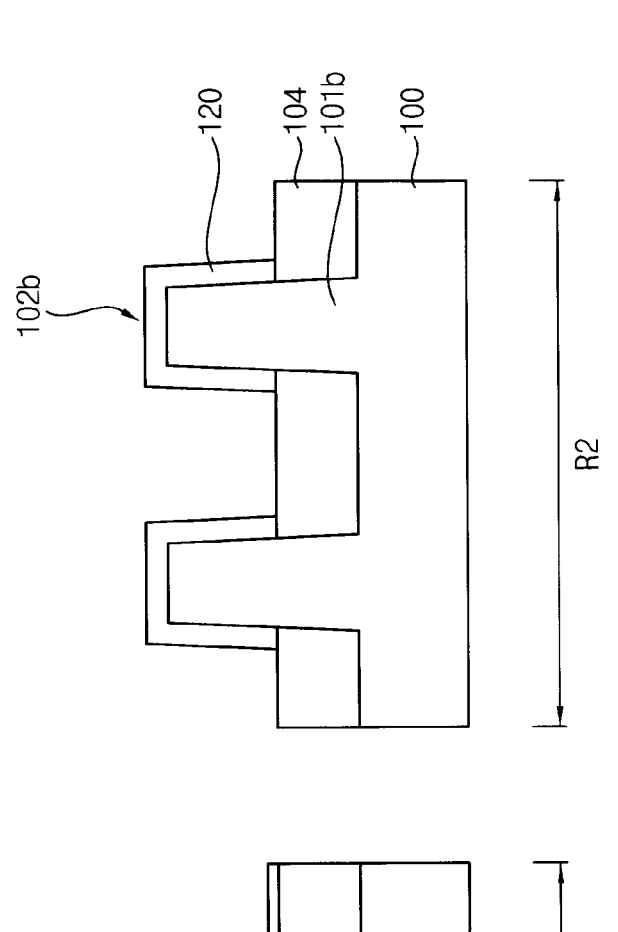
Figure 19:
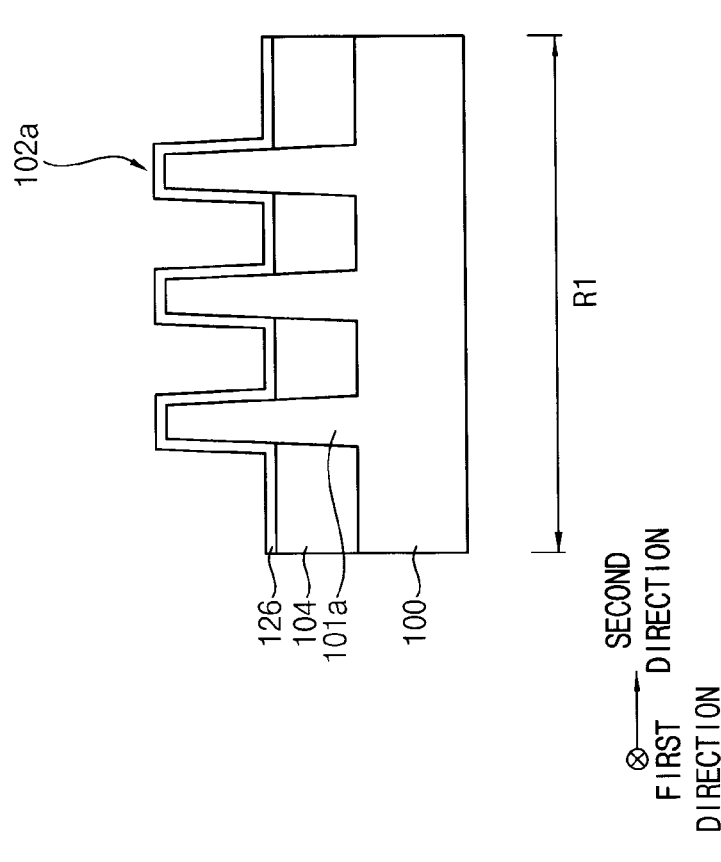

Referring to FIGS. 18 and 19, the hard mask layer 122 may be etched using the second photoresist pattern 128 as an etching mask. In example embodiments, the etching process of the hard mask layer 122 may include a wet etching process. Although the metal oxide layer 126 partially remains on the hard mask layer 122 before the wet etching process, the metal oxide layer 126 may be removed together during the wet etching process of the hard mask layer 122. Thus, the metal oxide layer 126 may be removed from the second region R2.

Thus, the metal oxide layer 126 may be formed on the sidewalls and bottom of the first opening 116a in the first region R1, and the first silicon oxide layer 120 may be formed on the bottom of the second opening 116b in the second region R2.

The second photoresist pattern 128 may then be removed.

Figure 20:
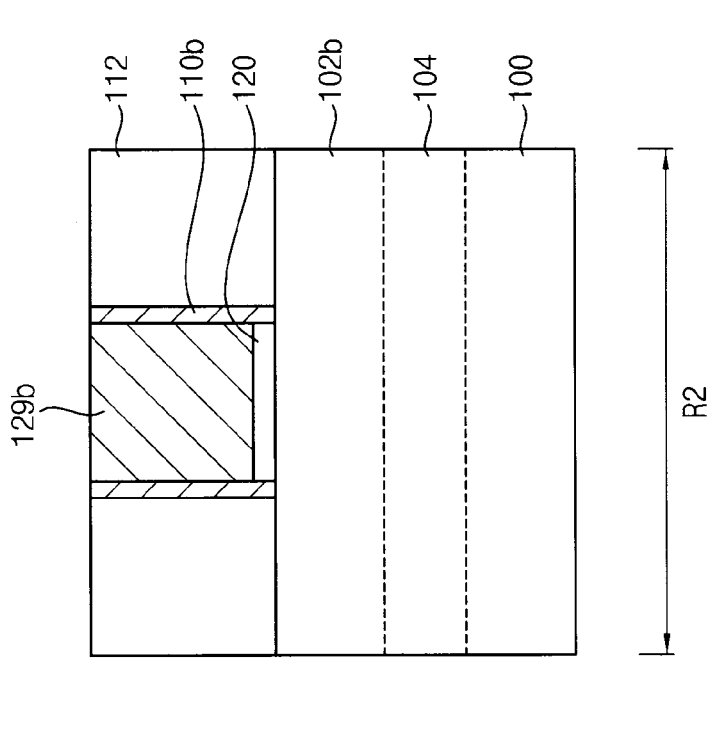
Figure 20:
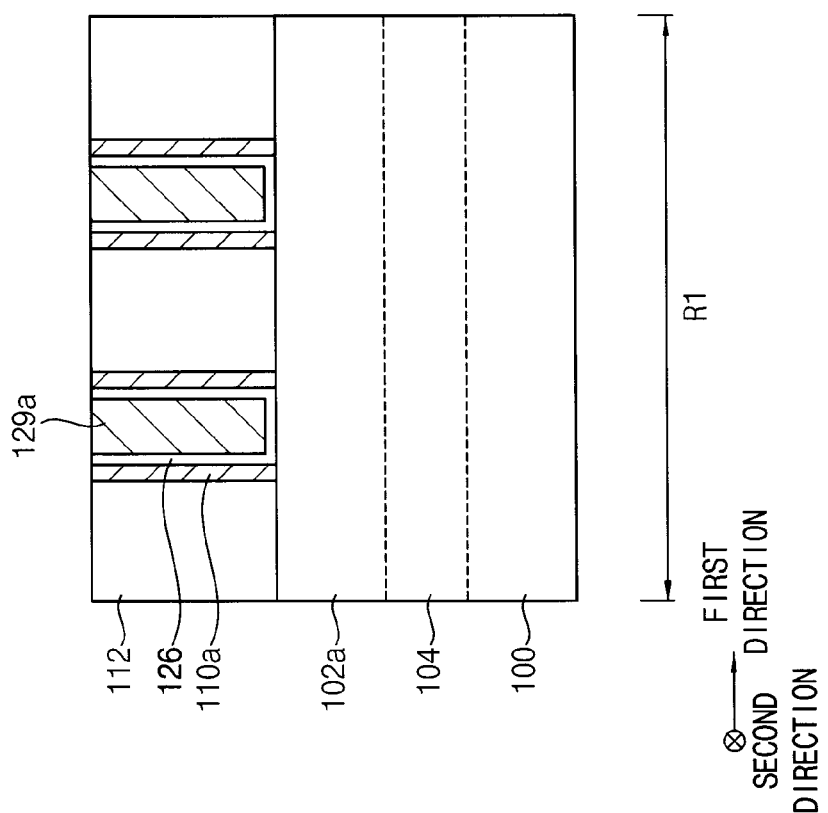

Referring to FIG. 20, a gate electrode layer may be formed to fill the first and second openings 116a and 116b. The gate electrode layer may cover the mask pattern 114. The gate electrode layer may be planarized until the upper surface of the first insulating interlayer 112 is exposed. The mask pattern 114 may also removed by the planarization process. Thus, a first preliminary gate electrode 129a may be formed in the first opening 116a, and a second preliminary gate electrode 129b may be formed in the second opening 116b.

The gate electrode layer may include a metal or a metal nitride. In example embodiments, the first gate electrode layer may include, e.g., Ti, TiN, Ta, TaN, TiAlC, TiAlCN, TiAlSiCN, Co and W, etc. For example, the gate electrode layer may include a lower layer and an upper layer stacked. The lower layer may include at least one selected from the group consisting of Ti, TiN, Ta, TaN and TiAlC, TiAlCN, and the upper layer may include Co or W. The lower layer may be selected according to the threshold voltage of the first transistor.

The first preliminary gate electrode 129a may contact the metal oxide layer 126. The second preliminary gate electrode 129b may contact the first silicon oxide layer 120.

Referring to FIGS. 1 and 3 again, upper portions of the first and second preliminary gate electrodes 129a and 129b may be removed to form a first gate electrode 130a and a second gate electrode 130b, respectively. The first gate electrode 130a may be formed in the first opening 116a, and the second gate electrode 130b may be formed in the second opening 116b. An upper portion of the metal oxide layer 126 may be removed as well to form the metal oxide pattern 126a.

A capping layer may be formed on the first gate electrode 130a, the second gate electrode 130b and the first insulating interlayer 112 to fill the first and second openings 116a and 116b. The capping layer may be planarized until the upper surface of the first insulating interlayer 112 is exposed to form a first capping pattern 132a and a second capping pattern 132b. The first capping pattern 132a may be formed on the first gate electrode 130a and may also be formed on the metal oxide pattern 126a, and the second capping pattern 132b may be formed on the second gate electrode 130b. The first and second capping patterns 132a and 132b may include, e.g., silicon nitride, silicon oxynitride.

Thus, a first gate structure 140a including a metal oxide pattern 126a, a first gate electrode 130a and a first capping pattern 132a sequentially stacked may be formed on the first region R1 of the substrate 100. A second gate structure 140b including a first silicon oxide layer 120, a second gate electrode 130b and a second capping pattern 132b sequentially stacked may be formed on the second region R2 of the substrate 100.

As described above, the second gate structure of the second transistor may not include the metal oxide layer on the first silicon oxide layer. As a result, a second finFET is formed on the second active fin 102b on a second region R2 of the substrate 100 horizontally separated from the first region R1 of the substrate 100, and the second finFET does not include a metal oxide layer, but includes a gate insulation layer (e.g., silicon oxide layer 120) that has a bottom surface at the same plane as a bottom surface of the first metal oxide layer 126 (e.g., first silicon oxide pattern 120). Thus, the leakage currents and the reliability failures of the second transistor may be reduced.

Figure 21:
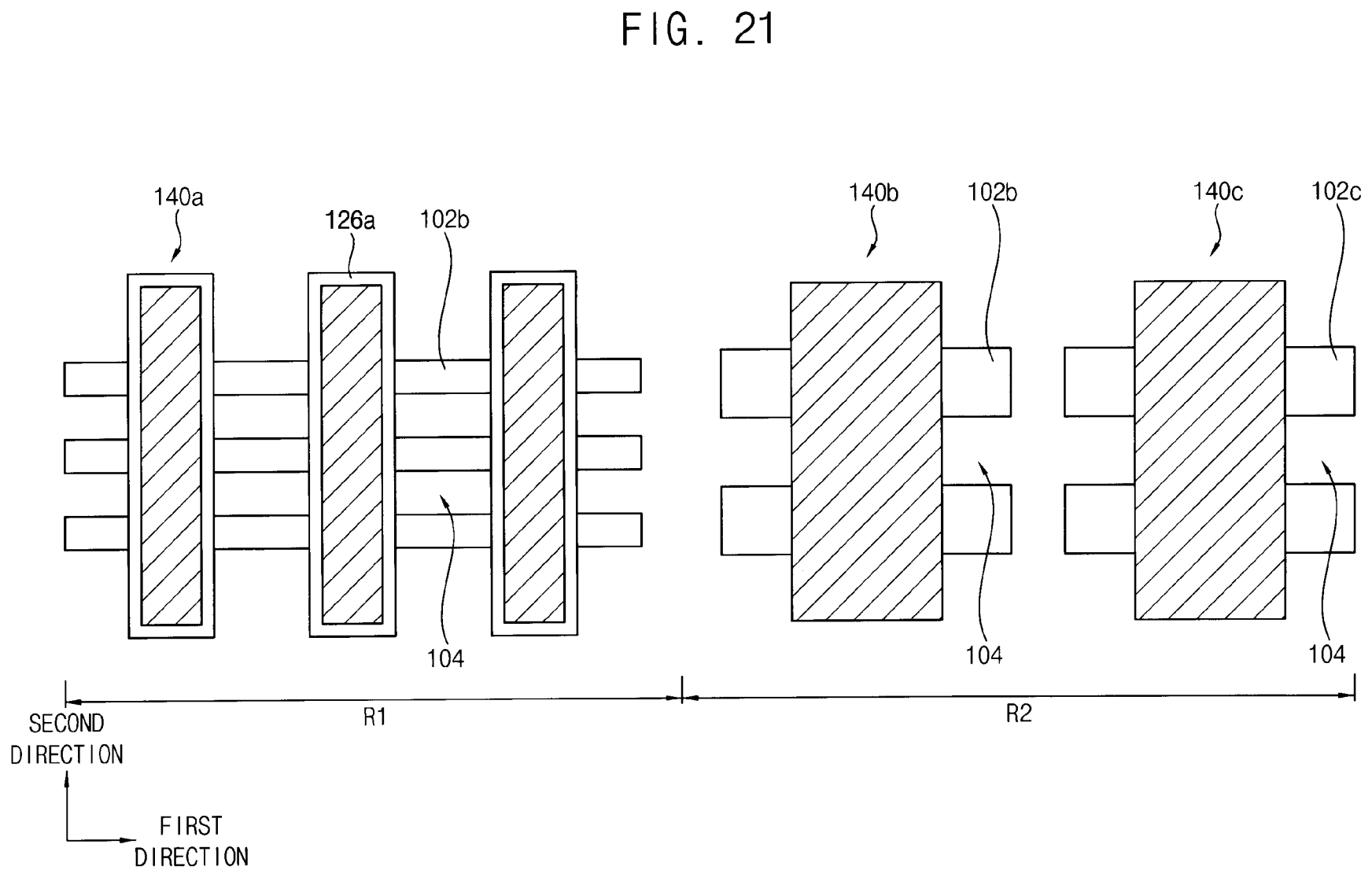
Figure 22:
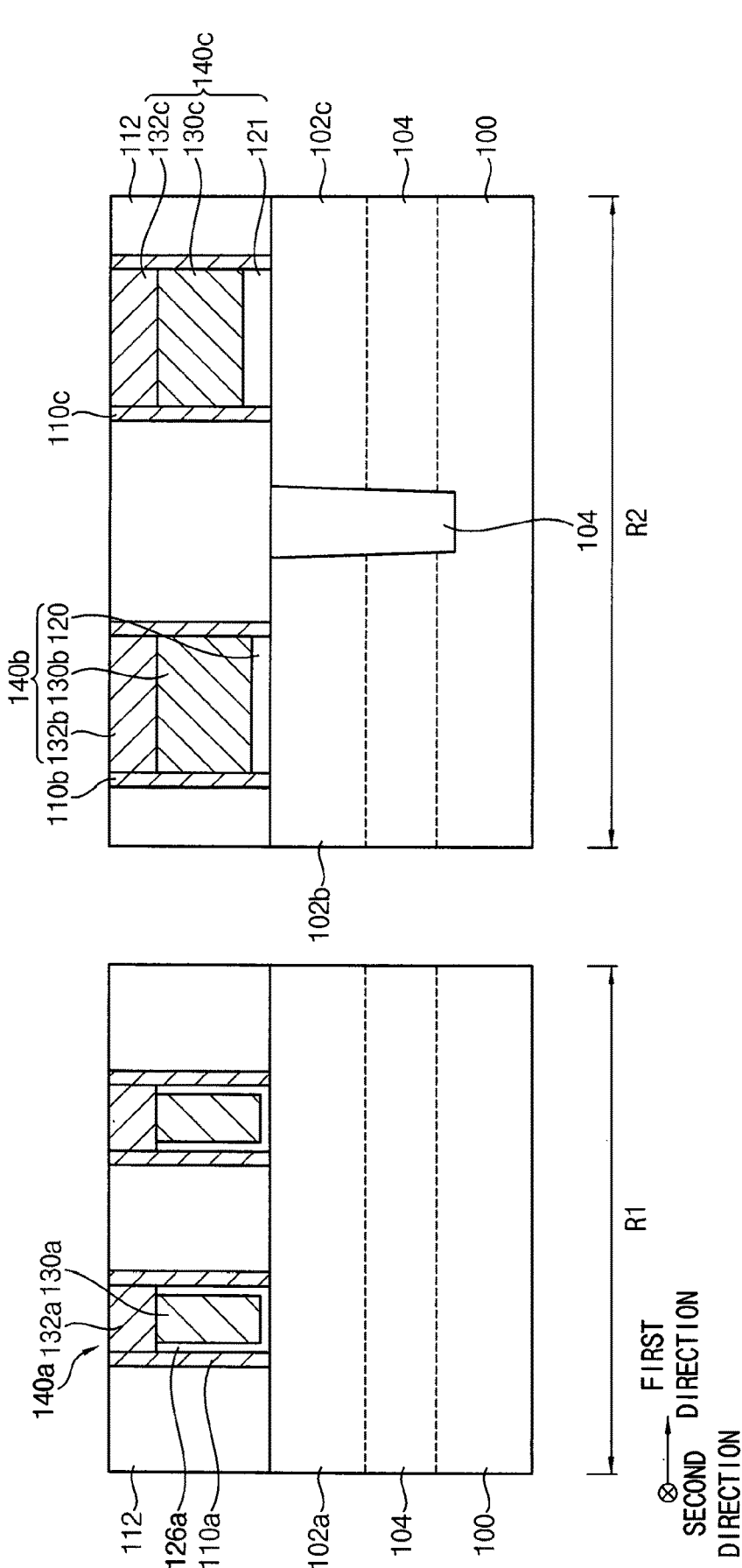

FIGS. 21 and 22 are a plan view and a cross-sectional view illustrating a semiconductor device in accordance with example embodiments.

In FIG. 21, some elements, e.g., spacers are omitted. FIG. 21 illustrates gate electrodes and a metal oxide pattern, in a plan view.

The semiconductor device shown in FIG. 21 may be substantially the same as that illustrated with reference to FIGS. 1 and 2, except for a third transistor serving as an I/O device. The third transistor may have a higher operation voltage and a lower speed than the first transistor. The third transistor may be a FinFET.

The first transistor may be substantially the same as that illustrated with reference to FIGS. 1 and 2. The second transistor may be substantially the same as that illustrated with reference to FIGS. 1 and 2.

Referring to FIGS. 21 and 22, the third transistor may be formed in the peripheral region. The third transistor may have no metal oxide layer, and therefore may have a gate insulation layer formed without metal oxide and without having a high dielectric constant. Thus, the third transistor may be formed in the second region R2.

Particularly, a plurality of third active fins 102c may protrude upwardly from an upper surface of the substrate 100, and may extend in the first direction. An isolation layer 104 may fill a gap between the third active fins 102c. A third gate structure 140c may be formed on the third active fin 102c, and may extend in the second direction. A third spacer 110c may be formed on sidewalls of the third gate structure 140c. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first insulating interlayer 112 may cover the third active fin 102c and the isolation layer 104. A third opening may extend through the first insulating interlayer 112 to expose an upper surface and sidewalls of the third active fin 102c and the isolation layer 104. The third opening may extend in the second direction.

The third gate structure 140c may be formed in the third opening. In example embodiments, the third gate structure 140c may include a second silicon oxide layer 121, a third gate electrode 130c and a third capping pattern 132c sequentially stacked. The second silicon oxide layer 121 may have a thickness different from a thickness of the first silicon oxide layer 120. In example embodiments, the second silicon oxide layer 121 may have the thickness greater than the thickness of the first silicon oxide layer 120.

As described above, gate insulation layers of the second and third transistors formed in the peripheral region may not include the metal oxide layer. For example, a metal oxide layer may be included on the gate insulation layer during the process of manufacturing the second and third transistors, but may be removed as part of the process, such that the completely fabricated second and third transistors do not include a metal oxide layer as part of the gate insulation layer.

The third transistor may be formed together by a process of forming the first and second transistors. However, the second silicon oxide layer may be formed differently in the third opening to be thicker than the first silicon oxide layer in the second opening.

Figure 23:
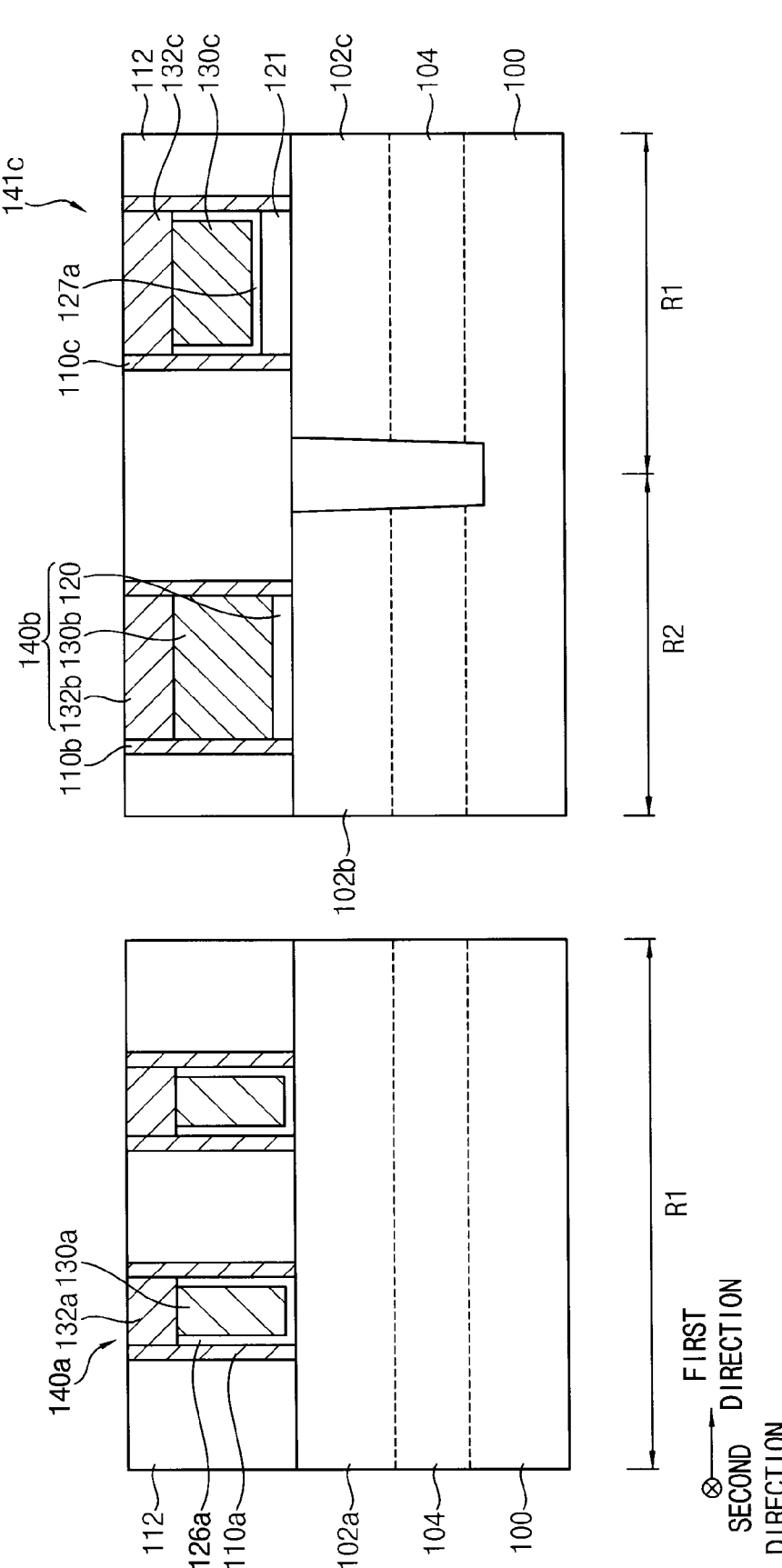
FIGS. 23 and 24 are cross-sectional views illustrating a semiconductor device in accordance with example embodiments.
Figure 24:
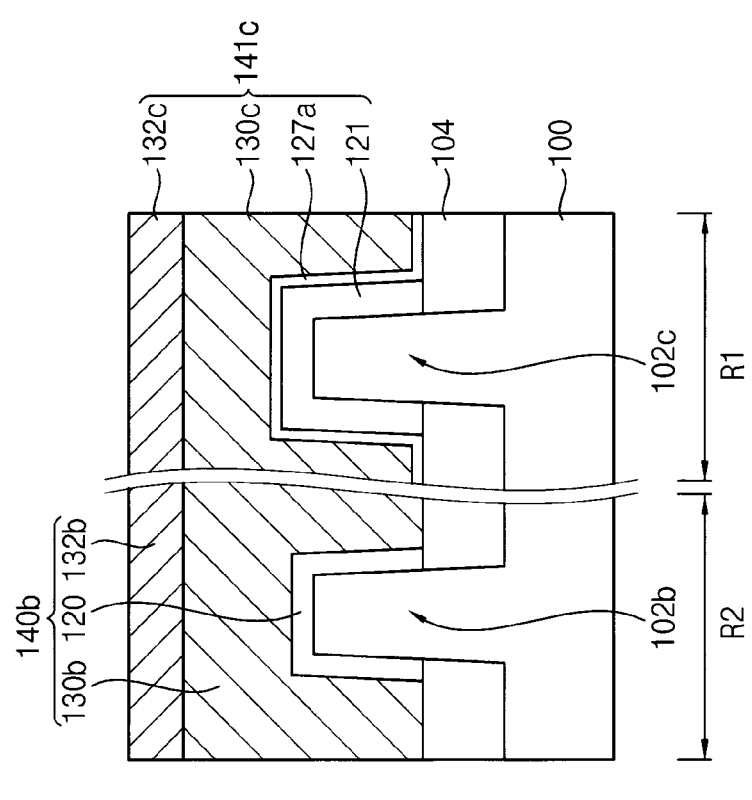
Figure 24:
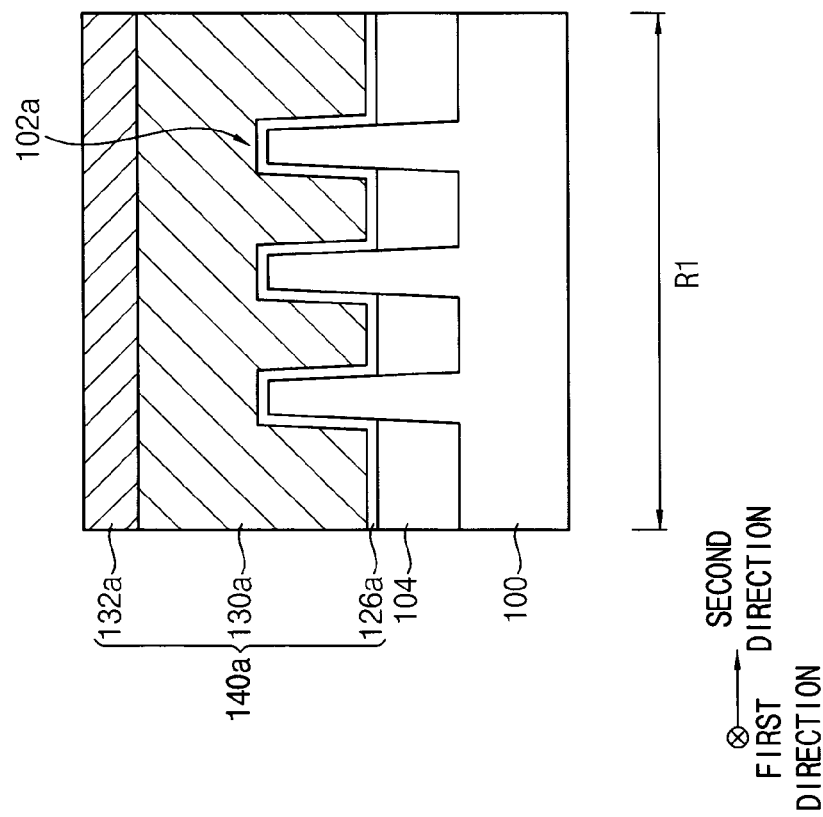

FIGS. 23 and 24 are cross-sectional views illustrating a semiconductor device in accordance with example embodiments.

The semiconductor device shown in FIGS. 23 and 24 may be substantially the same as that illustrated with reference to FIGS. 21 and 22, except for a gate insulation layer structure of a third transistor serving as an I/O device.

The first transistor may be substantially the same as that illustrated with reference to FIGS. 1 and 2. The second transistor may be substantially the same as that illustrated with reference to FIGS. 1 and 2.

Referring to FIGS. 23 and 24, the third transistor may be formed in the peripheral region. The third transistor may include an upper metal oxide layer 127a having a high dielectric constant. Thus, a region where the third transistor is formed may correspond to the first region R1. In this manner, in some embodiments, part of the first region R1 may be in the peripheral region.

In example embodiments, a third gate structure 141c of the third transistor includes a second silicon oxide layer 121, the upper metal oxide layer 127a, a third gate electrode 130c and a third capping pattern 132c sequentially stacked.

The second silicon oxide layer 121 may be formed under the third gate electrode 130c. The second silicon oxide layer 121 may not surround sidewalls of the third gate electrode 130c. The upper metal oxide layer 127a may be formed on sidewalls of the third opening and an upper surface of the second silicon oxide layer 121. The upper metal oxide layer 127a may surround sidewalls and a bottom of the third gate electrode 130c.

The second silicon oxide layer 121 may have a thickness different from a thickness of the first silicon oxide layer 120. In example embodiments, the second silicon oxide layer 121 has a thickness greater than the thickness of the first silicon oxide layer 120.

The upper metal oxide layer 127a may include a material substantially the same as a material of the metal oxide pattern 126a of the first transistor. The upper metal oxide layer 127a may have a thickness substantially the same as a thickness of the metal oxide pattern 126a of the first transistor.

Figure 26:
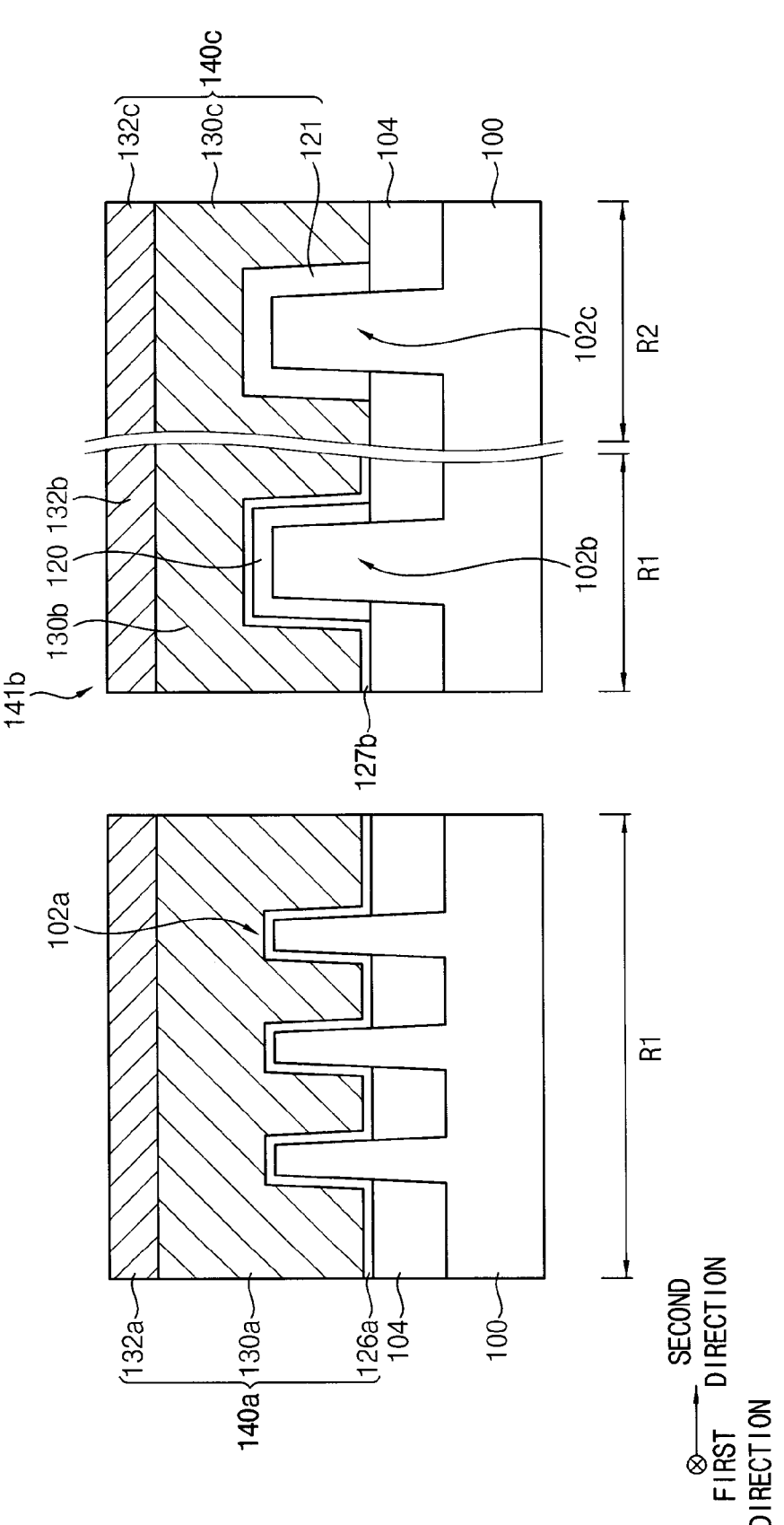

FIGS. 25 and 26 are cross-sectional views illustrating a semiconductor device in accordance with example embodiments.

The semiconductor device shown in FIGS. 25 and 26 may be substantially the same as that illustrated with reference to FIGS. 1 and 3, except for a gate insulation layer structure of a second transistor and a gate insulation layer structure of a third transistor.

The first transistor may be substantially the same as that illustrated with reference to FIGS. 1 to 3. The second and third transistors may be formed in the peripheral region.

In example embodiments, a second gate structure 141b of the second transistor may include a first silicon oxide layer 120, an upper metal oxide layer 127b, a second gate electrode 130b and a second capping pattern 132b sequentially stacked. A gate insulation layer of the second transistor may include the upper metal oxide layer 127b. Thus, a region where the second transistor is formed may correspond to the first region R1. In this manner, in some embodiments, part of the first region R1 may be in the peripheral region.

The upper metal oxide layer 127b may surround sidewalls and a bottom of the second gate electrode 130b. The first silicon oxide layer 120 may contact the upper metal oxide layer 127b under the second gate electrode 130b. The first silicon oxide layer 120 may not surround sidewalls of the second gate electrode 130b. The upper metal oxide layer 127b may include a material substantially the same as a material of the metal oxide pattern 126a in the first region Ra.

The upper metal oxide layer 127b may have a thickness substantially the same as a thickness of the metal oxide pattern 126a in the first region R1.

In example embodiments, the third gate structure 140c of the third transistor may include a second silicon oxide layer 121, a third gate electrode 130c and a third capping pattern 132c sequentially stacked. The second silicon oxide layer 121 may have a thickness different from a thickness of the first silicon oxide layer 120. In example embodiments, the second silicon oxide layer 121 may have the thickness greater than the thickness of the first silicon oxide layer 120. The gate insulation layer of the third transistor may have no metal oxide layer.

Figure 27:
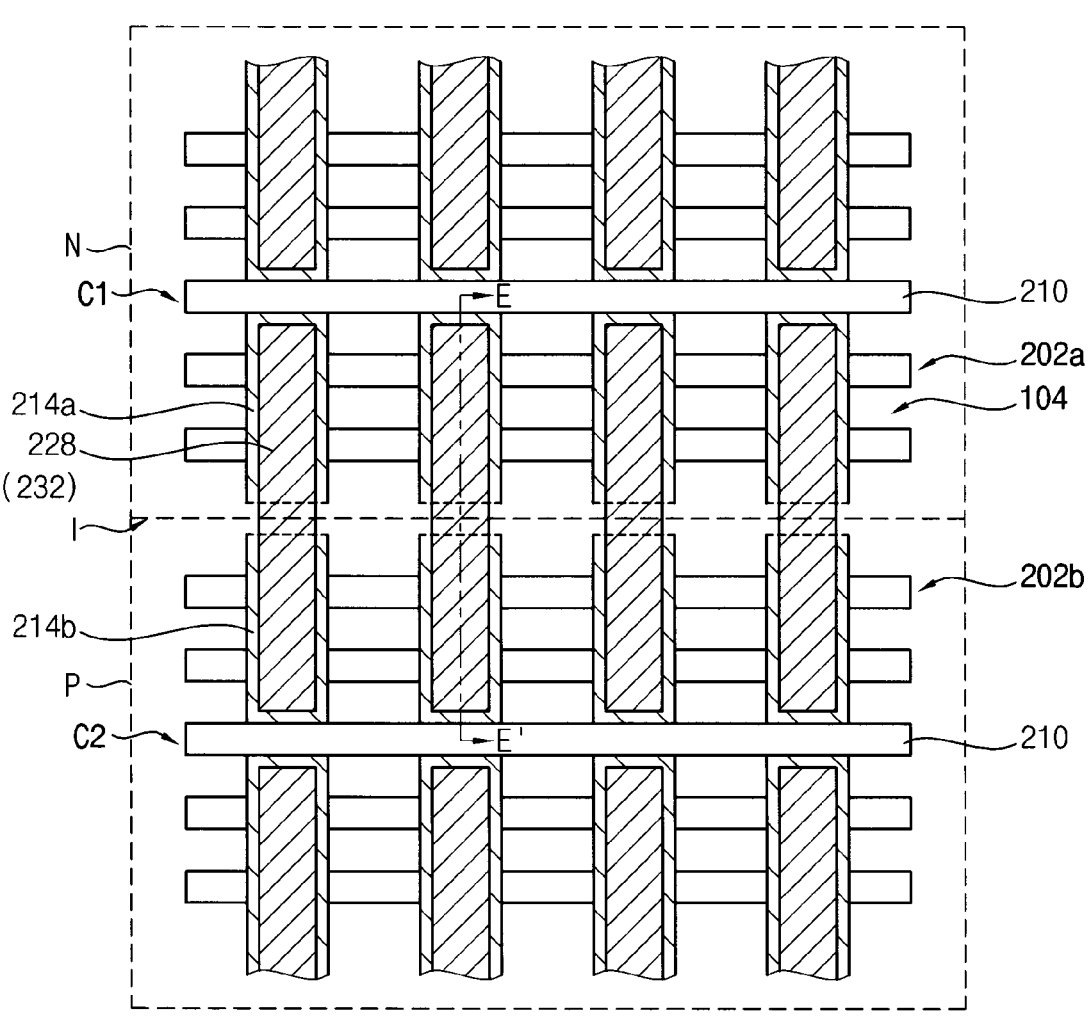
FIGS. 27 and 28 are a plan view and a cross-sectional view illustrating a semiconductor device in accordance with example embodiments.
Figure 27:
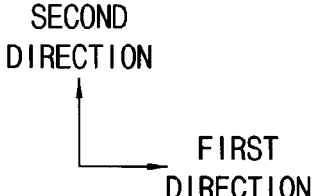
Figure 28:
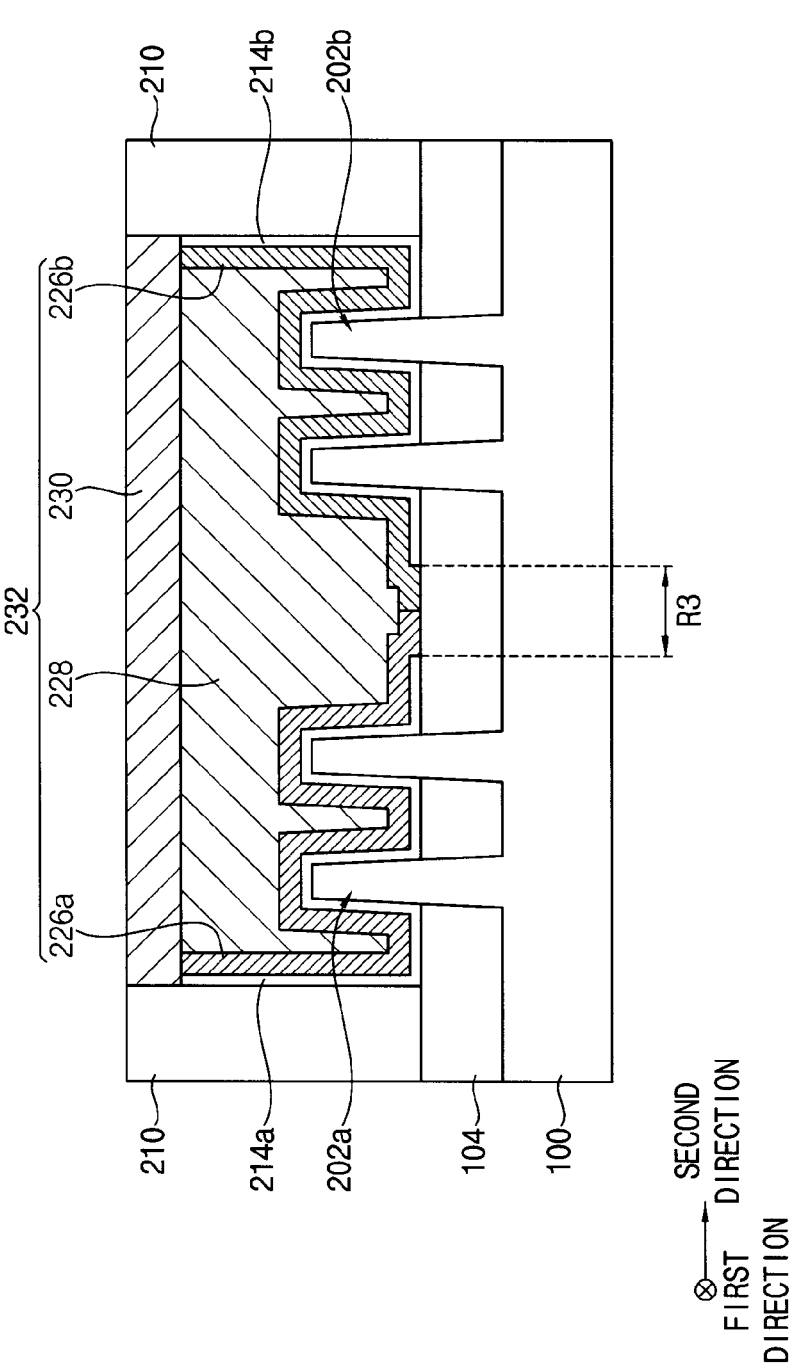

FIGS. 27 and 28 are a plan view and a cross-sectional view illustrating a semiconductor device in accordance with example embodiments.

FIGS. 27 and 28 illustrate high performance transistors formed in a logic cell region. A structure of an I/O device in a peripheral region may not be limited, so that the I/O device is not illustrated in FIGS. 27 and 28. In example embodiments, the I/O device in the peripheral region may have a structure substantially the same as a structure of the I/O device illustrated with reference to FIG. 1. In some example embodiments, the I/O device in the peripheral region may have a structure substantially the same as a structure of the third transistor illustrated with reference to FIG. 26.

FIG. 27 illustrates gate electrodes and metal oxide layers, in a plan view. FIG. 28 includes a cross-sectional view taken along line E-E' in FIG. 27.

Referring to FIGS. 27 and 28, N-type transistors and P-type transistors may be formed on the logic cell region of the substrate 100. The N-type transistors may be formed in an n-type region N, and the P-type transistors may be formed in a p-type region P.

In the plan view, the n-type region N and the p-type region P may be arranged in the second direction, and may contact each other. For example, the p-type region P may be positioned horizontally adjacent to the n-type region N. A boundary I between the n-type region N and the p-type region P may extend in the first direction. In example embodiments, the n-type region N and the p-type region P are alternatively and repeatedly arranged in the second direction.

In the n-type region N, a plurality of n-type transistors may be arranged in the second direction. In example embodiments, gate electrode structures of neighboring n-type transistors in the second direction may be spaced apart from each other. A disconnected portion of the gate electrode structures in the n-type region N may be referred as a first gate cutting region C1. The first gate cutting region C1 may extend in the first direction.

Similarly, in the p-type region, a plurality of p-type transistors may be arranged in the second direction. In example embodiments, gate electrode structures of neighboring p-type transistors in the second direction may be spaced apart from each other. A disconnected portion of the gate electrode structures in the p-type region P may be referred as a second gate cutting region C2. The second gate cutting region C2 may extend in the first direction.

A plurality of first active fins 202a and 202b extending in the first direction and a gate electrode structure extending in the second direction perpendicular to the first direction to cross the first active fins 202a and 202b may be formed on the substrate 100. A first spacer (not shown) may be formed on sidewalls of the gate electrode structure 232.

The first active fins 202a and 202b may be formed in each of the p-type region and the n-type region, and may include a first n-active fin 202a and a first p-active fin 202b. The first n-active fin 202a may be in the n-type region N, and may serve as an active region of the n-type transistor. The first p-active fin 202b may be in the p-type region P, and may serve as an active region of the p-type transistor. An isolation layer 104 may fill a gap between the first active fins 202a and 202b.

A first insulating interlayer (not shown) may be formed on the first active fins 202a and 202b and the isolation layer 104. A first opening may be formed through the first insulating interlayer, and extend in the second direction. Edge portions in the second in direction of the first opening may be positioned at the first gate cutting region C1 and the second gate cutting region C2, respectively.

An insulation pattern 210 may be formed on the isolation layer 104 corresponding to the first gate cutting region C 1 and the second gate cutting region C2. The insulation pattern 210 may extend in the first direction.

A first metal oxide layer 214a may be formed on a surface of the first n-active fin 202a, the isolation layer 104 between first n-active fins 202a and a first sidewall of the insulation pattern 210 exposed by the first opening. A second metal oxide layer 214b may be formed on a surface of the first p-active fin 202b, the isolation layer 104 between first p-active fins 202b and a second sidewall of the insulation pattern 210 exposed by the first opening. The first metal oxide layer 214a may include a material substantially the same as a material of the second metal oxide layer 214b.

In the first opening, the first and second metal oxide layers 214a and 214b may not be formed on the boundary I between the n-type region and the p-type region. For example, a portion between the n-type transistor and the p-type transistor in the second direction may serve as a metal oxide layer lacking region R3 in which the metal oxide layer is not formed. An upper surface of the isolation layer 104 may be exposed at the metal oxide layer lacking region R3.

A gate electrode structure 232 may be formed in the first opening, and may cover the first metal oxide layer 214a, the second metal oxide layer 214b and the isolation layer 104 between the first and second metal oxide layers 214a and 214b. The gate electrode structure 232 may extend in the second direction to cross the n-type region and the p-type region. The gate electrode structure 232 may serve as a common gate of the n-type transistor and the p-type transistor. That is, gates of the n-type transistor and the p-type transistor may be electrically connected to each other (e.g., directly electrically connected). In example embodiments, the gate electrode structure 232 in the n-type region may include a first metal layer 226a for controlling a threshold voltage of the n-type transistor directly contacting the first metal oxide layer 214a. The gate electrode structure 232 in the p-type region may include a second metal layer 226b for controlling a threshold voltage of the p-type transistor directly contacting the second metal oxide layer 214b. In example embodiments, the gate structure structures in the first and second region may commonly include an upper conductive pattern 228 and a capping pattern 230. Thus, as shown, a first finFET of a first group of finFETs in the n-type region may be directly adjacent to a second finFET of a second group of finFETs in the p-type region, and at a boundary region where the first finFET is directly adjacent to the second finFET, a gap in a metal oxide layer is formed (e.g., forming two separated metal oxide layers 214a and 214b).

The first metal layer 226a may include a metal having a work-function for the threshold voltage of the n-type transistor. The second metal layer 226b may include a metal having a work-function for the threshold voltage of the p-type transistor. The first metal layer 226a may include, e.g., TiAlC, TiAlCN, TiAlSiCN, etc. The second metal layer 226b may include, e.g., Ti, TiN, Ta, TaN, etc.

First impurity regions (not shown) may be formed at the first n-active fins adjacent to sidewalls of the gate electrode structure in the n-type region. The first impurity regions may serve as source/drain regions of the n-type transistor. Second impurity regions (not shown) may be formed at the first p-active fins adjacent to sidewalls of the gate electrode structure in the p-type region. The second impurity regions may serve as source/drain regions of the p-type transistor.

As described above, the gates of n-type transistor and p-type transistor may be electrically connected to each other, for example, via a direct electrical and physical connection. However, the first metal oxide layer 214a of the n-type transistor and the second metal oxide layer 214b of the p-type transistor may be physically separated from each other. Thus, failures in which the n-type transistor and the p-type transistors may not have target threshold voltages generated by a connection with the metal oxide layers may be reduced.

FIGS. 29 to 38 are plan views and cross-sectional views illustrating a method of manufacturing a semiconductor device in accordance with example embodiments.

FIGS. 30, 32, 34-36 and 38 are cross-sectional views taken along line the second direction. Hereinafter, only a device formed in a logic cell region is described. The structure of an I/O device formed in a peripheral region of a semiconductor device that includes the logic cell region is not limited to any particular structure, and may include one of the above-described embodiments for I/O devices formed in a peripheral region, or other structures.

Figure 29:
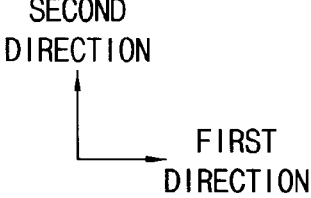
FIGS. 29 to 38 are plan views and cross-sectional views illustrating a method of manufacturing a semiconductor device in accordance with example embodiments.
Figure 30:
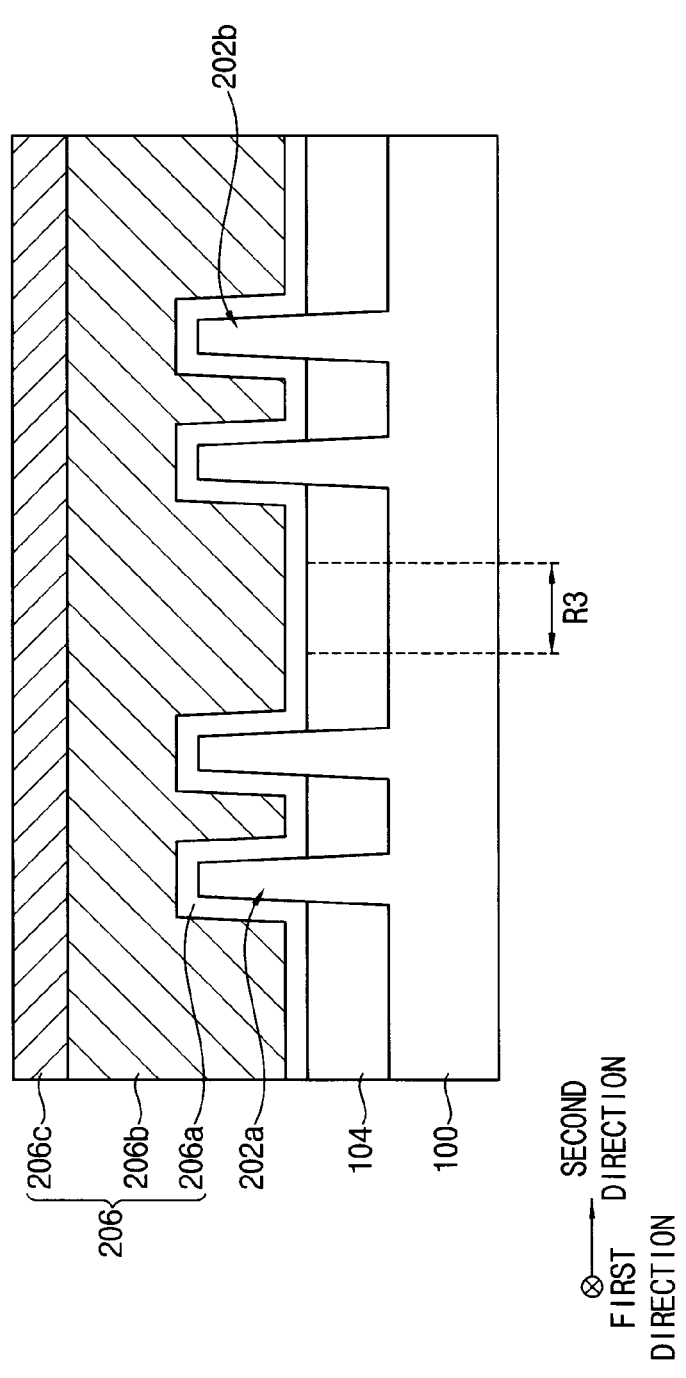

Referring to FIGS. 29 and 30, a logic cell region of a substrate 100 may include an n-type transistor region N for forming an n-type transistor and a p-type transistor P for forming a p-type transistor. A boundary I between the n-type region and the p-type region may extend in the first direction.

An upper portion of the substrate 100 may be anisotropically etched to form a first trench at the n-type region and the p-type region. An isolation layer 104 may fill a lower portion of the first trench. Thus, first active fins 202*a* and 202*b* protruding from the substrate 100 may be formed. The first active fin in the n-type region may be referred to as a first n-active fin 202*a*, and the first active fin in the p-type region may be referred to as a first p-active fin 202*b*.

A first preliminary dummy gate structure 206 including a first preliminary dummy gate insulation layer 206*a*, a first preliminary dummy gate electrode 206*b* and a first preliminary mask 206*c* stacked may be formed on the first active fins 202*a* and 202*b* and the isolation layer 104. A first spacer (not shown) may be formed on sidewalls of the first preliminary dummy gate structure 206.

The first preliminary dummy gate structure 206 may extend in the second direction to cross a plurality of first active fins 202*a* and 202*b*. The first preliminary dummy gate structure 206 may be formed to cross the n-type region N and the p-type region P.

Figure 31:
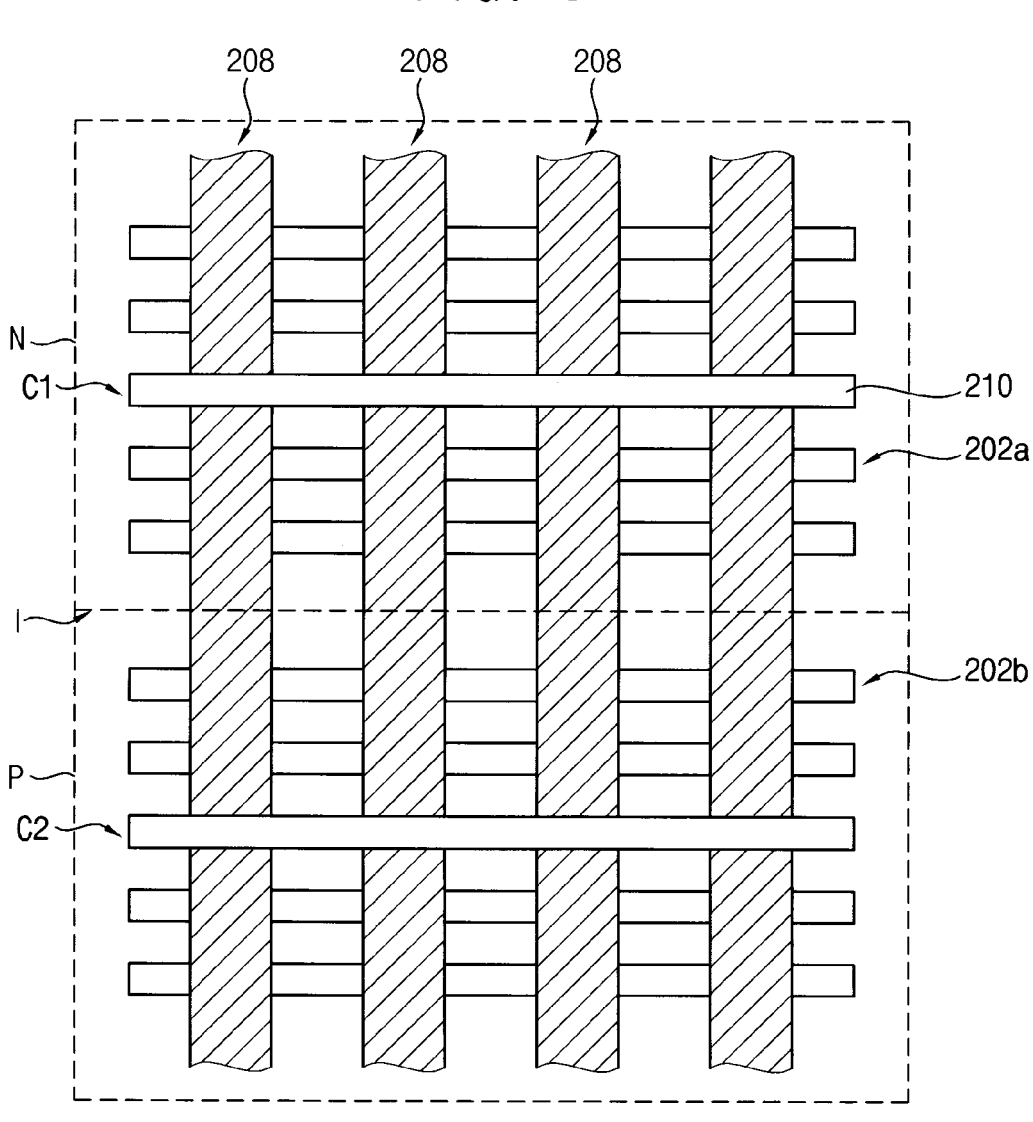
Figure 32:
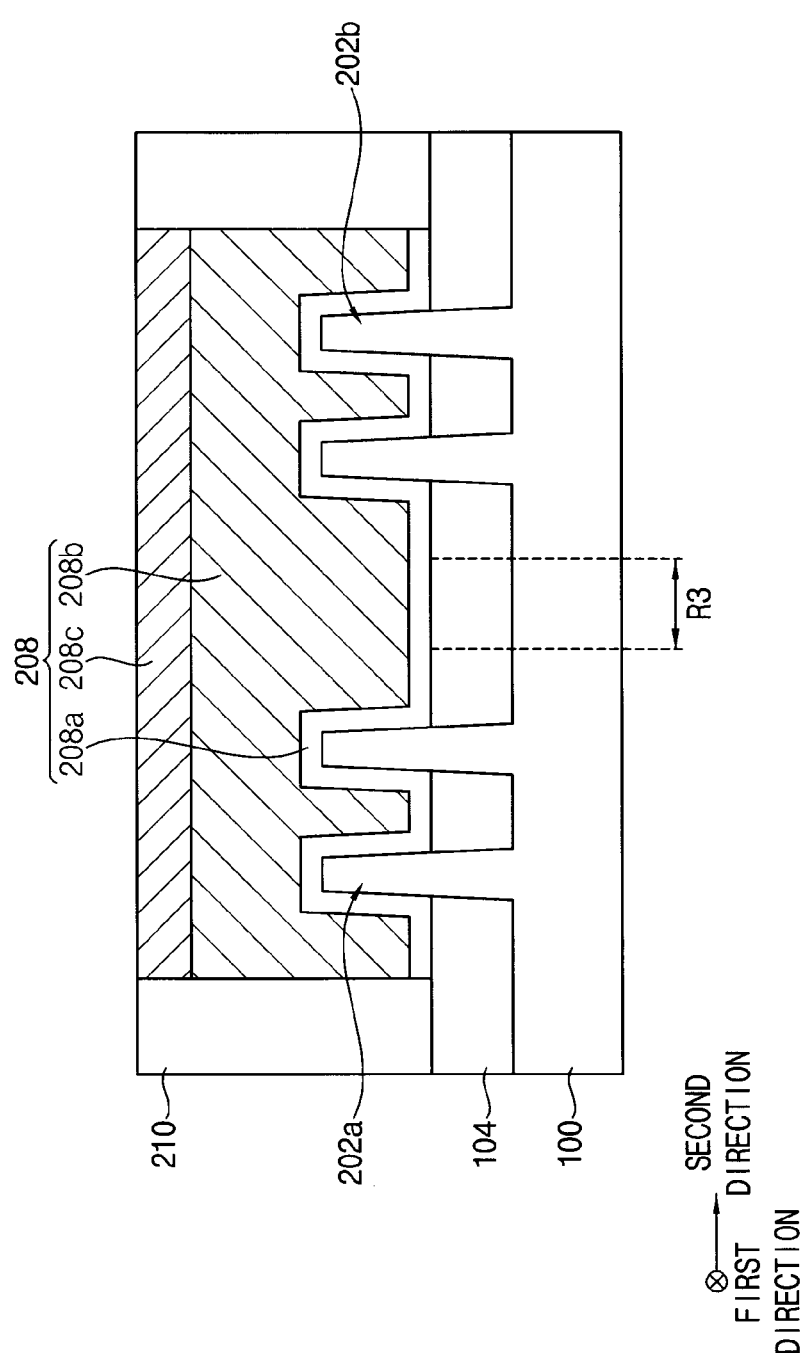

Referring to FIGS. 31 and 32, the first preliminary dummy gate structure 206 formed at a first gate cutting region C1 and a second gate cutting region C2 may be etched to form a plurality of first dummy gate structures 208. A cutting portion of the first preliminary dummy gate structures 206 may have a trench shape extending in the first direction. The first dummy gate structure 208 may include a first dummy gate insulation layer 208*a*, a first dummy gate electrode 208*b* and a first mask 208*c* stacked.

A preliminary first insulating interlayer may sufficiently fill the trench and a gap between the first dummy gate structures 208 in the first direction. An upper surface of the preliminary first insulating interlayer may be planarized until an upper surface of the first dummy gate structure 208 is exposed to form a first insulating interlayer (not shown) and an insulation pattern 210. The first insulating interlayer may be formed between the first dummy gate structures 208. The insulation pattern 210 may be formed in the trench.

The insulation pattern 210 may be formed on the isolation layer 104 of the first gate cutting region C1 and the second gate cutting region C2. The insulation pattern 210 may extend in the first direction.

Figure 33:
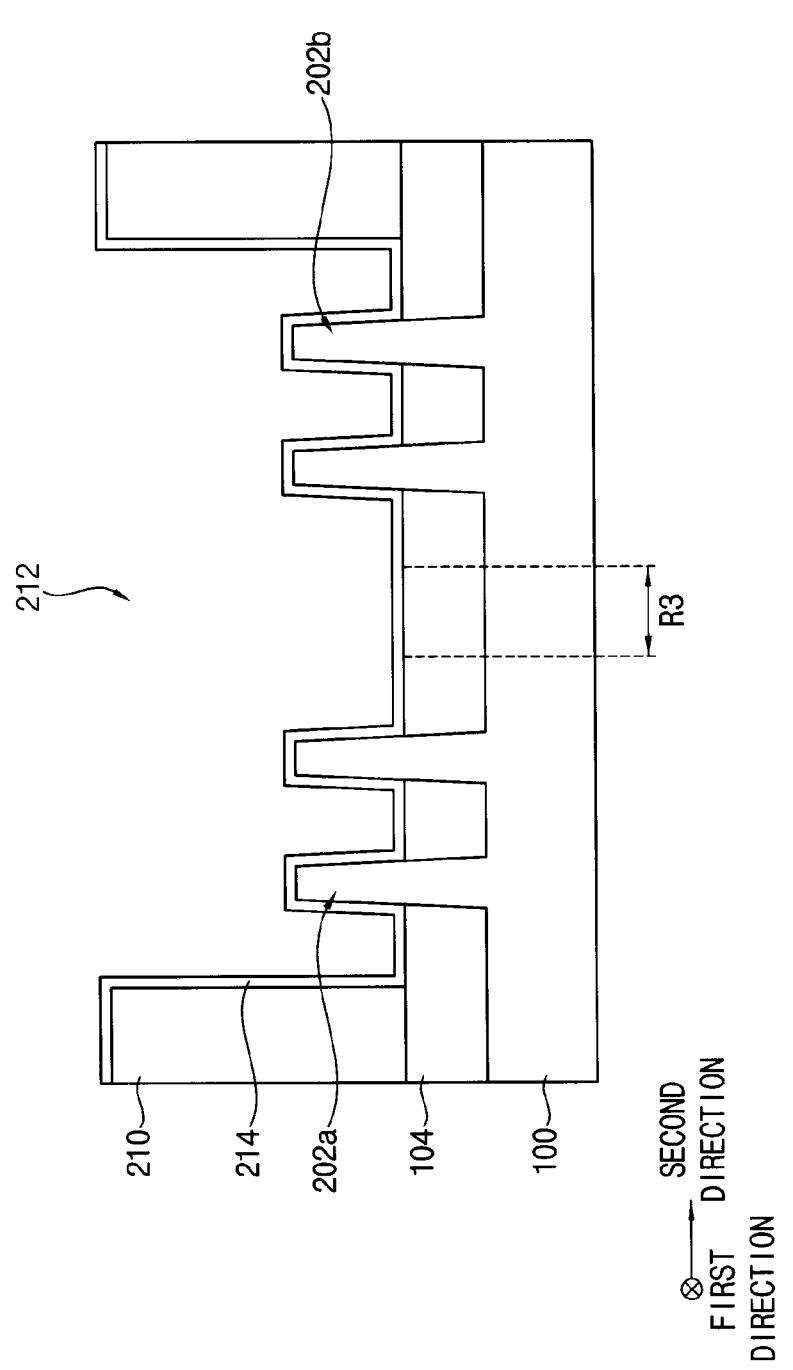

Referring to FIG. 33, the first dummy gate structure 208 may be etched to form a first opening 212. The first p-active fin 202*b*, the first n-active fin 202*a* and the isolation layer 104 may be exposed by the first opening 212.

Surfaces of the first p-active fin 202*b* and the first n-active fin 202*a* exposed by the first opening 212 may be oxidized to form a pad oxide layer (not shown). A metal oxide layer 214 having a high dielectric constant may be conformally formed on the first insulating interlayer, the insulation pattern 210 and the pad oxide layer. The metal oxide layer 214 may be formed on entire surfaces of exposed layers.

Figure 34:
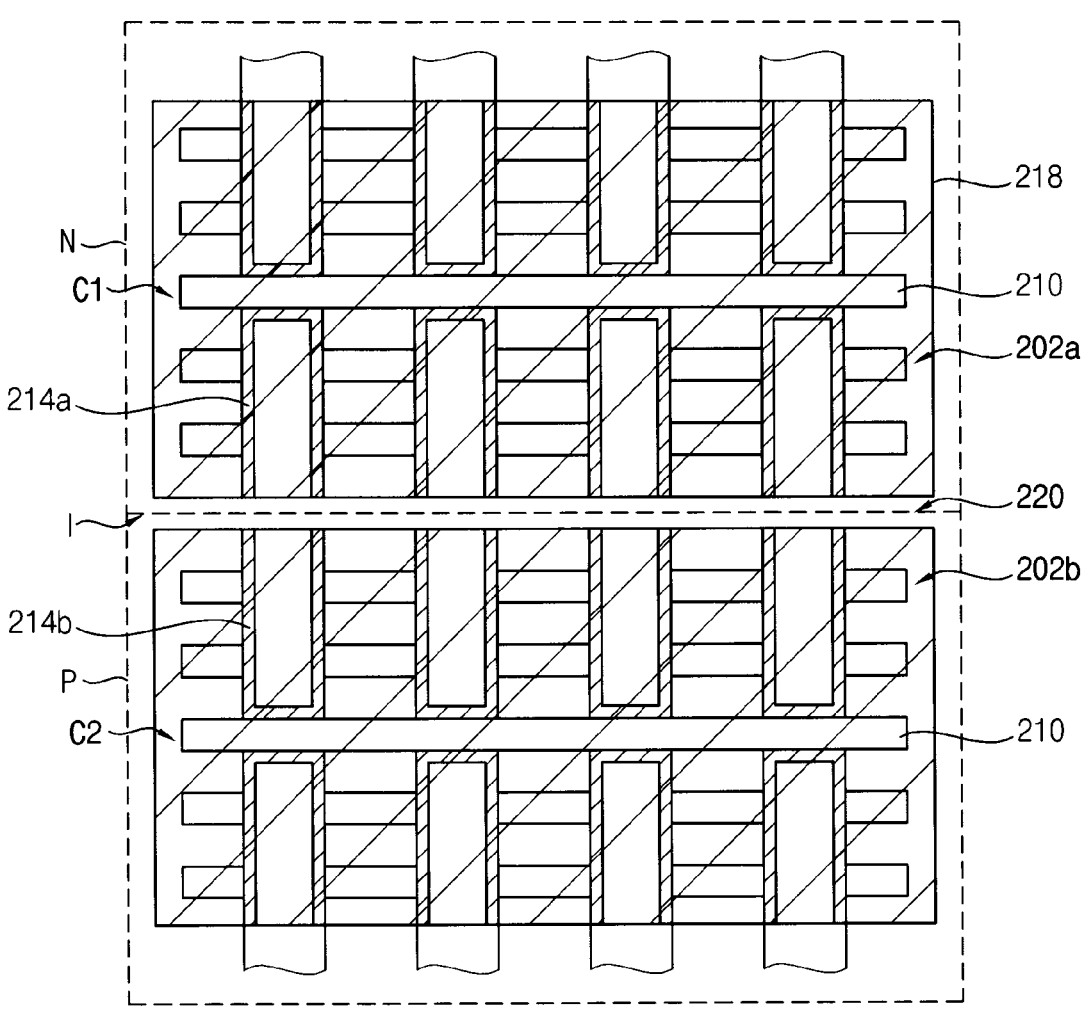
Figure 34:
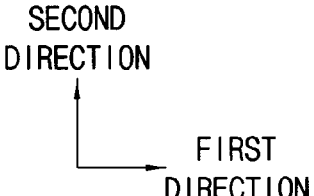
Figure 35:
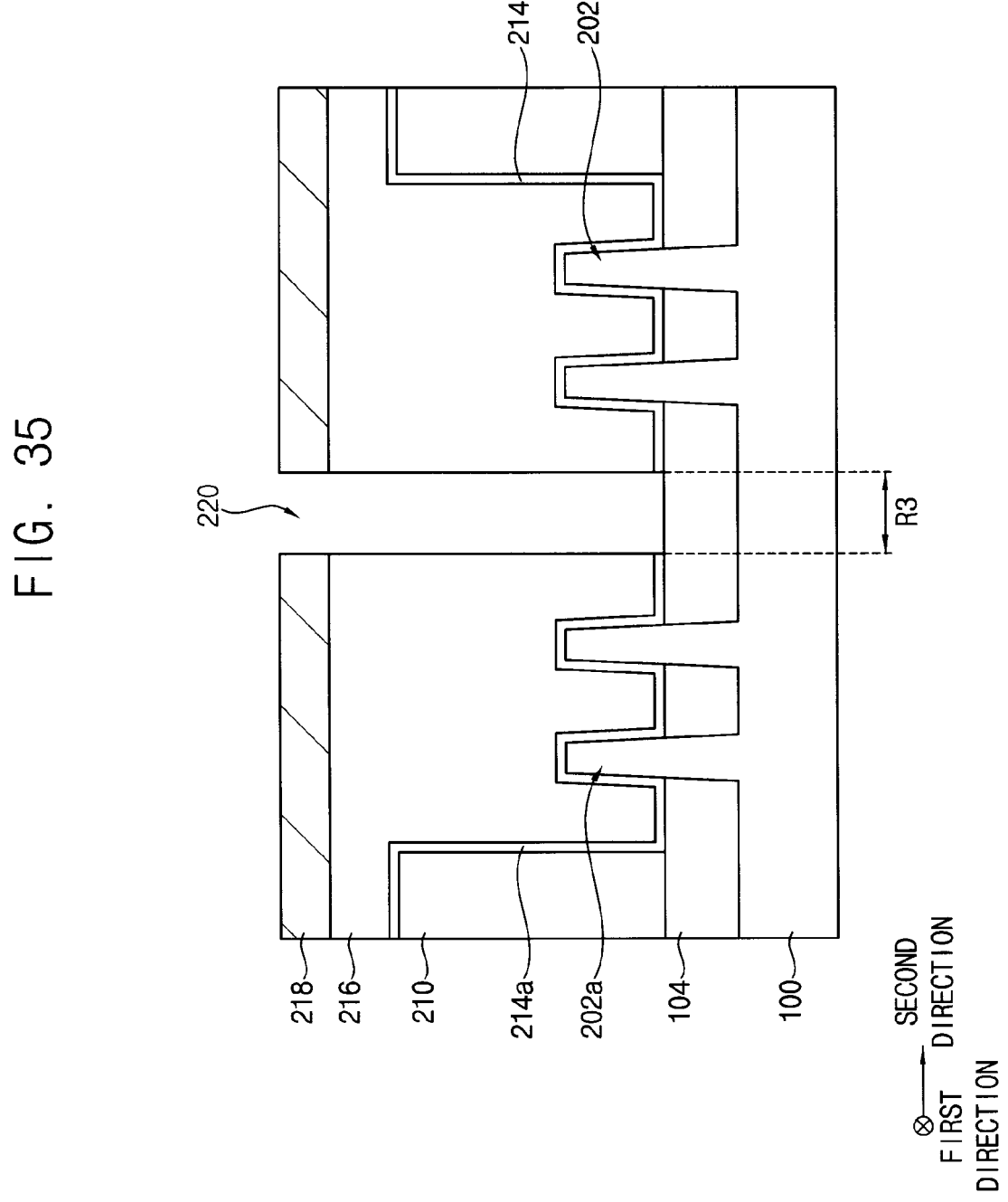

Referring to FIGS. 34 and 35, a first sacrificial layer 216 may be formed on the metal oxide layer 214 to sufficiently fill the first opening 212. The first sacrificial layer 216 may cover upper surfaces of the insulation pattern 210 and the first insulating interlayer. In example embodiments, the first sacrificial layer 216 may include a bottom anti-reflect coating (BARC) layer.

In some example embodiments, before forming the first sacrificial layer 216, a metal layer for controlling a threshold voltage may be formed on the metal oxide layer 214.

A hard mask 218 may be formed on the first sacrificial layer 216. The hard mask 218 may expose a portion of the first sacrificial layer 216 formed on the boundary I between the n-type region and the p-type region. An exposure portion of the hard mask 218 may extend in the first direction.

The first sacrificial layer 216 and the metal oxide layer 214 may be sequentially etched using the hard mask 218 as an etching mask to form a trench 220. The metal oxide layer 214 may be separated by removing a portion of the metal oxide layer 214 during the etching process to form a first metal oxide layer 214*a* on the n-type region and a second metal oxide layer 214*b* on the p-type region. A metal oxide layer lacking region R3 is formed between the first metal oxide layer 214*a* and the second metal oxide layer 214*b*. The first metal oxide layer 214*a* may be formed on the insulation pattern 210, the surfaces of the first n-active fins 202*a* and the isolation layer 104 between the first n-active fins 202*a*. The second metal oxide layer 214*b* may be formed on the insulation pattern 210, the surfaces of the first p-active fins 202*b* and the isolation layer 104 between the first p-active fins 202*b*.

The trench may be formed along the boundary I. The metal oxide layer 214 may be removed by the etching process so that the isolation layer 104 may be exposed by the trench. Thus, the metal oxide layer lacking region R3 may be formed.

In example embodiments, when the metal layer for controlling a threshold voltage is formed on the metal oxide layer 214 in a previous process, the metal layer for controlling a threshold voltage and the metal oxide layer 214 may be etched together in the etching process. In this case, the metal layer for controlling a threshold voltage may cut at the boundary I.

Figure 36:
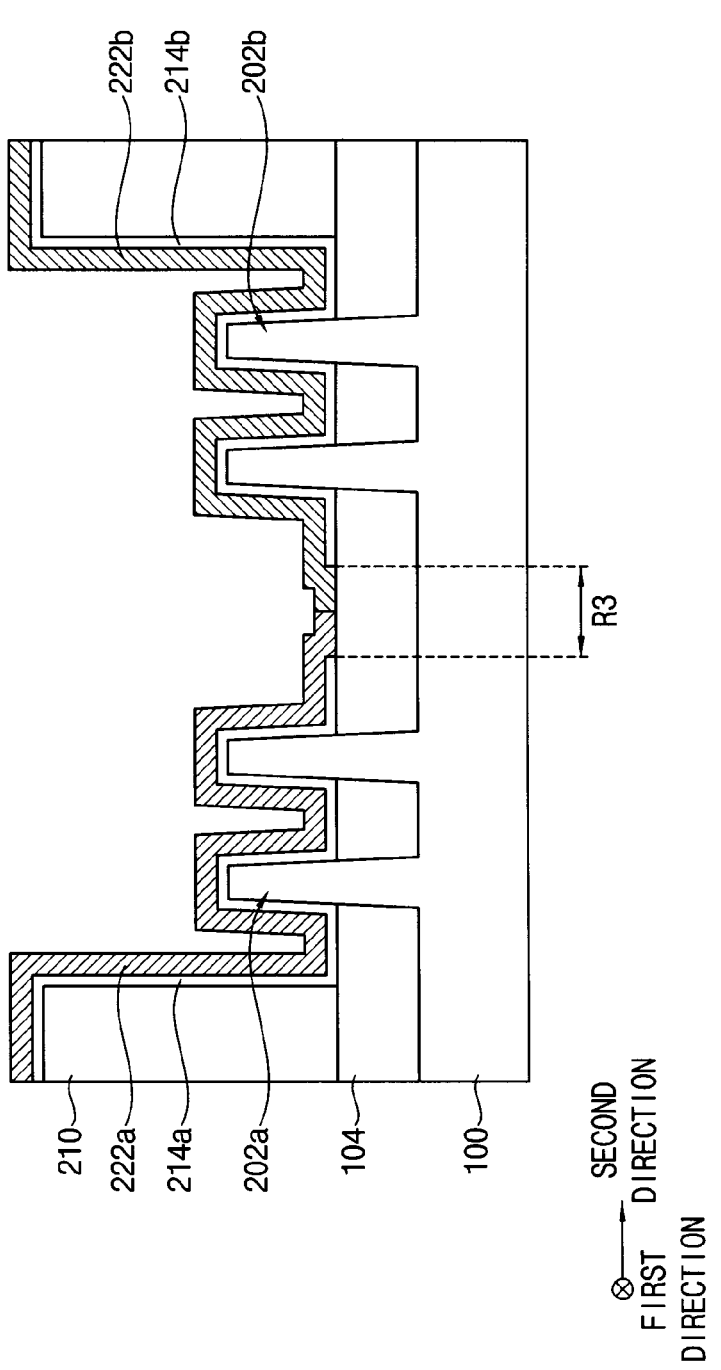

Referring to FIG. 36, the hard mask 218 is removed. The first sacrificial layer 216 is removed. Thus, upper surfaces of the first metal oxide layer 214*a* and the second metal oxide layer 214*b* may be exposed.

The metal layer for controlling a threshold voltage 222*a* and 222*b* is conformally formed on the first metal oxide layer 214*a*, the second metal oxide layer 214*b* and the isolation layer 104 between the first and second metal oxide layers 214*a* and 214*b*. In this case, the metal layer for controlling a threshold voltage 222*a* and 222*b* may be connected at the boundary I. For example, the metal layer for controlling a threshold voltage of the n-type transistor 222*a* may be formed on the first metal oxide layer 214*a*. The metal layer for controlling a threshold voltage of the p-type transistor 222*b* may be formed on the second metal oxide layer 214*b*.

Figure 37:
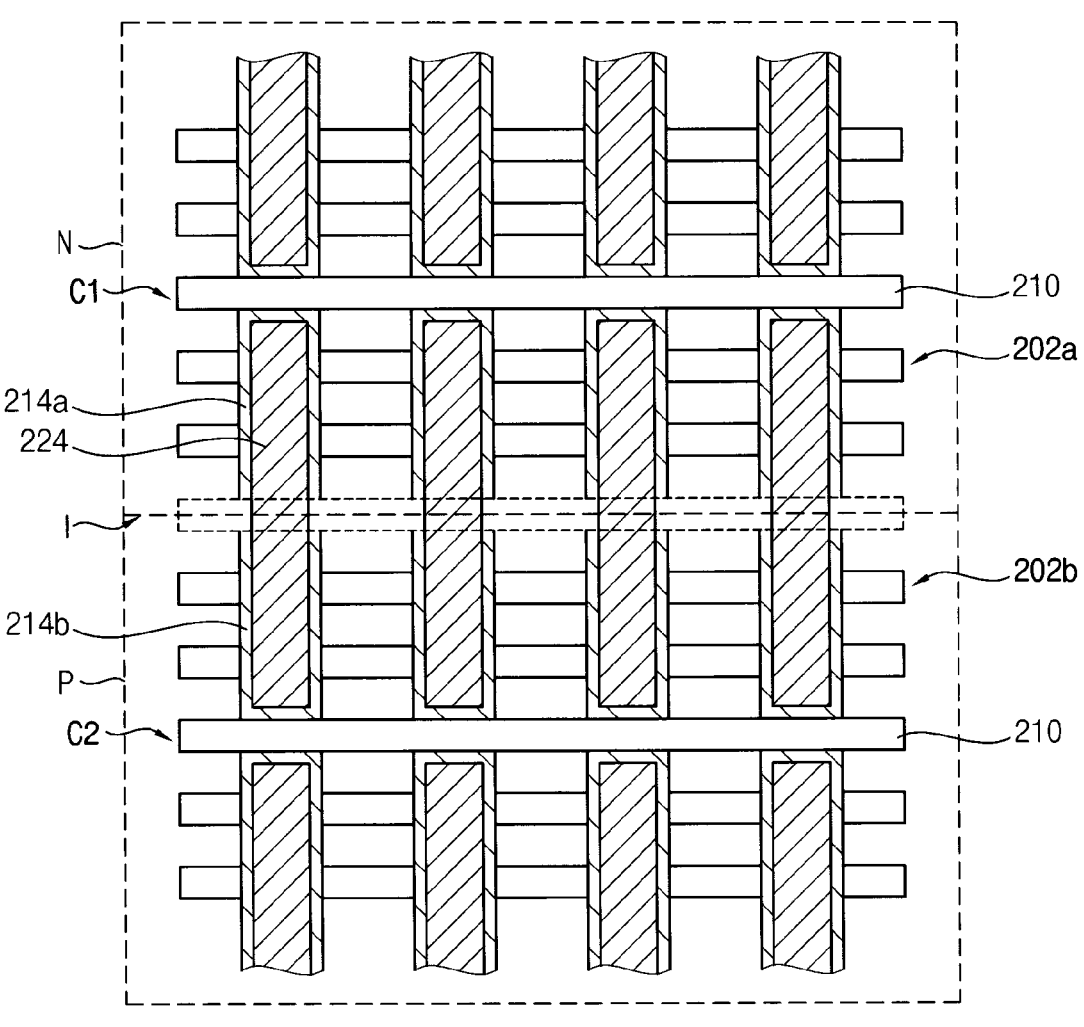
Figure 37:
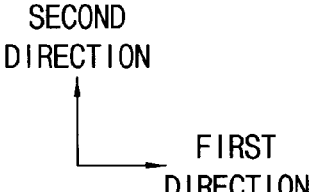
Figure 38:
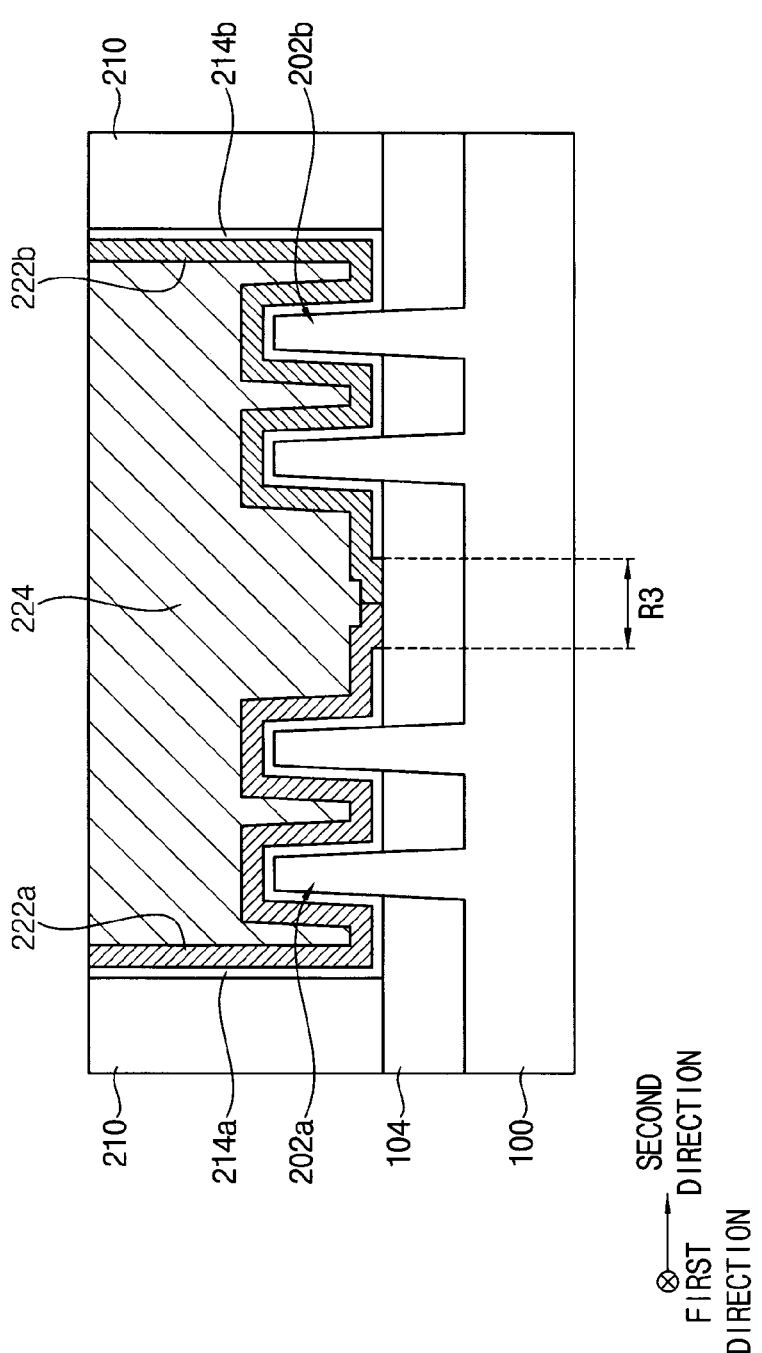

Referring to FIGS. 37 and 38, a metal layer may be formed on the metal layer for controlling a threshold voltage 222*a* and 222*b* to fill the first opening. The metal layer may be planarized until the upper surfaces of the first insulating interlayer and the insulation pattern 210 may be exposed to form a preliminary conductive pattern 224 in the first opening.

Referring to FIGS. 27 and 28 again, the preliminary conductive pattern 224 may be partially etched to form an upper conductive pattern 228.

A capping layer may be formed on the upper conductive pattern 228, the first insulating interlayer and the insulation pattern 210 to fill the first opening. The capping layer may be planarized until the upper surfaces of the first insulating interlayer and the insulation pattern 210 to form a capping pattern 230 on the upper conductive pattern 228.

Thus, a gate electrode structure 232 may be formed on the first metal oxide layer 214a, the second metal oxide layer 214b and the isolation layer 104 between the first and second metal oxide layers 214a and 214b. The gate electrode structure 232 may fill the first opening. In the n-type region N, the gate electrode structure 232 may include the metal layer for controlling a threshold voltage of the n-type transistor 226a, the upper electrode pattern 228 and the capping pattern 230. In the P-type region P, the gate electrode structure 232 may include the metal layer for controlling a threshold voltage of the p-type transistor 226b, the upper electrode pattern 228 and the capping pattern 230.

Figure 39:
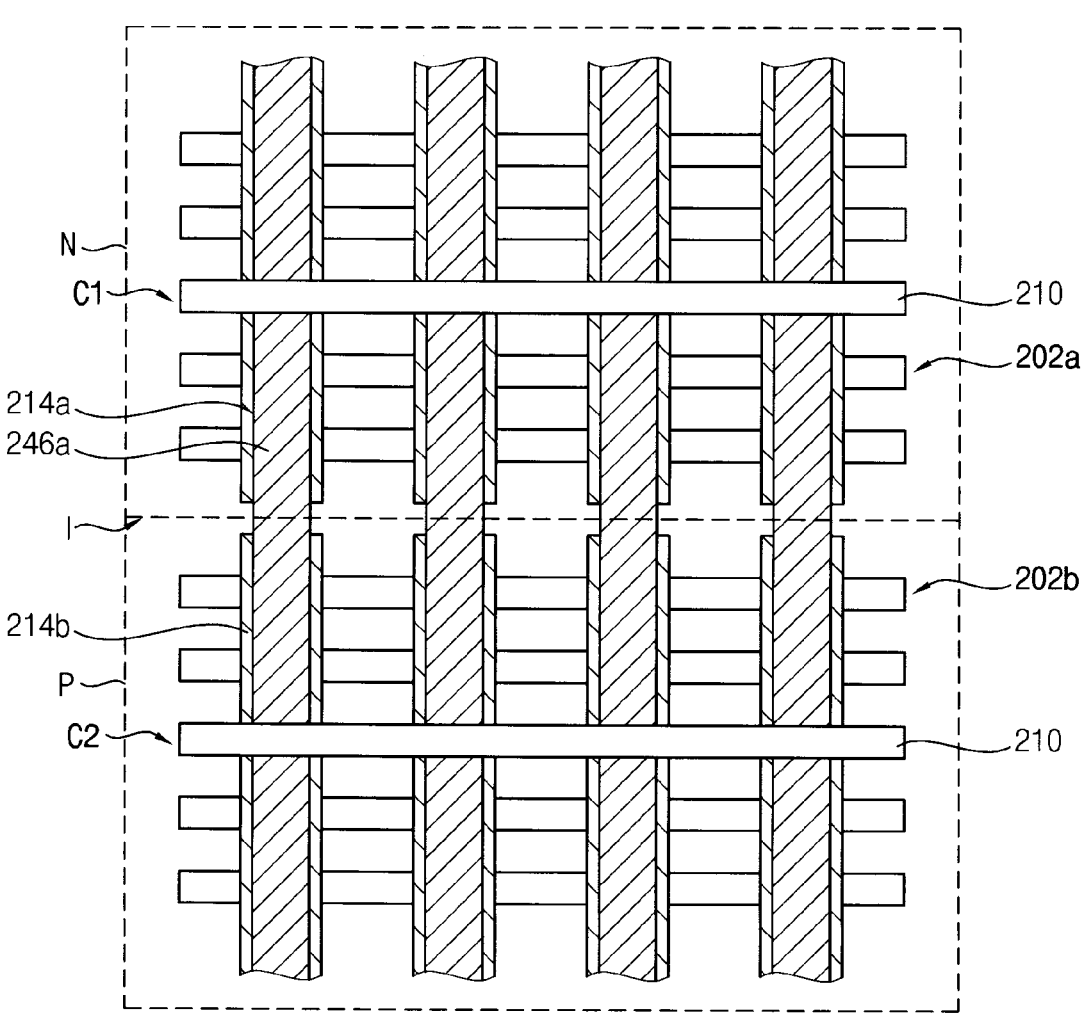
FIGS. 39 and 40 are a plan view and a cross-sectional view illustrating a semiconductor device in accordance with example embodiments.
Figure 39:
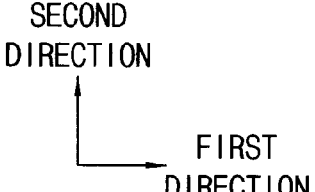
Figure 40:
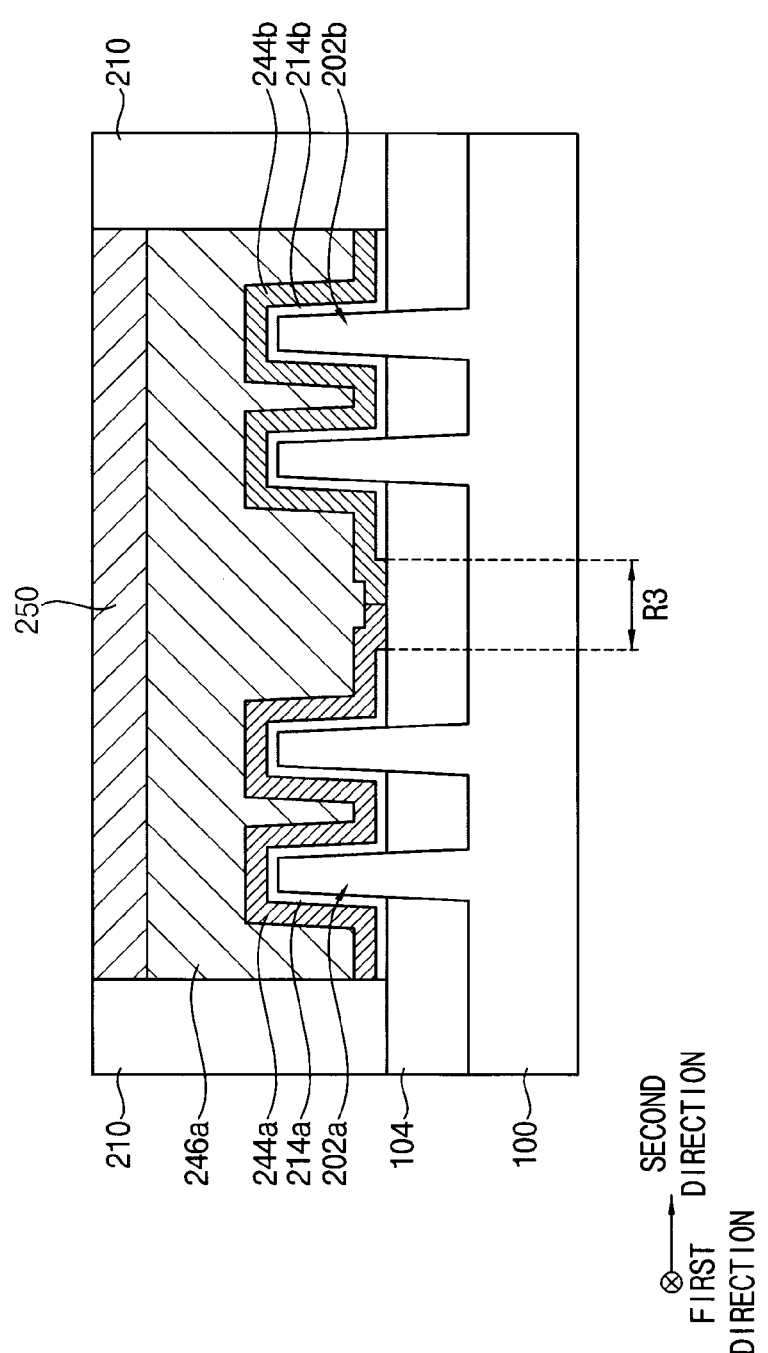

FIGS. 39 and 40 are a plan view and a cross-sectional view illustrating a semiconductor device in accordance with example embodiments.

The semiconductor device may be substantially the same as the semiconductor illustrated with reference to FIGS. 27 and 28, except for shapes of first and second metal oxide layers. For example, the n-type region and the p-type region of the substrate, first active fins, insulation pattern and the gate electrode structure may be substantially the same as those illustrated with reference to FIGS. 27 and 28, respectively.

Referring to FIGS. 39 and 40, the first opening may extend through the first insulating interlayer. The first opening may extend in the second direction. The insulation pattern 210 may be formed on the insulation pattern 210 of the first gate cutting region C1 and the second gate cutting region C2.

A first metal oxide layer 214a may be formed on the first n-active fins 202a and the isolation layer 104 between the first n-active fins 202a exposed by the first opening, A second metal oxide layer 214b may be formed on the first p-active fins 202b and the isolation layer 104 between the first p-active fins 202b exposed by the second opening. The first metal oxide layer 214a may have a material the same as a material of the second metal oxide layer 214b.

In the embodiment of FIGS. 39-40, the first and second metal oxide layers 214a and 214b is not formed on the sidewalls of the insulation pattern 210.

The gates of n-type transistor and p-type transistor may be electrically connected to each other. However, the first metal oxide layer 214a of the n-type transistor and the second metal oxide layer 214b of the p-type transistor may be physically separated from each other.

Figure 41:
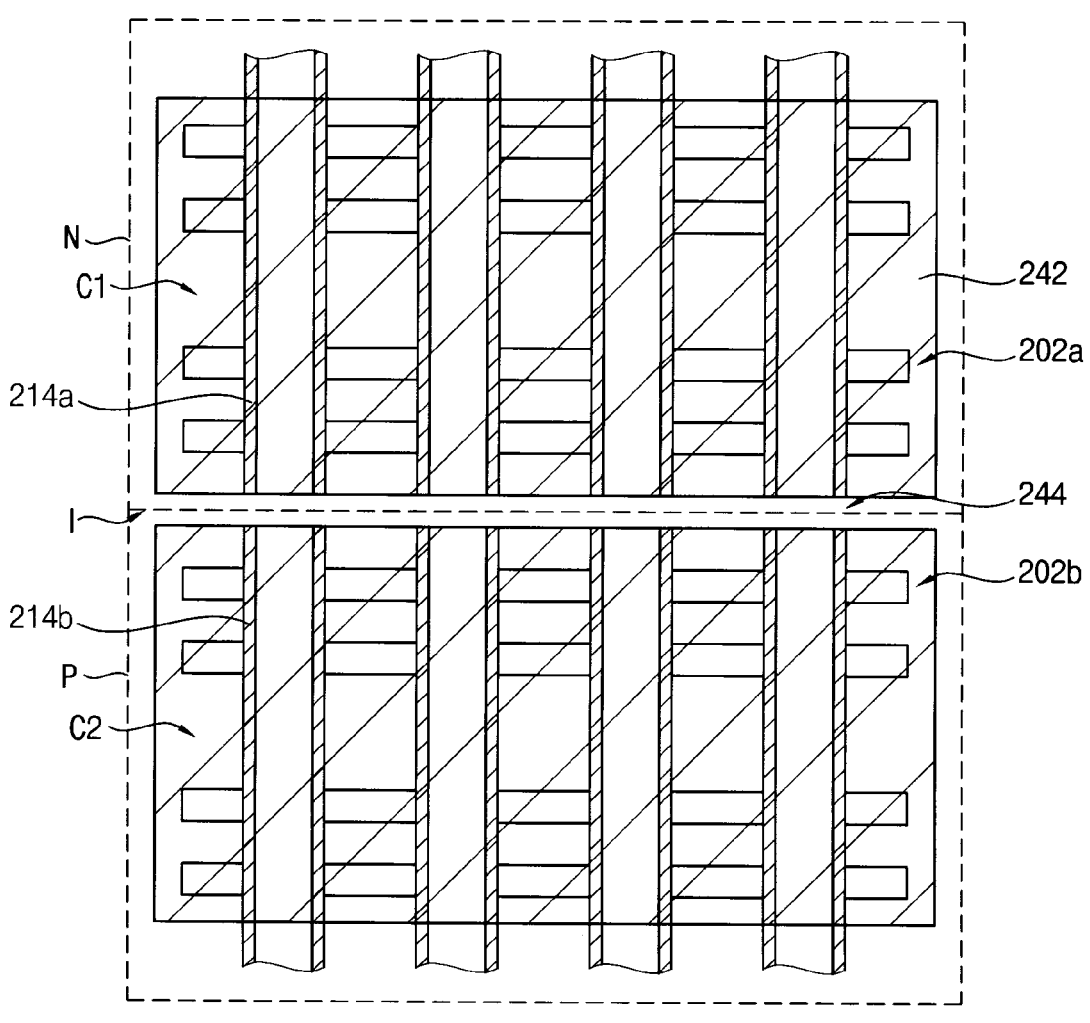
Figure 41:
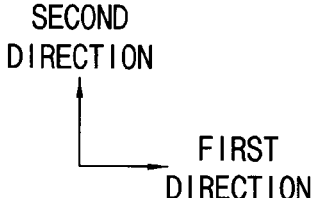
Figure 44:
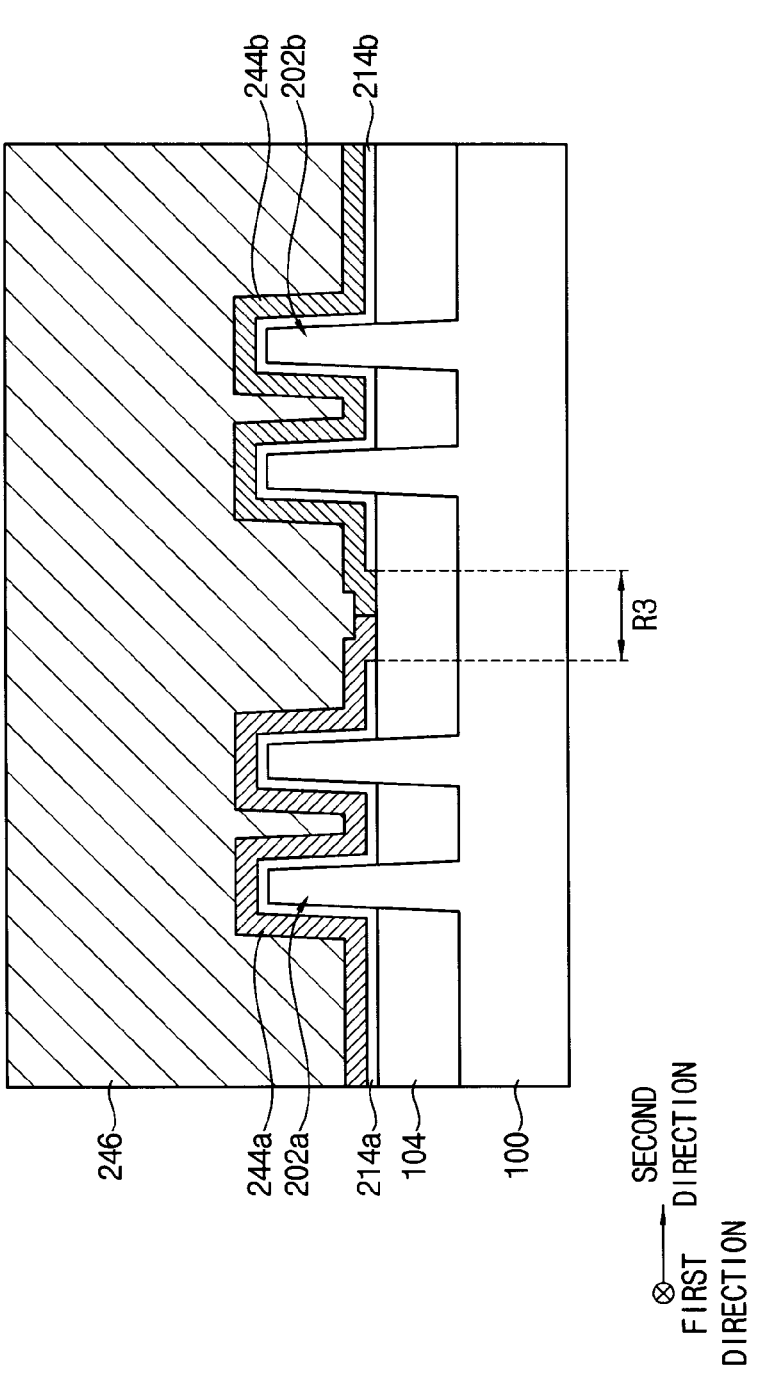

FIGS. 41 and 44 are plan views and cross-sectional views illustrating a method of manufacturing a semiconductor device in accordance with example embodiments.

First, processes illustrated with reference to FIGS. 29 and 30 may be performed to form the first preliminary dummy gate structure 206 on the first active fins 202a and 202b and the isolation layer 104. The first spacer (not shown) may be formed on the sidewalls of the first preliminary dummy gate structure 206.

The first insulating interlayer (not shown) may be formed between the first preliminary dummy gate structures 206.

In example embodiments, cutting of the first preliminary dummy gate structure 206 at the first gate cutting region C1 and the second gate cutting region C2 to form a trench and forming a insulation pattern in the trench are not performed, in this step.

The first preliminary dummy gate structure 206 may be removed to form the first opening. The first p-active fin 202b, the first n-active fin 202a and the isolation layer 104 may be exposed by the first opening.

Figure 42:
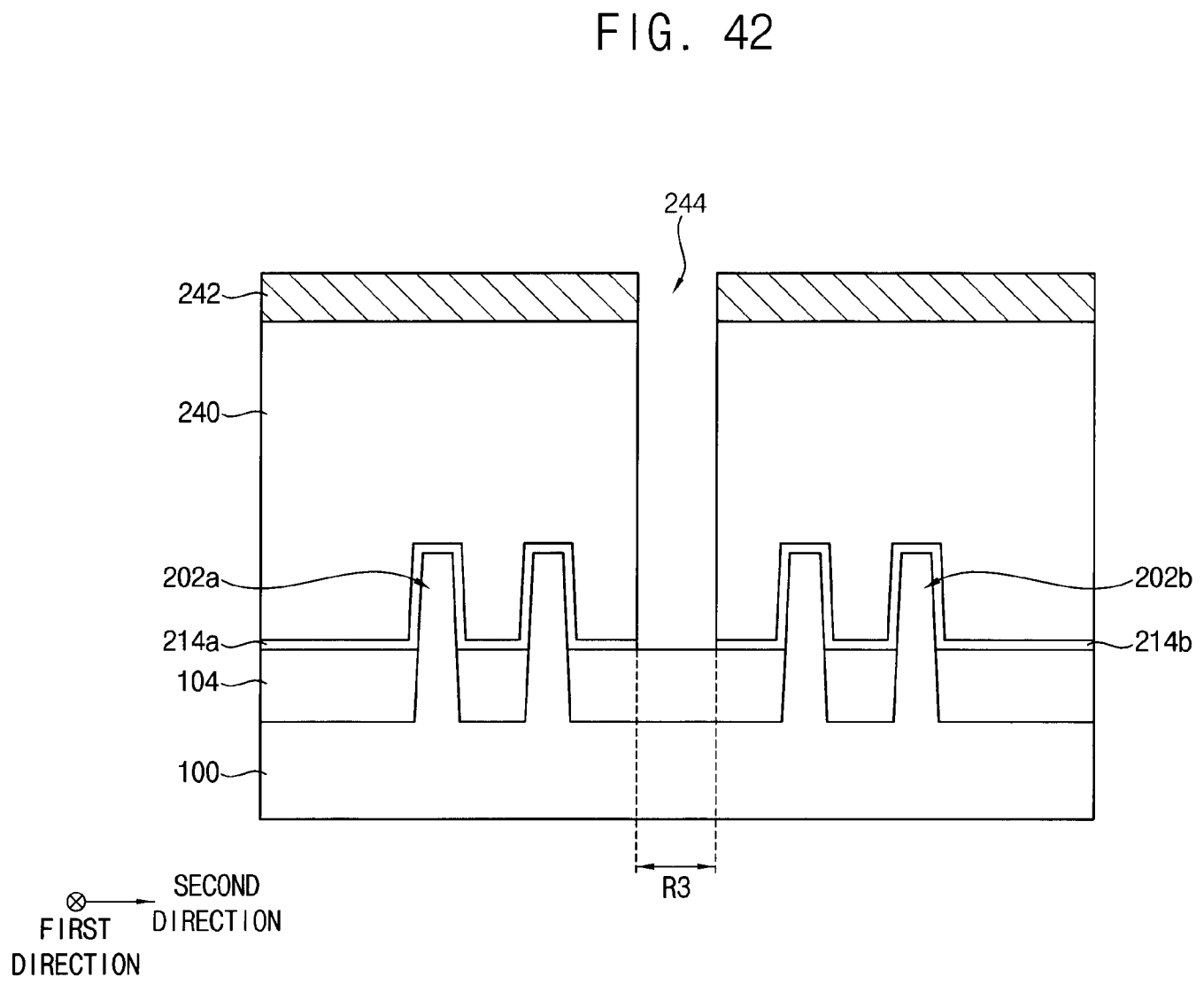

Referring to FIGS. 41 and 42, surfaces of the first p-active fin and the first n-active fin exposed by the first opening may be oxidized to form a pad oxide layer (not shown).

The metal oxide layer having a high dielectric constant may be formed on the first insulating interlayer and the pad oxide layer. The metal oxide layer may be formed on entire surfaces of exposed layers.

The first sacrificial layer 240 may be formed on the metal oxide layer to sufficiently fill the first opening. The first sacrificial layer 240 may cover the upper surface of the first insulating interlayer. In example embodiments, the first sacrificial layer 240 may include a BARC.

In some example embodiments, before forming the first sacrificial layer 240, the metal layer for controlling a threshold voltage may be conformally formed on the metal oxide layer.

The hard mask 242 may be formed on the first sacrificial layer 240. The hard mask 242 may expose a portion of the first sacrificial layer 242 on the boundary I between the n-type region and the p-type region. An exposure portion of the hard mask 242 may extend in the first direction.

The first sacrificial layer 240 and the metal oxide layer may be sequentially etched using the hard mask 242 as an etching mask to form the trench 244. The metal oxide layer may be separated by the etching process to form the first metal oxide layer 214a on the n-type region and the second metal oxide layer 214b on the p-type region. The first metal oxide layer 214a may be formed on the surfaces of the first n-active fins 202a and the isolation layer 104 between the first n-active fins 202a. The second metal oxide layer 214b may be formed on the surfaces of the first p-active fins 202b and the isolation layer 104 between the first p-active fins 202b.

Figure 43:
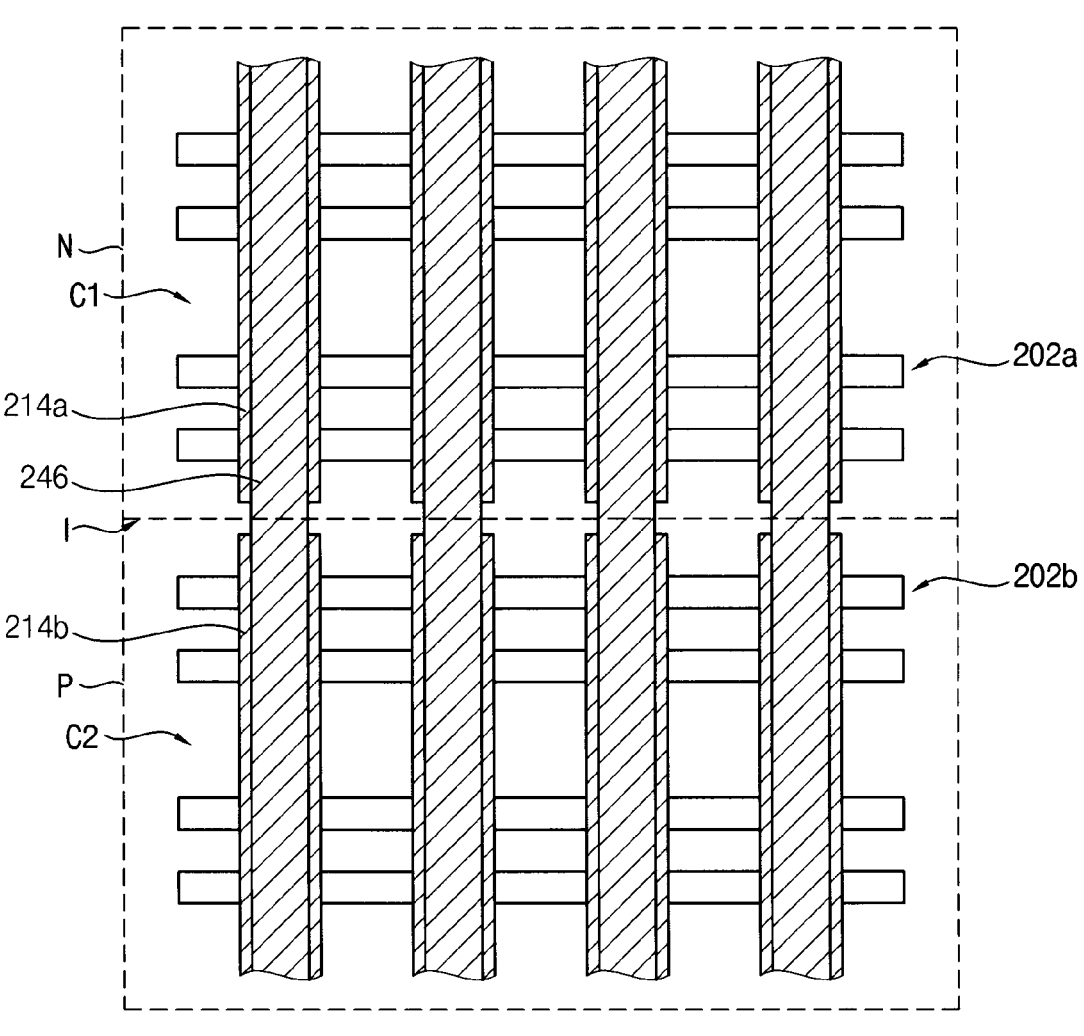
Figure 43:
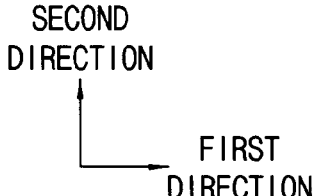

Referring to FIGS. 43 and 44, the hard mask 242 may be removed. The first sacrificial layer 240 may be removed. Thus, upper surfaces of the first metal oxide layer 214a and the second metal oxide layer 214b may be exposed.

The metal layer for controlling a threshold voltage 244a and 244b may be conformally formed on the first metal oxide layer 214a, the second metal oxide layer 214b and the isolation layer 104 between the first and second metal oxide layers 214a and 214b. In this case, the metal layer for controlling a threshold voltage 244a and 244b may be connected at the boundary. For example, the metal layer for controlling a threshold voltage of the n-type transistor 244a may be formed on the first metal oxide layer 214a. The metal layer for controlling a threshold voltage of the p-type transistor 244b may be formed on the second metal oxide layer 214b.

The metal layer may be formed on the metal layer for controlling a threshold voltage 244a and 244b to fill the first opening. The metal layer may be planarized until the upper surfaces of the first insulating interlayer may be exposed to form the preliminary conductive pattern 246 in the first opening.

Referring to FIGS. 39 and 40 again, an upper portion of the preliminary conductive pattern 246 may be partially etched to form the upper conductive pattern 246*a*. The capping pattern 250 may be formed on the upper conductive pattern 246*a*.

The capping pattern 250, the upper conductive pattern 246*a*, and the first insulating interlayer formed at a first gate cutting region and a second gate cutting region may be etched to form the gate electrode structure. In the etching process, the first and second metal oxide layers 214*a* and 214*b* formed at the first gate cutting region C1 and the second gate cutting region C2 may be removed.

An insulation layer may be formed to fill the trench formed by the etching process. The insulation layer may be planarized until the upper surface of the capping pattern 250 may be exposed to form the insulation pattern 210.

As described above, after forming of the first and second metal oxide layers 214*a* and 214*b*, the insulation pattern 210 may be formed. Thus, the first and second metal oxide layers 214*a* and 214*b* may not be formed on the sidewalls of the insulation pattern 210.

Figure 45:
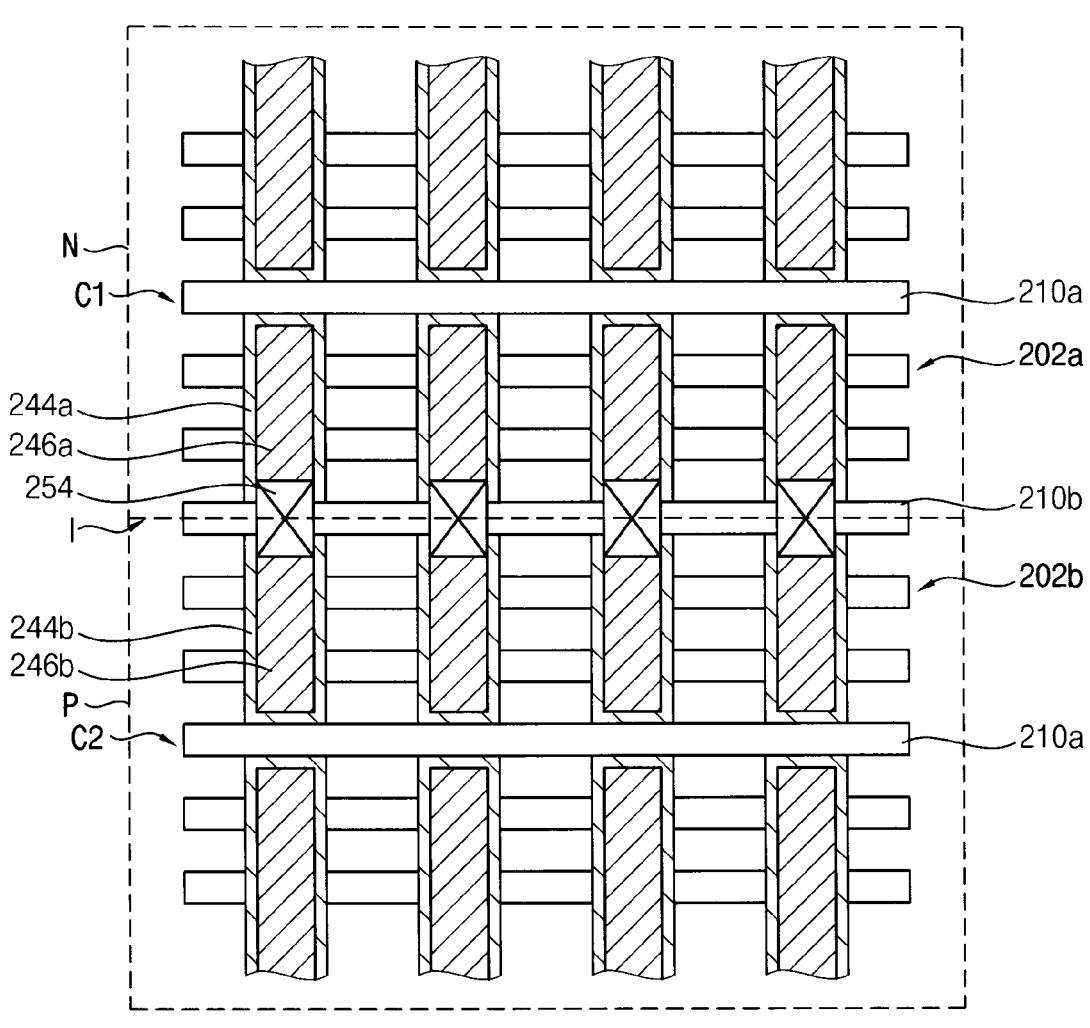
FIGS. 45 and 46 are a plan view and a cross-sectional view illustrating a semiconductor device in accordance with example embodiments.
Figure 45:
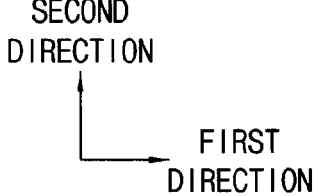
Figure 46:
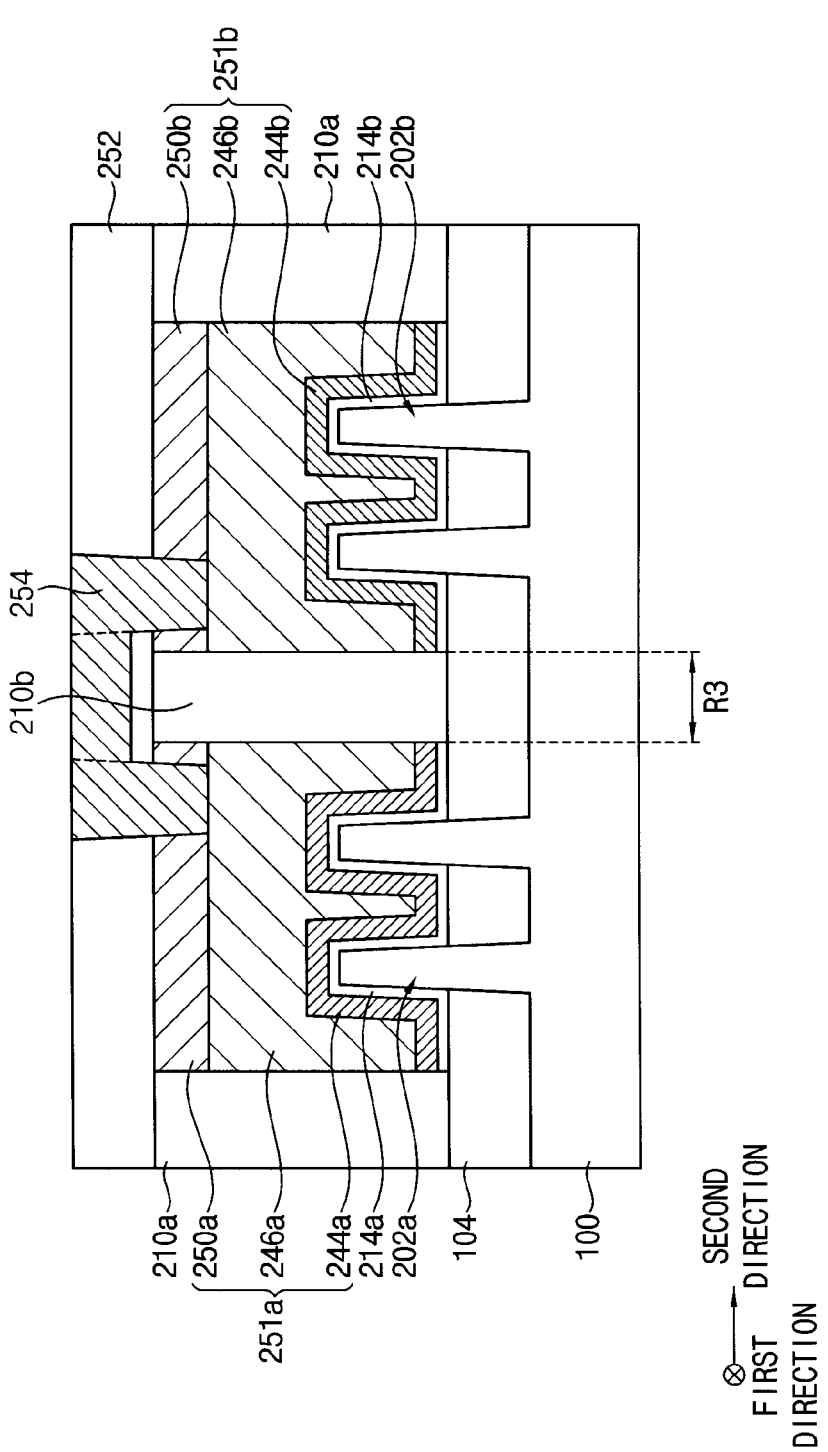

FIGS. 45 and 46 are a plan view and a cross-sectional view illustrating a semiconductor device in accordance with example embodiments.

The semiconductor device shown in FIGS. 45 and 46 may be substantially the same as that illustrated with reference to FIGS. 27 and 28, except for a gate structure and wirings. For example, the n-type region and the p-type region of the substrate and first active fins may be substantially the same as those illustrated with reference to FIGS. 27 and 28, respectively.

Referring to FIGS. 45 and 46, a first opening and a second opening may extend through the first insulating interlayer. The gate structure of the n-type transistor may be formed in the first opening. The gate structure of the p-type transistor may be formed in the second opening. A second insulation pattern 210*b* may be formed between the first and second openings in the second direction.

A first insulation pattern 210*a* may be formed on the first gate cutting region C1 and the second gate cutting region C2.

The first metal oxide layer 214*a* may be formed on the surface of the first n-active fins 202*a* and the isolation layer 104 between the first n-active fins 202*a* exposed by the first opening. The first metal oxide layer 214*a* may not be formed on the first insulation pattern 210*a* and the second insulation pattern 210*b* (e.g., on sidewalls of the first insulation pattern 210*a* and the second insulation pattern 210*b*).

The second metal oxide layer 214*b* may be formed on the surface of the first p-active fins 202*b* and the isolation layer 104 between the first p-active fins 202*b* exposed by the second opening. The second metal oxide layer 214*b* may not be formed on the first insulation pattern 210*a* and the second insulation pattern 210*b* (e.g., on sidewalls of the first insulation pattern 210*a* and the second insulation pattern 210*b*).

The first gate electrode structure 251*a* may be formed in the first opening to cover the first metal oxide layer 214*a*. The second gate electrode structure 251*b* may be formed in the second opening to cover the second metal oxide layer 214*b*.

The first gate electrode structure 251*a* may be formed in the n-type region, and the second gate electrode structure 25 lb may be formed in the p-type region. The first and second gate electrode structures 251*a* and 251*b* may be spaced apart from each other. Thus, the first and second gate electrode structures 251*a* and 251*b* may be physically separated from each other.

The upper insulating interlayer 252 may be formed on the first gate electrode structure 251*a*, the second gate electrode structure 251*b*, the first and second insulation patterns 210*a* and 210*b* and the first insulating interlayer.

An upper wiring 254 may be formed through the upper insulating interlayer 254, so that the upper portions of the first and second gate structures 251*a* and 251*b* are electrically connected to each other by the upper wiring 254.

FIGS. 47 to 50 are plan views and cross-sectional views illustrating a method of manufacturing a semiconductor device in accordance with example embodiments.

Figure 47:
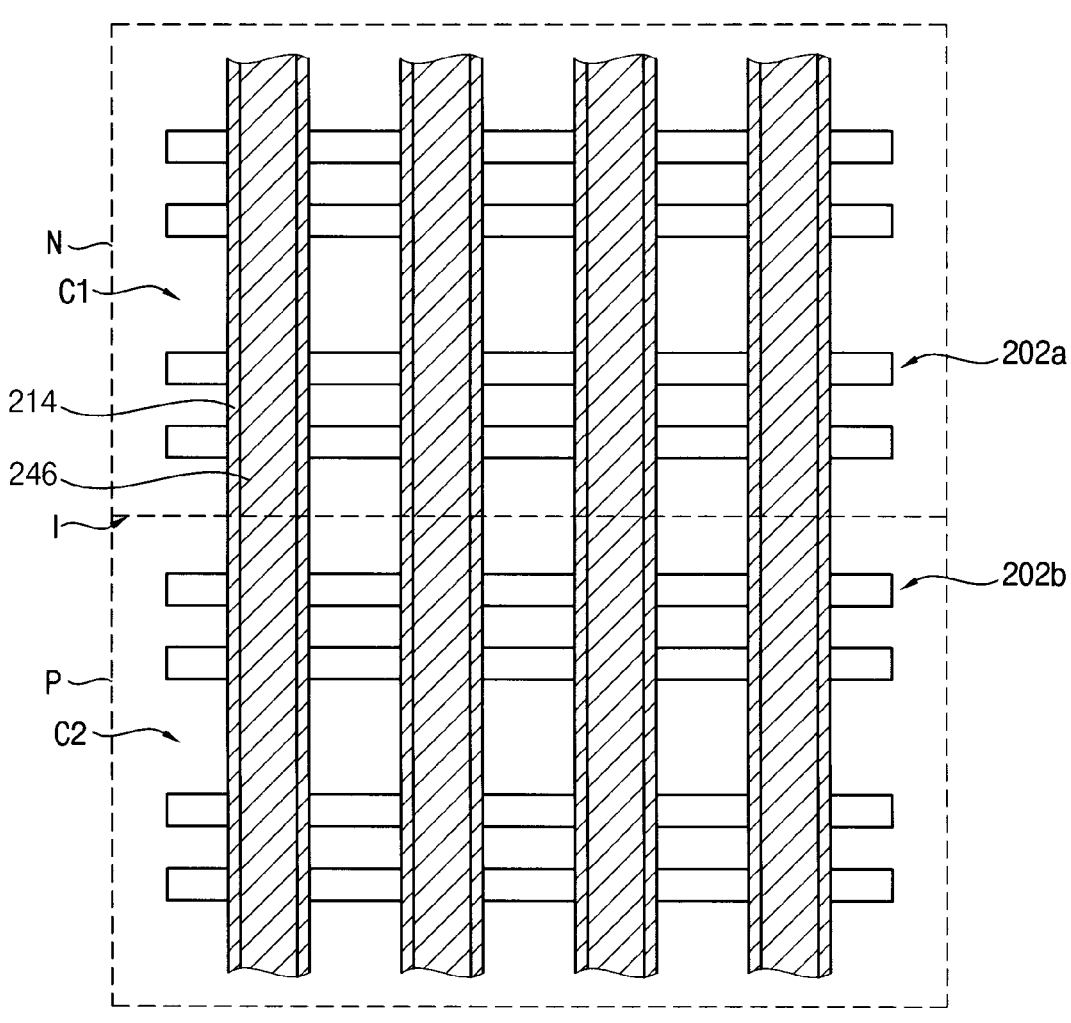
FIGS. 47 to 50 are plan views and cross-sectional views illustrating a method of manufacturing a semiconductor device in accordance with example embodiments.
Figure 47:
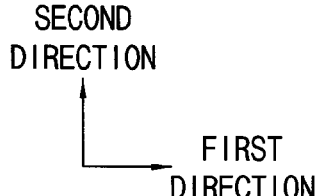
Figure 48:
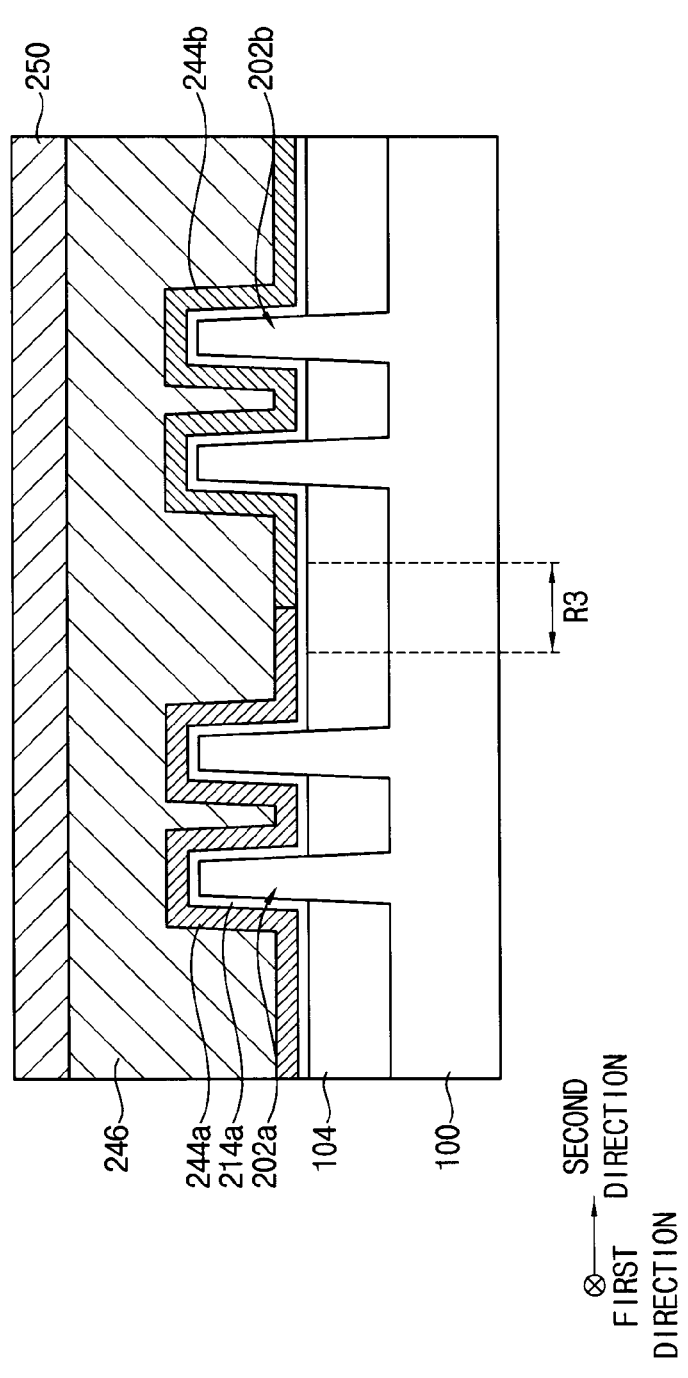

Referring to FIGS. 47 and 48, first, processes illustrated with reference to FIGS. 41 and 42 may be performed to form the metal oxide layer 214 having a high dielectric constant on the first insulating interlayer and the pad oxide layer. Then, etching of the metal oxide layer 214 may not be performed.

The metal layer for controlling a threshold voltage 244*a* and 244*b* may be formed on the metal oxide layer 214. The upper conductive pattern 246 may be formed in the first opening. The capping pattern 250 may be formed on the upper conductive pattern 246.

Figure 49:
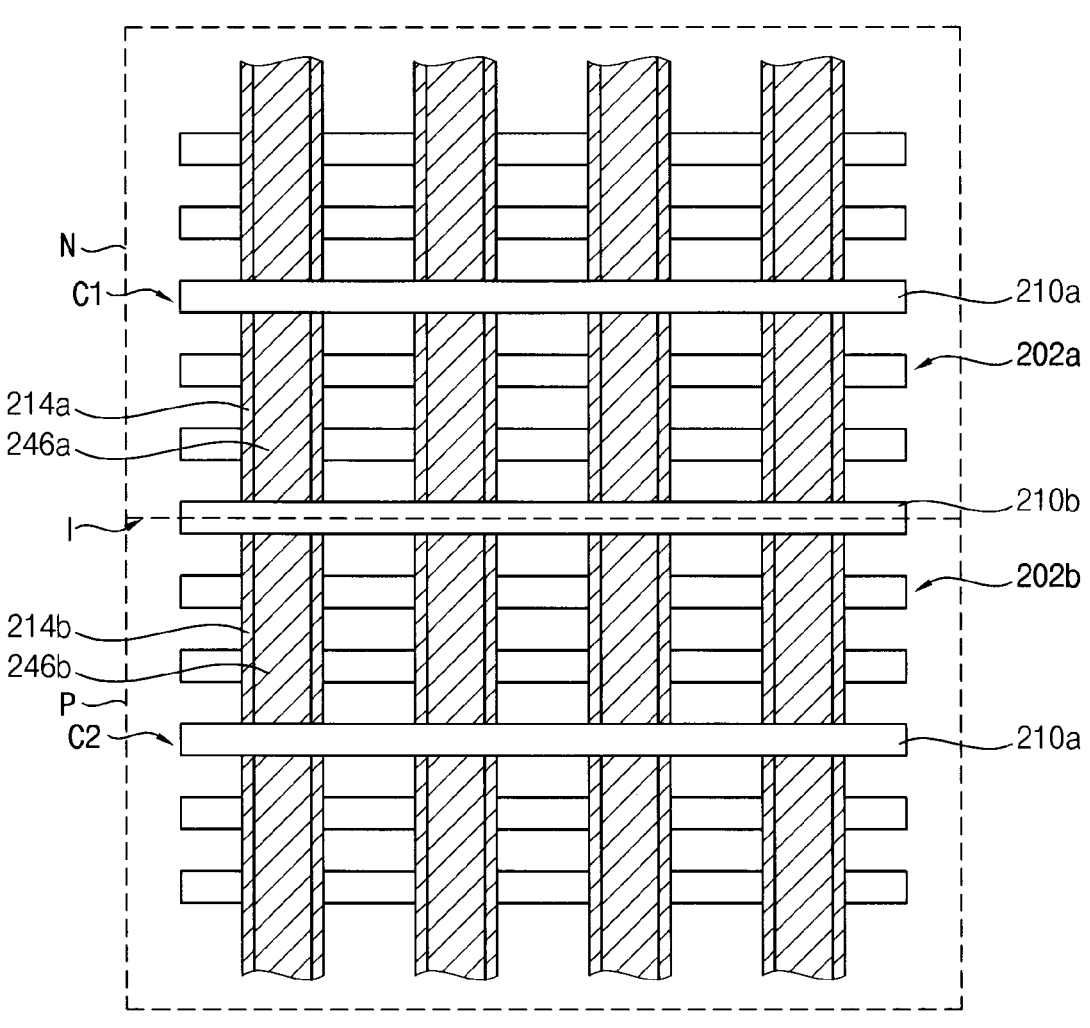
Figure 49:
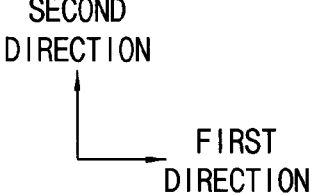
Figure 50:
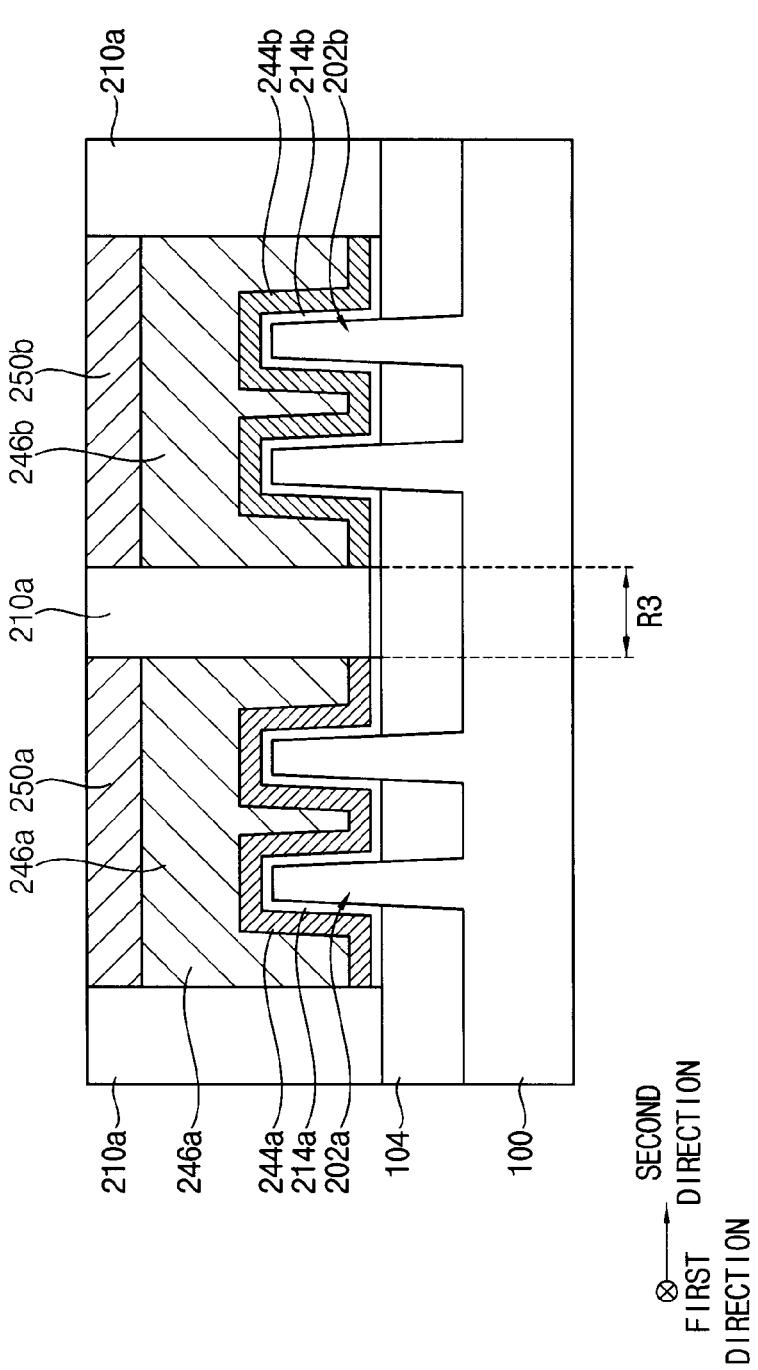

Referring to FIGS. 49 and 50, the capping pattern 250, the upper conductive pattern 246 and the metal layer for controlling a threshold voltage 244*a* and 244*b*, the metal oxide layer 214 and the first insulating interlayer positioned at the n-type gate cutting region C1, the p-type gate cutting region C2 and the boundary I may be etched to form the first gate electrode structure 251*a* in the n-type region and the second gate electrode structure 251*b* in the p-type region. Also, the first metal oxide layer 214*a* may be formed on the n-type region, and the second metal oxide layer 214*b* may be formed on the p-type region.

The insulation pattern may be formed to fill the trench formed by the etching process. For example, the first insulation pattern 210*a* may be formed in the trench at the n-type gate cutting region C1 and the p-type gate cutting region C2. The second insulation pattern 210*b* may be formed in the trench at the boundary I.

Referring to FIG. 50 again, the upper insulating interlayer 252 may be formed on the first gate electrode structure 251*a*, the second gate electrode structure 251*b*, the first and second insulation patterns 210*a* and 210*b* and the first insulating interlayer.

An upper wiring 254 may be formed through the upper insulating interlayer 252 so that the first and second gate structures 251*a* and 251*b* are electrically connected to each other by the upper wiring 254.

The foregoing is illustrative of example embodiments and is not to be construed as limiting thereof Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method for manufacturing a semiconductor device comprising:

etching a portion of a substrate to form a first active fin in a first region of the substrate and a second active fin in a second region of the substrate;

forming an insulating interlayer on the first active fin and the second active fin, the insulating interlayer including a first opening exposing the first active fin and a second opening exposing the second active fin, the second opening having a width greater than a width of the first opening;

forming a first silicon oxide layer on the second active fin exposed by a bottom of the second opening;

forming a metal oxide layer along sidewalls and a bottom of the first opening to be on the first active fin; and forming a first gate electrode on the metal oxide layer in the first opening and a second gate electrode on the first silicon oxide layer in the second opening, wherein the second active fin does not have the metal oxide layer thereon.

2. The method of claim 1, wherein forming the first silicon oxide layer on the second active fin exposed by the bottom of the second opening comprises:

forming the first silicon oxide layer on the first active fin and the second active fin exposed by bottoms of the first and second openings, respectively; and removing the first silicon oxide layer on the first active fin.

3. The method of claim 2, wherein removing the first silicon oxide layer on the first active fin is performed by a wet etching process.

4. The method of claim 2, further comprising, before removing the first silicon oxide layer on the first active fin:

forming a hard mask layer conformally on an upper surface of the insulating interlayer, sidewalls of the first and second openings, and an upper surface of the first silicon oxide layer;

forming a photoresist pattern covering the hard mask layer in the second region; and removing the hard mask layer using the photoresist pattern as an etch mask to form a hard mask pattern covering the second region, wherein the hard mask pattern is used in an etching mask in the removing the first silicon oxide layer on the first active fin.

5. The method of claim 4, wherein removing the hard mask layer is performed by a wet etching process.

6. The method of claim 1, wherein forming the metal oxide layer along the sidewalls and bottom of the first opening comprises:

forming a hard mask pattern conformally on an upper surface of the insulating interlayer, sidewalls of the second opening, and an upper surface of the first silicon oxide layer in the second region;

forming the metal oxide layer conformally on the upper surface of the insulating interlayer, the sidewalls of the first opening and the upper surface of the first silicon oxide layer in the first region, and the hard mask pattern in the second region;

removing the metal oxide layer in the second region; and removing the hard mask pattern in the second region.

7. The method of claim 6, wherein the metal oxide layer is removed by a dry etching process.

8. The method of claim 1, further comprising:

forming a first capping pattern on the first gate electrode in the first opening and a second capping pattern on the second gate electrode in the second opening.

9. The method of claim 1, wherein the first silicon oxide layer is formed to have a first thickness, and the metal oxide layer is formed to have a second thickness less than the first thickness.

10. The method of claim 1, wherein the metal oxide layer includes hafnium oxide (HfO2), tantalum oxide (Ta2O5), or zirconium oxide (ZrO2).

11. The method of claim 1, wherein the first silicon oxide layer is a thermal oxide formed by a wet treatment process.

12. The method of claim 1, wherein the insulating interlayer further includes a third opening exposing a third active fin, further comprising:

forming a second silicon oxide layer in the third opening, the second silicon oxide layer having a thickness different from a thickness of the first silicon oxide layer; and forming a third gate electrode on the second silicon oxide layer.

13. A method for manufacturing a semiconductor device comprising:

etching a portion of a substrate including silicon to form a first active fin in a first region of the substrate and a second active fin in a second region of the substrate;

forming an insulating interlayer on the first active fin and the second active fin, the insulating interlayer including a first opening exposing the first active fin and a second opening exposing the second active fin, the second opening having a width greater than a width of the first opening;

forming a first silicon oxide layer on each of the first active fin and the second active fin exposed by bottoms of the first and second openings;

forming a hard mask pattern conformally on an upper surface of the insulating interlayer, sidewalls of the second opening, and an upper surface of the first silicon oxide layer in the second region;

removing the first silicon oxide layer on the first active fin in the first opening by using the hard mask pattern as an etch mask;

forming a metal oxide layer conformally on the upper surface of the insulating interlayer, sidewalls and the bottom of the first opening in the first region, and the hard mask pattern in the second region;

sequentially removing the metal oxide layer and the hard mask pattern in the second region to form a metal oxide pattern on the upper surface of the insulating interlayer and the sidewalls and the bottom of the first opening in the first region; and forming a first gate electrode on the metal oxide pattern in the first opening and a second gate electrode on the first silicon oxide layer in the second opening.

14. The method of claim 13, wherein the first silicon oxide layer is a thermal oxide formed by an oxidation of the silicon of the first and second active fins.

15. The method of claim 13, wherein the first silicon oxide layer is formed to have a first thickness, and the metal oxide layer is formed to have a second thickness less than the first thickness.

16. The method of claim 13, wherein removing the first silicon oxide layer on the first active fin in the first opening is performed by a wet etching process.

17. The method of claim 13, wherein the hard mask pattern includes a material having an etching selectivity with respect to the first silicon oxide layer.

18. The method of claim 13, wherein the hard mask pattern is removed by a wet etching process.

19. The method of claim 13, wherein the insulating interlayer further includes a third opening exposing a third active fin, further comprising:

forming a second silicon oxide layer in the third opening, the second silicon oxide layer having a thickness different from a thickness of the first silicon oxide layer; and forming a third gate electrode on the second silicon oxide layer.

20. A method for manufacturing a semiconductor device comprising:

etching a portion of a substrate to form a first active fin in a first region of the substrate and a second active fin in a second region of the substrate;

forming an insulating interlayer on the first active fin and the second active fin, the insulating interlayer including a first opening exposing the first active fin, a second opening exposing the second active fin, and a third opening exposing a third active fin;

forming a first silicon oxide layer having a first thickness directly on the second active fin exposed by a bottom of the second opening;

forming a second silicon oxide layer having a second thickness greater than the first thickness directly on the third active fin exposed by a bottom of the third opening;

forming a metal oxide layer having a third thickness less than the first thickness on sidewalls and a bottom of the first opening to be directly on the first active fin; and forming a first gate electrode on the metal oxide layer in the first opening, a second gate electrode on the first silicon oxide layer in the second opening, and a third gate electrode in the third opening, wherein the second active fin does not have the metal oxide layer thereon.

\*   \*   \*   \*   \*